(12) United States Patent
Luby et al.

(10) Patent No.: US 9,136,878 B2
(45) Date of Patent: Sep. 15, 2015

(54) FILE DOWNLOAD AND STREAMING SYSTEM

(75) Inventors: Michael G. Luby, Berkeley, CA (US); M. Amin Shokrollahi, Preverenges (CH); Mark Watson, San Francisco, CA (US)

(73) Assignee: Digital Fountain, Inc., San Diego, CA (US)

( * ) Notice: Subject to any disclaimer, the term of this patent is extended or adjusted under 35 U.S.C. 154(b) by 984 days.

(21) Appl. No.: 12/197,993

(22) Filed: Aug. 25, 2008

(65) Prior Publication Data

US 2009/0031199 A1 Jan. 29, 2009

Related U.S. Application Data

(63) Continuation of application No. 11/125,818, filed on May 9, 2005, now Pat. No. 7,418,651.

(51) Int. Cl.
*G06F 11/00* (2006.01)
*H03M 13/00* (2006.01)
(Continued)

(52) U.S. Cl.
CPC .......... *H03M 13/29* (2013.01); *H03M 13/3761* (2013.01); *H04L 1/0041* (2013.01); *H04L 1/0045* (2013.01); *H04L 1/0057* (2013.01); *H04L 1/0065* (2013.01); *H03M 13/1102* (2013.01); *H03M 13/19* (2013.01)

(58) Field of Classification Search
CPC ........................... H03M 3/3761; H04L 1/0061

USPC .......... 714/746, 777, 84, 794–795, 784, 810, 714/794–799; 375/265, 296, 341
See application file for complete search history.

(56) References Cited

U.S. PATENT DOCUMENTS 3,909,721 A 9/1975 Bussgang et al.
4,365,338 A 12/1982 McRae et al.
(Continued)

FOREIGN PATENT DOCUMENTS

CN 1338839 A 3/2002
CN 1425228 A 6/2003
(Continued)

OTHER PUBLICATIONS

Supplementary European Search Report, EP05747947—European Search Authority—Munich, Mar. 19, 2007.
(Continued)

*Primary Examiner* — Shelly A Chase
(74) *Attorney, Agent, or Firm* — Ryan N. Farr

(57) ABSTRACT

A method of encoding data operates on an ordered set of input symbols and includes generating redundant symbols from the input symbols, and includes generating output symbols from a combined set of symbols including the input symbols and the redundant symbols, wherein the number of possible output symbols is much larger than the number of the combined set of symbols, wherein at least one output symbol is generated from more than one symbol in the combined set of symbols and from less than all of the symbols in the combined set of symbols. The redundant symbols are generated from an ordered set of input symbols in a deterministic process such that a first set of static symbols calculated using a first input symbol has a low common membership with a second set of static symbols calculated using a second input symbol distinct from the first input symbol.

74 Claims, 17 Drawing Sheets

(51) Int. Cl.
*H03M 13/29* (2006.01)
*H03M 13/37* (2006.01)
*H04L 1/00* (2006.01)
H03M 13/11 (2006.01)
H03M 13/19 (2006.01)

(56) References Cited

U.S. PATENT DOCUMENTS

| | | |
|---|---|---|
| 4,589,112 A | 5/1986 | Karim |
| 4,901,319 A | 2/1990 | Ross |
| 5,136,592 A | 8/1992 | Weng |
| 5,153,591 A | 10/1992 | Clark |
| 5,329,369 A | 7/1994 | Willis et al. |
| 5,331,320 A | 7/1994 | Cideciyan et al. |
| 5,371,532 A | 12/1994 | Gelman et al. |
| 5,372,532 A | 12/1994 | Robertson, Jr. |
| 5,379,297 A | 1/1995 | Glover et al. |
| 5,421,031 A | 5/1995 | De Bey |
| 5,425,050 A | 6/1995 | Schreiber et al. |
| 5,432,787 A | 7/1995 | Chethik |
| 5,455,823 A | 10/1995 | Noreen et al. |
| 5,465,318 A | 11/1995 | Sejnoha |
| 5,517,508 A | 5/1996 | Scott |
| 5,524,025 A | 6/1996 | Lawrence et al. |
| 5,566,208 A | 10/1996 | Balakrishnan |
| 5,568,614 A | 10/1996 | Mendelson et al. |
| 5,583,784 A | 12/1996 | Kapust et al. |
| 5,608,738 A | 3/1997 | Matsushita |
| 5,617,541 A | 4/1997 | Albanese et al. |
| 5,642,365 A | 6/1997 | Murakami et al. |
| 5,659,614 A | 8/1997 | Bailey, III |
| 5,699,473 A | 12/1997 | Kim |
| 5,701,582 A | 12/1997 | DeBey |
| 5,751,336 A | 5/1998 | Aggarwal et al. |
| 5,754,563 A | 5/1998 | White |
| 5,757,415 A | 5/1998 | Asamizuya et al. |
| 5,802,394 A | 9/1998 | Baird et al. |
| 5,805,825 A | 9/1998 | Danneels et al. |
| 5,835,165 A | 11/1998 | Keate et al. |
| 5,844,636 A | 12/1998 | Joseph et al. |
| 5,852,565 A | 12/1998 | Demos |
| 5,870,412 A | 2/1999 | Schuster et al. |
| 5,903,775 A | 5/1999 | Murray |
| 5,917,852 A | 6/1999 | Butterfield et al. |
| 5,926,205 A | 7/1999 | Krause et al. |
| 5,933,056 A | 8/1999 | Rothenberg |
| 5,936,935 A | 8/1999 | Viswanathan et al. |
| 5,936,949 A | 8/1999 | Pasternak et al. |
| 5,953,537 A | 9/1999 | Balicki et al. |
| 5,970,098 A | 10/1999 | Herzberg |
| 5,983,383 A | 11/1999 | Wolf |
| 5,993,056 A | 11/1999 | Vaman et al. |
| 6,005,477 A | 12/1999 | Deck et al. |
| 6,011,590 A | 1/2000 | Saukkonen |
| 6,012,159 A | 1/2000 | Fischer et al. |
| 6,014,706 A | 1/2000 | Cannon et al. |
| 6,018,359 A | 1/2000 | Kermode et al. |
| 6,041,001 A | 3/2000 | Estakhri |
| 6,044,485 A | 3/2000 | Dent et al. |
| 6,061,820 A | 5/2000 | Nakakita et al. |
| 6,073,250 A | 6/2000 | Luby et al. |
| 6,079,041 A | 6/2000 | Kunisa et al. |
| 6,079,042 A | 6/2000 | Vaman et al. |
| 6,081,907 A | 6/2000 | Witty et al. |
| 6,081,909 A | 6/2000 | Luby et al. |
| 6,081,918 A | 6/2000 | Spielman |
| 6,088,330 A | 7/2000 | Bruck et al. |
| 6,097,320 A | 8/2000 | Kuki et al. |
| 6,134,596 A | 10/2000 | Bolosky et al. |
| 6,141,053 A | 10/2000 | Saukkonen |
| 6,141,787 A | 10/2000 | Kunisa et al. |
| 6,141,788 A | 10/2000 | Rosenberg et al. |
| 6,154,452 A | 11/2000 | Marko et al. |
| 6,163,870 A | 12/2000 | Luby et al. |
| 6,166,544 A | 12/2000 | Debbins et al. |
| 6,175,944 B1 | 1/2001 | Urbanke et al. |
| 6,178,536 B1 | 1/2001 | Sorkin |
| 6,185,265 B1 | 2/2001 | Campanella |
| 6,195,777 B1 | 2/2001 | Luby et al. |
| 6,223,324 B1 | 4/2001 | Sinha et al. |
| 6,226,259 B1 | 5/2001 | Piret |
| 6,226,301 B1 | 5/2001 | Cheng et al. |
| 6,229,824 B1 | 5/2001 | Marko |
| 6,243,846 B1 | 6/2001 | Schuster et al. |
| 6,272,658 B1 | 8/2001 | Steele et al. |
| 6,278,716 B1 | 8/2001 | Rubenstein et al. |
| 6,298,462 B1 | 10/2001 | Yi |
| 6,307,487 B1 | 10/2001 | Luby |
| 6,314,289 B1 | 11/2001 | Eberlein et al. |
| 6,320,520 B1 | 11/2001 | Luby |
| 6,332,163 B1 | 12/2001 | Bowman-Amuah |
| 6,333,926 B1 | 12/2001 | Van Heeswyk et al. |
| 6,373,406 B2 | 4/2002 | Luby |
| 6,393,065 B1 | 5/2002 | Piret et al. |
| 6,411,223 B1 | 6/2002 | Haken et al. |
| 6,415,326 B1 | 7/2002 | Gupta et al. |
| 6,420,982 B1 | 7/2002 | Brown |
| 6,421,387 B1 | 7/2002 | Rhee |
| 6,430,233 B1 | 8/2002 | Dillon et al. |
| 6,445,717 B1 | 9/2002 | Gibson et al. |
| 6,459,811 B1 | 10/2002 | Hurst, Jr. |
| 6,466,698 B1 | 10/2002 | Creusere |
| 6,473,010 B1 | 10/2002 | Vityaev et al. |
| 6,486,803 B1 | 11/2002 | Luby et al. |
| 6,487,692 B1 | 11/2002 | Morelos-Zaragoza |
| 6,496,980 B1 | 12/2002 | Tillman et al. |
| 6,497,479 B1 | 12/2002 | Stoffel et al. |
| 6,510,177 B1 | 1/2003 | De et al. |
| 6,523,147 B1 | 2/2003 | Kroeger et al. |
| 6,535,920 B1 | 3/2003 | Parry et al. |
| 6,577,599 B1 | 6/2003 | Gupta et al. |
| 6,584,543 B2 | 6/2003 | Williams et al. |
| 6,609,223 B1 | 8/2003 | Wolfgang |
| 6,614,366 B2 | 9/2003 | Luby |
| 6,618,451 B1 | 9/2003 | Gonikberg |
| 6,631,172 B1 | 10/2003 | Shokrollahi et al. |
| 6,633,856 B2 | 10/2003 | Richardson et al. |
| 6,641,366 B2 | 11/2003 | Nordhoff |
| 6,643,332 B1 | 11/2003 | Morelos-Zaragoza et al. |
| 6,677,864 B2 | 1/2004 | Khayrallah |
| 6,678,855 B1 | 1/2004 | Gemmell |
| 6,694,476 B1 | 2/2004 | Sridharan et al. |
| 6,704,370 B1 | 3/2004 | Chheda et al. |
| 6,732,325 B1 | 5/2004 | Tash et al. |
| 6,742,154 B1 | 5/2004 | Barnard |
| 6,748,441 B1 | 6/2004 | Gemmell |
| 6,751,772 B1 | 6/2004 | Kim et al. |
| 6,765,866 B1 | 7/2004 | Wyatt |
| 6,804,202 B1 | 10/2004 | Hwang |
| 6,810,499 B2 | 10/2004 | Sridharan et al. |
| 6,820,221 B2 | 11/2004 | Fleming |
| 6,831,172 B1 | 12/2004 | Barbucci et al. |
| 6,849,803 B1 | 2/2005 | Gretz |
| 6,850,736 B2 | 2/2005 | McCune, Jr. |
| 6,856,263 B2 | 2/2005 | Shokrollahi et al. |
| 6,868,083 B2 | 3/2005 | Apostolopoulos et al. |
| 6,876,623 B1 | 4/2005 | Lou et al. |
| 6,882,618 B1 | 4/2005 | Sakoda et al. |
| 6,895,547 B2 | 5/2005 | Eleftheriou et al. |
| 6,909,383 B2 | 6/2005 | Shokrollahi et al. |
| 6,928,603 B1 | 8/2005 | Castagna et al. |
| 6,937,618 B1 | 8/2005 | Noda et al. |
| 6,956,875 B2 | 10/2005 | Kapadia et al. |
| 6,965,636 B1 | 11/2005 | DesJardins et al. |
| 6,985,459 B2 | 1/2006 | Dickson |
| 6,995,692 B2 | 2/2006 | Yokota et al. |
| 7,010,052 B2 | 3/2006 | Dill et al. |
| 7,030,785 B2 | 4/2006 | Shokrollahi et al. |
| 7,031,257 B1 | 4/2006 | Lu et al. |
| 7,057,534 B2 | 6/2006 | Luby |
| 7,068,681 B2 | 6/2006 | Chang et al. |
| 7,068,729 B2 * | 6/2006 | Shokrollahi et al. .......... 375/296 |

(56) References Cited

U.S. PATENT DOCUMENTS

| | | | |
|---|---|---|---|
| 7,073,191 B2 | 7/2006 | Srikantan et al. | |
| 7,100,188 B2 | 8/2006 | Hejna et al. | |
| 7,110,412 B2 | 9/2006 | Costa et al. | |
| 7,139,960 B2 | 11/2006 | Shokrollahi | |
| 7,143,433 B1 | 11/2006 | Duan et al. | |
| 7,151,754 B1 | 12/2006 | Boyce et al. | |
| 7,154,951 B2 | 12/2006 | Wang | |
| 7,164,370 B1 | 1/2007 | Mishra | |
| 7,164,882 B2 | 1/2007 | Poltorak | |
| 7,168,030 B2* | 1/2007 | Ariyoshi | 714/786 |
| 7,219,289 B2 | 5/2007 | Dickson | |
| 7,231,404 B2 | 6/2007 | Paila et al. | |
| 7,233,264 B2 | 6/2007 | Luby | |
| 7,240,236 B2 | 7/2007 | Cutts et al. | |
| 7,240,358 B2 | 7/2007 | Horn et al. | |
| 7,243,285 B2 | 7/2007 | Foisy et al. | |
| 7,254,754 B2 | 8/2007 | Hetzler et al. | |
| 7,257,764 B2 | 8/2007 | Suzuki et al. | |
| 7,265,688 B2 | 9/2007 | Shokrollahi et al. | |
| 7,293,222 B2 | 11/2007 | Shokrollahi et al. | |
| 7,295,573 B2 | 11/2007 | Yi et al. | |
| 7,304,990 B2 | 12/2007 | Rajwan | |
| 7,318,180 B2 | 1/2008 | Starr | |
| 7,320,099 B2 | 1/2008 | Miura et al. | |
| 7,363,048 B2 | 4/2008 | Cheng et al. | |
| 7,391,717 B2 | 6/2008 | Klemets et al. | |
| 7,394,407 B2 | 7/2008 | Shokrollahi et al. | |
| 7,398,454 B2 | 7/2008 | Cai et al. | |
| 7,409,626 B1 | 8/2008 | Schelstraete | |
| 7,412,641 B2 | 8/2008 | Shokrollahi | |
| 7,418,651 B2 | 8/2008 | Luby et al. | |
| 7,451,377 B2 | 11/2008 | Shokrollahi | |
| 7,483,447 B2 | 1/2009 | Chang et al. | |
| 7,483,489 B2 | 1/2009 | Gentric et al. | |
| 7,512,697 B2 | 3/2009 | Lassen et al. | |
| 7,525,994 B2 | 4/2009 | Scholte | |
| 7,529,806 B1 | 5/2009 | Shteyn | |
| 7,532,132 B2 | 5/2009 | Shokrollahi et al. | |
| 7,555,006 B2 | 6/2009 | Wolfe et al. | |
| 7,559,004 B1 | 7/2009 | Chang et al. | |
| 7,570,665 B2 | 8/2009 | Ertel et al. | |
| 7,574,706 B2 | 8/2009 | Meulemans et al. | |
| 7,590,118 B2 | 9/2009 | Giesberts et al. | |
| 7,597,423 B2 | 10/2009 | Silverbrook | |
| 7,613,183 B1 | 11/2009 | Brewer et al. | |
| 7,633,413 B2 | 12/2009 | Shokrollahi et al. | |
| 7,633,970 B2 | 12/2009 | Van Kampen et al. | |
| 7,644,335 B2 | 1/2010 | Luby et al. | |
| 7,650,036 B2 | 1/2010 | Lei et al. | |
| 7,668,198 B2 | 2/2010 | Yi et al. | |
| 7,720,096 B2 | 5/2010 | Klemets | |
| 7,720,174 B2 | 5/2010 | Shokrollahi et al. | |
| 7,721,184 B2 | 5/2010 | Luby et al. | |
| 7,812,743 B2 | 10/2010 | Luby | |
| 7,831,896 B2 | 11/2010 | Amram et al. | |
| 7,924,913 B2 | 4/2011 | Sullivan et al. | |
| 7,956,772 B2 | 6/2011 | Shokrollahi et al. | |
| 7,961,700 B2 | 6/2011 | Malladi et al. | |
| 7,979,769 B2 | 7/2011 | Lee et al. | |
| 8,027,328 B2 | 9/2011 | Yang et al. | |
| 8,028,322 B2 | 9/2011 | Riedl et al. | |
| 8,081,716 B2 | 12/2011 | Kang et al. | |
| 8,135,073 B2 | 3/2012 | Shen | |
| 8,185,794 B2 | 5/2012 | Lohmar et al. | |
| 8,185,809 B2 | 5/2012 | Luby et al. | |
| RE43,741 E | 10/2012 | Shokrollahi et al. | |
| 8,301,725 B2 | 10/2012 | Biderman et al. | |
| 8,327,403 B1 | 12/2012 | Chilvers et al. | |
| 8,340,133 B2 | 12/2012 | Kim et al. | |
| 8,422,474 B2 | 4/2013 | Park et al. | |
| 8,462,643 B2 | 6/2013 | Walton et al. | |
| 8,544,043 B2 | 9/2013 | Parekh et al. | |
| 8,572,646 B2 | 10/2013 | Haberman et al. | |
| 8,615,023 B2 | 12/2013 | Oh et al. | |
| 8,638,796 B2 | 1/2014 | Dan et al. | |
| 8,713,624 B1 | 4/2014 | Harvey et al. | |
| 8,737,421 B2 | 5/2014 | Zhang et al. | |
| 8,812,735 B2 | 8/2014 | Igarashi | |
| 2001/0015944 A1 | 8/2001 | Takahashi et al. | |
| 2001/0033586 A1 | 10/2001 | Takashimizu et al. | |
| 2002/0009137 A1 | 1/2002 | Nelson et al. | |
| 2002/0053062 A1 | 5/2002 | Szymanski | |
| 2002/0083345 A1 | 6/2002 | Halliday et al. | |
| 2002/0085013 A1 | 7/2002 | Lippincott | |
| 2002/0087685 A1 | 7/2002 | Lassen et al. | |
| 2002/0133247 A1 | 9/2002 | Smith et al. | |
| 2002/0141433 A1 | 10/2002 | Kwon et al. | |
| 2002/0143953 A1 | 10/2002 | Aiken | |
| 2002/0191116 A1 | 12/2002 | Kessler et al. | |
| 2003/0005386 A1 | 1/2003 | Bhatt et al. | |
| 2003/0037299 A1 | 2/2003 | Smith | |
| 2003/0086515 A1 | 5/2003 | Trans et al. | |
| 2003/0101408 A1 | 5/2003 | Martinian et al. | |
| 2003/0106014 A1 | 6/2003 | Dohmen et al. | |
| 2003/0138043 A1 | 7/2003 | Hannuksela | |
| 2003/0194211 A1 | 10/2003 | Abecassis | |
| 2003/0207696 A1 | 11/2003 | Willenegger et al. | |
| 2003/0224773 A1 | 12/2003 | Deeds | |
| 2003/0226089 A1 | 12/2003 | Rasmussen et al. | |
| 2004/0015768 A1 | 1/2004 | Bordes et al. | |
| 2004/0031054 A1 | 2/2004 | Dankworth et al. | |
| 2004/0049793 A1 | 3/2004 | Chou | |
| 2004/0066854 A1 | 4/2004 | Hannuksela | |
| 2004/0081106 A1 | 4/2004 | Bruhn | |
| 2004/0096110 A1 | 5/2004 | Yogeshwar et al. | |
| 2004/0117716 A1 | 6/2004 | Shen | |
| 2004/0151109 A1 | 8/2004 | Batra et al. | |
| 2004/0162071 A1 | 8/2004 | Grilli et al. | |
| 2004/0207548 A1 | 10/2004 | Kilbank | |
| 2004/0231004 A1 | 11/2004 | Seo | |
| 2004/0240382 A1 | 12/2004 | Ido et al. | |
| 2004/0255328 A1 | 12/2004 | Baldwin et al. | |
| 2005/0018635 A1 | 1/2005 | Proctor, Jr. | |
| 2005/0028067 A1 | 2/2005 | Weirauch | |
| 2005/0041736 A1 | 2/2005 | Butler-Smith et al. | |
| 2005/0071491 A1 | 3/2005 | Seo | |
| 2005/0084006 A1 | 4/2005 | Lei et al. | |
| 2005/0091697 A1 | 4/2005 | Tanaka et al. | |
| 2005/0097213 A1 | 5/2005 | Barrett et al. | |
| 2005/0102371 A1 | 5/2005 | Aksu | |
| 2005/0105371 A1 | 5/2005 | Johnson et al. | |
| 2005/0123058 A1 | 6/2005 | Greenbaum et al. | |
| 2005/0138286 A1 | 6/2005 | Franklin et al. | |
| 2005/0160272 A1 | 7/2005 | Teppler | |
| 2005/0163468 A1 | 7/2005 | Takahashi et al. | |
| 2005/0169379 A1 | 8/2005 | Shin et al. | |
| 2005/0180415 A1 | 8/2005 | Cheung et al. | |
| 2005/0193309 A1 | 9/2005 | Grilli et al. | |
| 2005/0195752 A1 | 9/2005 | Amin et al. | |
| 2005/0195899 A1 | 9/2005 | Han | |
| 2005/0195900 A1 | 9/2005 | Han | |
| 2005/0207392 A1 | 9/2005 | Sivalingham et al. | |
| 2005/0216472 A1 | 9/2005 | Leon et al. | |
| 2005/0216951 A1 | 9/2005 | MacInnis | |
| 2005/0254575 A1 | 11/2005 | Hannuksela et al. | |
| 2006/0015568 A1 | 1/2006 | Walsh et al. | |
| 2006/0020796 A1 | 1/2006 | Aura et al. | |
| 2006/0031738 A1 | 2/2006 | Fay et al. | |
| 2006/0037057 A1 | 2/2006 | Xu | |
| 2006/0093634 A1 | 5/2006 | Lutz et al. | |
| 2006/0107174 A1 | 5/2006 | Heise | |
| 2006/0109805 A1 | 5/2006 | Malamal Vadakital et al. | |
| 2006/0120464 A1 | 6/2006 | Hannuksela | |
| 2006/0193524 A1 | 8/2006 | Tarumoto et al. | |
| 2006/0212444 A1 | 9/2006 | Handman et al. | |
| 2006/0212782 A1 | 9/2006 | Li | |
| 2006/0229075 A1 | 10/2006 | Kim et al. | |
| 2006/0244824 A1 | 11/2006 | Debey | |
| 2006/0244865 A1 | 11/2006 | Simon | |
| 2006/0248195 A1 | 11/2006 | Toumura et al. | |
| 2006/0256851 A1 | 11/2006 | Wang et al. | |
| 2006/0262856 A1 | 11/2006 | Wu et al. | |

(56) References Cited

U.S. PATENT DOCUMENTS

| | | |
|---|---|---|
| 2006/0279437 A1 | 12/2006 | Luby et al. |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0081586 A1 | 4/2007 | Raveendran et al. |
| 2007/0110074 A1 | 5/2007 | Bradley et al. |
| 2007/0127576 A1 | 6/2007 | Henocq et al. |
| 2007/0134005 A1 | 6/2007 | Myong et al. |
| 2007/0140369 A1 | 6/2007 | Limberg |
| 2007/0157267 A1 | 7/2007 | Lopez-Estrada |
| 2007/0162568 A1 | 7/2007 | Gupta et al. |
| 2007/0162611 A1 | 7/2007 | Yu et al. |
| 2007/0176800 A1 | 8/2007 | Rijavec |
| 2007/0177811 A1 | 8/2007 | Yang et al. |
| 2007/0185973 A1 | 8/2007 | Wayda et al. |
| 2007/0195894 A1 | 8/2007 | Shokrollahi et al. |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | Orourke et al. |
| 2007/0255844 A1 | 11/2007 | Shen et al. |
| 2007/0277209 A1 | 11/2007 | Yousef |
| 2007/0300127 A1 | 12/2007 | Watson et al. |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0152241 A1 | 6/2008 | Itoi et al. |
| 2008/0168133 A1 | 7/2008 | Osborne |
| 2008/0168516 A1 | 7/2008 | Flick et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0303896 A1 | 12/2008 | Lipton et al. |
| 2008/0309525 A1 | 12/2008 | Shokrollahi et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0043906 A1 | 2/2009 | Hurst et al. |
| 2009/0055705 A1 | 2/2009 | Gao |
| 2009/0067551 A1 | 3/2009 | Chen et al. |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0195640 A1 | 8/2009 | Kim et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1 | 1/2010 | Stockhammer et al. |
| 2010/0020871 A1 | 1/2010 | Hannuksela et al. |
| 2010/0023525 A1 | 1/2010 | Westerlund et al. |
| 2010/0046906 A1 | 2/2010 | Kanamori et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0131671 A1 | 5/2010 | Kohli et al. |
| 2010/0153578 A1 | 6/2010 | Van et al. |
| 2010/0165077 A1 | 7/2010 | Yin et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0223533 A1 | 9/2010 | Stockhammer et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0019769 A1 | 1/2011 | Shokrollahi et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0103519 A1 | 5/2011 | Shokrollahi et al. |
| 2011/0119394 A1 | 5/2011 | Wang et al. |
| 2011/0119396 A1 | 5/2011 | Kwon et al. |
| 2011/0216541 A1 | 9/2011 | Inoue et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0258510 A1 | 10/2011 | Watson et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0299629 A1 | 12/2011 | Luby et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0042090 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |
| 2013/0254634 A1 | 9/2013 | Luby et al. |

(56) References Cited

U.S. PATENT DOCUMENTS

| | | | |
|---|---|---|---|
| 2013/0287023 A1 | 10/2013 | Bims | |
| 2014/0009578 A1 | 1/2014 | Chen et al. | |
| 2014/0380113 A1 | 12/2014 | Luby et al. | |

FOREIGN PATENT DOCUMENTS

| | | | |
|---|---|---|---|
| CN | 1481643 A | 3/2004 | |
| CN | 1708934 A | 12/2005 | |
| CN | 1714577 A | 12/2005 | |
| CN | 1792056 A | 6/2006 | |
| CN | 1806392 A | 7/2006 | |
| CN | 1819661 A | 8/2006 | |
| CN | 101390399 A | 3/2009 | |
| CN | 101729857 A | 6/2010 | |
| EP | 0669587 A2 | 8/1995 | |
| EP | 0701371 A1 | 3/1996 | |
| EP | 0784401 A2 | 7/1997 | |
| EP | 0853433 A1 | 7/1998 | |
| EP | 0854650 | 7/1998 | |
| EP | 0903955 A1 | 3/1999 | |
| EP | 0986908 A1 | 3/2000 | |
| EP | 1024672 A1 | 8/2000 | |
| EP | 1051027 A1 | 11/2000 | |
| EP | 1124344 A1 | 8/2001 | |
| EP | 1241795 A2 | 9/2002 | |
| EP | 1298931 A2 | 4/2003 | |
| EP | 1406452 A2 | 4/2004 | |
| EP | 1455504 A2 | 9/2004 | |
| EP | 1468497 A1 | 10/2004 | |
| EP | 1501318 A1 | 1/2005 | |
| EP | 1670256 A2 | 6/2006 | |
| EP | 1755248 A1 | 2/2007 | |
| EP | 2046044 A1 | 4/2009 | |
| EP | 2071827 A2 | 6/2009 | |
| EP | 2096870 A2 | 9/2009 | |
| EP | 1700410 B1 | 4/2010 | |
| EP | 2323390 A2 | 5/2011 | |
| JP | H07183873 | 7/1995 | |
| JP | 08186570 | 7/1996 | |
| JP | 8289255 A | 11/1996 | |
| JP | 9252253 A | 9/1997 | |
| JP | 11041211 A | 2/1999 | |
| JP | 11112479 | 4/1999 | |
| JP | 11164270 A | 6/1999 | |
| JP | 2000151426 A | 5/2000 | |
| JP | 2000216835 A | 8/2000 | |
| JP | 2000513164 A | 10/2000 | |
| JP | 2000307435 A | 11/2000 | |
| JP | 2000353969 A | 12/2000 | |
| JP | 2001036417 | 2/2001 | |
| JP | 2001094625 | 4/2001 | |
| JP | 2001189665 A | 7/2001 | |
| JP | 2001223655 A | 8/2001 | |
| JP | 2001251287 A | 9/2001 | |
| JP | 2001274776 A | 10/2001 | |
| JP | 2001274855 A | 10/2001 | |
| JP | 2002073625 A | 3/2002 | |
| JP | 2002204219 A | 7/2002 | |
| JP | 2002543705 A | 12/2002 | |
| JP | 2003018568 A | 1/2003 | |
| JP | 2003507985 | 2/2003 | |
| JP | 2003092564 A | 3/2003 | |
| JP | 2003510734 A | 3/2003 | |
| JP | 2003174489 | 6/2003 | |
| JP | 2003256321 A | 9/2003 | |
| JP | 2003318975 A | 11/2003 | |
| JP | 2003319012 | 11/2003 | |
| JP | 2003333577 A | 11/2003 | |
| JP | 2004048704 A | 2/2004 | |
| JP | 2004070712 A | 3/2004 | |
| JP | 2004135013 A | 4/2004 | |
| JP | 2004165922 A | 6/2004 | |
| JP | 2004516717 A | 6/2004 | |
| JP | 2004192140 A | 7/2004 | |
| JP | 2004193992 A | 7/2004 | |
| JP | 2004529533 A | 9/2004 | |
| JP | 2004289621 A | 10/2004 | |
| JP | 2004343701 A | 12/2004 | |
| JP | 2004348824 A | 12/2004 | |
| JP | 2004362099 A | 12/2004 | |
| JP | 2005094140 A | 4/2005 | |
| JP | 2005136546 A | 5/2005 | |
| JP | 2005514828 T | 5/2005 | |
| JP | 2005204170 A | 7/2005 | |
| JP | 2005223433 A | 8/2005 | |
| JP | 2005277950 | 10/2005 | |
| JP | 2006503463 | 1/2006 | |
| JP | 2006505177 A | 2/2006 | |
| JP | 2006506926 A | 2/2006 | |
| JP | 2006074335 A | 3/2006 | |
| JP | 2006074421 A | 3/2006 | |
| JP | 2006115104 A | 4/2006 | |
| JP | 3809957 | 6/2006 | |
| JP | 2006174032 A | 6/2006 | |
| JP | 2006174045 | 6/2006 | |
| JP | 2006186419 A | 7/2006 | |
| JP | 2006519517 A | 8/2006 | |
| JP | 2006287422 | 10/2006 | |
| JP | 2006319743 A | 11/2006 | |
| JP | 2007013675 A | 1/2007 | |
| JP | 2007089137 A | 4/2007 | |
| JP | 3976163 | 6/2007 | |
| JP | 2007158592 | 6/2007 | |
| JP | 2007174170 A | 7/2007 | |
| JP | 2007520961 A | 7/2007 | |
| JP | 2007228205 | 9/2007 | |
| JP | 2008011404 A | 1/2008 | |
| JP | 2008016907 A | 1/2008 | |
| JP | 2008502212 A | 1/2008 | |
| JP | 2008508761 A | 3/2008 | |
| JP | 2008508762 A | 3/2008 | |
| JP | 2008283232 | 11/2008 | |
| JP | 2008283571 A | 11/2008 | |
| JP | 2008543142 A | 11/2008 | |
| JP | 2008546361 A | 12/2008 | |
| JP | 2009027598 | 2/2009 | |
| JP | 2009522921 A | 6/2009 | |
| JP | 2009522922 | 6/2009 | |
| JP | 2009171558 | 7/2009 | |
| JP | 2009527949 | 7/2009 | |
| JP | 2009277182 A | 11/2009 | |
| JP | 2009544991 A | 12/2009 | |
| JP | 2010539832 A | 12/2010 | |
| JP | 2011087103 A | 4/2011 | |
| JP | 5231218 | 3/2013 | |
| KR | 1020030071815 | 9/2003 | |
| KR | 1020030074386 A | 9/2003 | |
| KR | 20040107152 A | 12/2004 | |
| KR | 20040107401 A | 12/2004 | |
| KR | 20050009376 A | 1/2005 | |
| KR | 100809086 B1 | 3/2008 | |
| KR | 20080083299 A | 9/2008 | |
| KR | 20090098919 A | 9/2009 | |
| KR | 20100028156 A | 3/2010 | |
| RU | 99117925 A | 7/2001 | |
| RU | 2189629 C2 | 8/2002 | |
| RU | 2265960 C2 | 12/2005 | |
| RU | 2290768 C1 | 12/2006 | |
| RU | 2297663 C2 | 4/2007 | |
| RU | 2312390 C2 | 12/2007 | |
| RU | 2357279 C2 | 5/2009 | |
| TW | 1246841 B | 1/2006 | |
| TW | 1354908 | 12/2011 | |
| TW | 1355168 | 12/2011 | |
| WO | 9634463 | 10/1996 | |
| WO | WO-9750183 A1 | 12/1997 | |
| WO | WO9804973 A1 | 2/1998 | |
| WO | 9832231 | 7/1998 | |
| WO | WO-9832256 A1 | 7/1998 | |
| WO | 0018017 | 3/2000 | |
| WO | WO0014921 A1 | 3/2000 | |
| WO | WO0052600 A1 | 9/2000 | |
| WO | WO0120786 A1 | 3/2001 | |

(56) References Cited

FOREIGN PATENT DOCUMENTS

| | | |
|---|---|---|
| WO | WO0157667 A1 | 8/2001 |
| WO | WO0158130 A2 | 8/2001 |
| WO | WO0158131 A2 | 8/2001 |
| WO | WO0227988 A2 | 4/2002 |
| WO | WO0247391 A1 | 6/2002 |
| WO | 02063461 A1 | 8/2002 |
| WO | WO-03046742 A1 | 6/2003 |
| WO | WO03056703 | 7/2003 |
| WO | WO03105350 | 12/2003 |
| WO | WO-03105484 A1 | 12/2003 |
| WO | WO2004008735 A2 | 1/2004 |
| WO | WO2004015948 A1 | 2/2004 |
| WO | WO2004019521 A1 | 3/2004 |
| WO | WO2004030273 A1 | 4/2004 |
| WO | WO2004034589 A2 | 4/2004 |
| WO | WO-2004036824 A1 | 4/2004 |
| WO | WO2004040831 A1 | 5/2004 |
| WO | WO-2004047019 A2 | 6/2004 |
| WO | WO2004047455 A1 | 6/2004 |
| WO | WO-2004088988 A1 | 10/2004 |
| WO | WO-2004109538 A1 | 12/2004 |
| WO | WO2005036753 A2 | 4/2005 |
| WO | WO2005041421 A1 | 5/2005 |
| WO | WO2005078982 A1 | 8/2005 |
| WO | WO-2005107123 | 11/2005 |
| WO | WO-2006013459 A1 | 2/2006 |
| WO | WO2006020826 A2 | 2/2006 |
| WO | WO-2006036276 | 4/2006 |
| WO | 2006060036 A1 | 6/2006 |
| WO | WO-2006057938 A2 | 6/2006 |
| WO | WO2006084503 A1 | 8/2006 |
| WO | WO-2006116102 A2 | 11/2006 |
| WO | WO-2006135878 A2 | 12/2006 |
| WO | WO2007042916 | 4/2007 |
| WO | 2007078253 A2 | 7/2007 |
| WO | WO2007090834 A2 | 8/2007 |
| WO | WO-2007098397 A2 | 8/2007 |
| WO | WO-2007098480 A1 | 8/2007 |
| WO | 2008011549 A2 | 1/2008 |
| WO | WO-2008023328 A3 | 4/2008 |
| WO | WO2008054100 A1 | 5/2008 |
| WO | 2008086313 A1 | 7/2008 |
| WO | WO2008085013 A1 | 7/2008 |
| WO | WO-2008131023 A1 | 10/2008 |
| WO | 2008144004 A1 | 11/2008 |
| WO | WO2008148708 A1 | 12/2008 |
| WO | WO2008156390 A1 | 12/2008 |
| WO | WO-2009065526 A1 | 5/2009 |
| WO | WO-2009137705 A2 | 11/2009 |
| WO | 2009143741 A1 | 12/2009 |
| WO | WO2010085361 A2 | 7/2010 |
| WO | WO2010088420 A1 | 8/2010 |
| WO | WO2010120804 A1 | 10/2010 |
| WO | WO-2011038013 | 3/2011 |
| WO | WO-2011038034 A1 | 3/2011 |
| WO | 2011059286 A2 | 5/2011 |
| WO | 2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

Luby et al., "Analysis of Low Density Codes and Improved Designs Using Irregular Graphs", International Computer Science Institute Technical Report TR-97-045 (Nov. 1997).

Alon, N. et al.: "Linear Time Erasure Codes with Nearly Optimal Recovery (Extended Abstract," Proceedings of the Annual Symposium on Foundations of Computer Science, US, Los Alamitos, IEEE Comp. Soc. Press, Vol. Symp 36. pp. 512-516 (Oct. 23, 1995) XP000557871.

Bigloo, A. et al.: "A Robust Rate-Adaptive Hybrid ARQ Scheme and Frequency Hopping for Multiple-Access Communication Systems," IEEE Journal on Selected Areas in Communications, US. IEEE Inc. New York (Jun. 1, 1994) pp. 917-624 XP0000464977.

Bitner, J.R., et al.: "Efficient generation of the binary reflected Gray code and its Applications." Communications of the ACM (1976).

Blomer, J. et al.: "An XOR-Based Erasure-Resilient Coding Scheme," ICSI Technical Report No. TR-95-048 (1995).

Byers J. et al.: "A Digital Fountain Approach to Reliable Distribution of Bulk Data," 1998, Computer Communication Review. Association for Computing Machinery, vol. 28 No. 4. pp. 56-67.

Byers, J. et al.: "Accessing Multiple Mirror Sites in Parallel: Using Tornado Codes to Speed Up Downloads," 1999, Eighteenth Annual Joint Conference of the IEEE Computer and Communications Societies, pp. 275-283.

Clark, G.C. et al. "Error Correction Coding for Digital Communications, System Applications." 1981. Plenum Press New York, pp. 339-341.

Digital Fountain: "Raptor code specification for MBMS file download," 3GPP SA4 PSM AD-HOC #31 (May 21, 2004) XP002355055 pp. 1-6.

Digital Fountain: "Specification Text for Raptor Forward Error Correction," TDOC S4-050249 of 3GPP TSG SA WG 4 Meeting #34 [Online] (Feb. 25, 2005) pp. 1-23. XPO02425167 Retrieved from the Internet: URL:http://www.3gpp.org/ftp/tsg_sa/WG4_CODEC/TSGS4_34/Docs.

Esaki, et al.: "Reliable IP Multicast Communication Over ATM Networks Using Forward Error Correction Policy." IEICE Transactions on Communications JP. Institute of Electronics Information and Comm. ENG. Tokyo, vol. E78-V, No. 12 (Dec. 1, 1995) pp. 1622-1637.

Gemmel. et al., "A Scalable Multicast Architecture for One-To-Many Telepresentations", Multimedia Computing and Systems. 1998/ Proceedings, IEEE International Conference on Austin, TX, USA Jun. 28-Jul. 1, 1998, Los Alamitos CA USA, IEEE Comput. Soc. US.

Lin, S. et al.: "Error Control Coding—Fundamentals and Applications," 1983, Englewood Cliffs, pp. 288.

Hershey, et al., "Random Parity Coding (RPC)", 1996 IEEE International Conference on Communications (ICC). Converging Technologies for Tomorrow's Applications. Dallas, Jun. 23-27, 1996. IEEE International Conference on Communications (ICC), New York, IEEE.

Kallel, "Complementary Punctured Convolutional (CPC) Codes and Their Applications", IEEE Transactions on Communications, IEEE Inc., New York, US, vol. 43, No. 6, Jun. 1, 1995, pp. 2005-2009.

Luby, M. et al.: "Analysis of Random Processes via And-Or Tree Evaluation," ICSI Technical Report No. TR-97-042 (1997) and Proceedings of the 9th Annual ACM Symposium on Discrete Algorithms (1998).

Luby, M. et al.: "Improved Low-Density Parity-Check Codes Using Irregular Graphs and Belief Propagation," International Computer Science Institute Technical Report TR-97-044 (Nov. 1997).

Luby, M. et al. "Practical Loss-Resilient Codes: Tornado Codes." 29th Annual ACM Symposium on Theory of Computing (1997).

Luby, M. et al., "Analysis of Low Density Codes and Improved Designs Using Irregular Graphs," 1998. Proceedings of the 30th Annual ACM Symposium on Theory.

Luby, M. et al. "Efficient Erasure Correction Codes," 2001 IEEE Transactions on Information Theory, Vo. 47, No. 2, pp. 569-584.

Narayanan, et al., "Physical Layer Design for Packet Data Over IS-136", Vehicular Technology Conference. 1997, IEEE 47th Phoenix, AZ, USA May 4-7, 1997, New York, NY, USA, IEEE, US May 4, 1997, pp. 1029-1033.

Nonnenmacher, et al., "Parity-Based Loss Recovery for Reliable Multicast Transmission", IEEE / ACM Transactions on Networking, IEEE Inc. New York, US. vol. 6 No. 4, Aug. 1, 1998. pp. 349-361.

Pursley, M. et al.. A Correction and an Addendum for "Variable-Rate Coding for Meteor-Burst Communications;" IEEE Transactions on Communications, vol. 43, No. 12 pp. 2866-2867 (Dec. 1995).

Shokrollhai, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.

Pursley, M. et al. "Variable-Rate Coding for Meteor-Burst Communications." IEEE Transactions on Communications, vol. 37, No. 11, pp. 1105-1112 (Nov. 1989) XP000074533 ISSN, 0090-6778.

(56) References Cited

OTHER PUBLICATIONS

Rizzo. L.: "Effective Erasure Codes for Reliable Computer Communication Protocols." Computer Communication Review Association for Computing Machinery. vol. 27, No. 2, pp. 24-36, Apr. 1997.
Seshan, S. et al.: "Handoffs in Cellular Wireless Networks: The Daedalus Implementation and Experience," Wireless Personal Communications, NL Kluwer Scademic Publishers, vol. 4, No. 2 (Mar. 1, 1997) pp. 141-162. XP000728589.
Shacham. N.: "Packet Recovery and Error Correction in High-Speed Wide-Area Networks," Proceedings of the Military Communications Conferences (Milcom), US, New York, IEEE vol. 1, pp. 551-557 (1989) XP000131876.
International Search Report. PCT/US2005/016334—International Search Authority—European Patent Office, Sep. 12, 2006.
International Preliminary Report on Patentability, PCT/US2005/016334—The International Bureau of WIPO—Geneva. Switzerland, Nov. 7, 2006.
Written Opinion. PCT/US2005/016334—International Search Authority—European Patent Office, Sep. 12, 2006.
Amin Shokrollahi: "LDPC Codes: An Introduction" Internet Citation 2 Apr. 1, 2003, XP002360065 Retrieved from the Internet: URL: http://www.ipm.ac.ir/IPM/homepage/Amin 2. pdf [retrieved on Dec. 19, 2005].
European Search Report—EP09007850, Search Authority—Munich Patent Office, Aug. 9, 2010.
Hagenauer, J. : "Soft is better than hard" Communications, Coding and Cryptology, Kluwer Publication May 1994, XP002606615 Retrieved from the Internet: URL: http://www.Int.ei.turn. de/veroeffentlic hungen/1994/ccc94h.pdf [retrieved on Oct. 25, 2010].
Luby, Michael G. "Analysis of Random Processes via And-Or Tree Evaluation," Proceedings of the 9th Annual ACM-SIAM Symposium on Discrete Algorithms, 1998, pp. 364-373, (search date: Jan. 25, 2010) URL: <http://portal.acm.prg.citation.cfm?id=314722>.
Luby, Michael G., Michael Mitzenmacher, M. Amin Shokorollahi, Daniel Spielman, "Analysis of Low Density Codes and Improved Designs Using Irregular Graphs." Proceedings of the Thirtieth Annual ACM Symposium on Theory of Computing, May 23, 1998, pp. 249-258.
Rost, S. et al.: "The Cyclone Server Architecture: streamlining delivery of popular content," 2002, Computer Communications, vol. 25, No. 4, pp. 403-412.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.prg.citation.cfm?id=1148681>.
Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.
3GPP, "Transparent end-to-end packet-switched streaming service (PSS): Protocols and codecs (Release 9)," 3GPP TS 26.234, version 9.1 .0, Release 9, Sophia Antipolis, Valbonne, FR, (Dec. 2009), 179 pp.
3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.
3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP. (3GP-DASH) (Release 10), 2010.
3rd Generation Partnership Project, Technical Specification Group Services and System Aspects Transparent end-to-end packet switched streaming service (PSS), 3GPP file format (3GP) (Release 8), 3GPP Standard, 3GPP TS 26.244, 3RD Generation Partnership Project (3GPP), Mobile Competence Centre, 650, Route Des Lucioles, F-06921 Sophia-Antipolis Cedex, France, No. V8.1.0, Jun. 1, 2009, pp. 1-52, XP050370199.

Aggarwal, C. et al.: "A Permutation-Based Pyramid Broadcasting Scheme for Video-onDemand Systems," Proc. IEEE Int'l Conf. on Multimedia Systems, Hiroshima, Japan (Jun. 1996), p. 1 18-126.
Aggarwal, C. et al.: "On Optimal Batching Policies for Video-on-Demand Storage Servers," Multimedia Systems, vol. 4, No. 4, pp. 253-258 (1996).
Alex Zambelli: "IIS Smooth Streaming Technical Overview", Microsoft Mar. 25, 2009, XP002620446, Retrieved from the Internet: URL:http://www.microsoft.com/downloads/en/details.
aspx?FamilyID=03d22583-3ed6-44da-8464-blb4b5ca7520, [retrieved on Jan. 21, 2011].
Almeroth, et al., "The use of multicast delivery to provide a scalable and interactive video-on-demand service", IEEE Journal on Selected Areas in Communication, 14(6): 1110-1122, (1996).
Bar-Noy, et al., "Competitive on-line stream merging algorithms for media-on-demand", Draft (Jul. 2000), p. 1-43.
Bar-Noy et al. "Efficient algorithms for optimal stream merging for media-on-demand," Draft (Aug. 2000), p. 1-34.
Chen, et al., U.S. Patent Application titled "Frame Packing for Asymmetric Stereo Video", filed Feb. 25, 2011.
Chen, et al., U.S. Patent Application titled "One-Stream Coding for Asymmetric Stereo Video", filed Feb. 25, 2011.
Dan, a. et al.: "Scheduling Policies for an On-Demand Video Server with Batching," Proc. ACM Multimedia, pp. 391-398 (Oct. 1998).
Davey, M.C. et al.: "Low Density Parity Check Codes over GF(q)" IEEE Communications Letters, vol. 2, No. 6 pp. 165-167 (1998).
David Singer, et al., "ISO/IEC 14496-15/FDIS, International Organization for Standardization Organization Internationale De Normalization ISO/IEC JTC1/SC29/WG11 Coding of Moving Pictures and Audio", ISO/IEC 2003, Aug. 11, 2003, pp. 1-34.
D.M. Mandelbaum: "An adaptive-feedback coding scheme using incremental redundancy", IEEE Trans on Information Theory, vol. May 1974, May 1974, pp. 388-389, XP002628271, the whole document.
Eager, et al. "Minimizing bandwidth requirements for on-demand data delivery," Proceedings of the International Workshop on Advances in Multimedia Information Systems, p. 80-87 (Indian Wells, CA Oct. 1999).
Eager, et al., "Optimal and efficient merging schedules for video-on-demand servers", Proc. ACM Multimedia, vol. 7, pp. 199-203 (1999).
European Search Report—EP10002379, Search Authority—Munich Patent Office, May 5, 2010.
Feng, G., Error Correcting Codes over Z2m for Algorithm-Based Fault-Tolerance, IEEE Transactions on Computers, vol. 43, No. 3, Mar. 1994, pp. 370-374.
Fielding, et al., "Hypertext Transfer Protocol—HTTP/1.1," Network Working Group, RFC 2616, Jun. 1999, 165 pp.
Frojdh, et al., "File format sub-track selection and switching," ISO/IEC JTC1/SC29/WG11 MPEG2009 M16665, London UK., Jul. 2009, 14 pp.
Gao, L. et al.: "Efficient Schemes for Broadcasting Popular Videos," Proc. Inter. Workshop on Network and Operating System Support for Digital Audio and Video, pp. 1-13 (1998).
Heiko Schwarz, et al., "Overview of the Scalable Video Coding Extension of the H.264/AVC Standard", IEEE Transactions on Circuits and Systems for Video Technology, vol. 17, No. 9, Sep. 2007, pp. 1103-1120.
Hitachi Ltd. et al., "High-Definition Multimedia Interface," Specification Version 1.4, Jun. 5, 2009, 425 pp.
Hua, et al., "Skyscraper broadcasting: A new broadcsting system for metropolitan video-on-demand systems", Proc. ACM SIGCOMM, pp. 89-100 (Cannes, France, 1997).
Information Technology—Generic Coding of Moving Pictures and Audio: Systems, Amendment 4: Transport of Multiview Video over ITU-T Rec H.222.0 | ISO/IEC 13818-1 "Text of ISO/IEC 13818-1:2007/FPDAM 4—Transport of Multiview Video over ITU-T Rec H.222.0 I ISO/IEC 13818-1," Lausanne, Switzerland, 2009, 21 pp.
International Search Report and Written Opinion—PCT/US2010/049842, ISA/EPO—Jun. 28, 2011.
International Search Report and Written Opinion—PCT/US2010/049862, ISA/EPO—Jun. 27, 2011.

(56) References Cited

OTHER PUBLICATIONS

International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ISO/IEC 13818-1, "Information technology—Generic coding of moving pictures and associated audio information: Systems," Second edition, Dec. 1, 2000, 174 pp.
"ISO/IEC JTC 1/SC 29, ISO/IEC FCD 23001-6, Information technology—MPEG systems technologies—Part 6: Dynamic adaptive streaming over HTTP (DASH), Jan. 28, 2011".
"Joint Draft 8.0 on Multiview Video Coding", 28th JVT meeting, Hannover, Germany, Jul. 2008. available from http://wftp3.itu.int/av-arch/jvt-site/2008_207_Hannover/JVT-AB204.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kozamernik F: "Media streaming over the Internet", Internet Citation, Oct. 2002, XP002266291, Retrieved from the Internet: URL: http://www.ebu.ch/trev_292-kozamerni k.pdf [retrieved on Jan. 8, 2004] section "Video codecs for scalable streaming".
Marpe, et al., "The H.264/MPEG4 Advanced Video Coding Standard and its Applications," Standards Report, IEEE Communications Magazine, Aug. 2006, pp. 134-143.
Min-Goo Kim: "On systematic punctured convolutional codes", IEEE Trans on Communications, vol. 45, No. 2, Feb. 1997, XP002628272, the whole document, pp. 133-139.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Naguib, Ayman, et al., "Applications of Space-Time Block Codes and Interference Suppression for High Capacity and High Data Rate Wireless Systems," IEEE, 1998, pp. 1803-1810.
Ozden, B. et al.: "A Low-Cost Storage Service for Movie on Demand Databases," Proceedings of the 20th Very Large DataBases (VLDB) Conference, Santiago, Chile (1994).
PA. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).
Pantos Ret al., "HTTP Live Streaming; draft-pantos-http-live-streaming-OT.txt", HTTP Live Streaming; Draft-Pant0s-HTTP-Live-Streaming-01.Txt, Internet Engineering Task Force, IEFT; Standardworkingdraft, Internet Society (ISOC) 4, Rue Des Falaises CH-1205 Geneva, Switzerland, No. 1, Jun. 8, 2009, XP015062692.
Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).
Perkins, et al.: "Survey of Packet Loss Recovery Techniques for Streaming Audio," IEEE Network; Sep./Oct. 1998, pp. 40-48.
Pless and WC Huffman EDS V S: Algebraic geometry codes, Handbook of Coding Theory, 1998, pp. 871-961, XP002300927.
Qualcomm Europe S A R L: "Baseline Architecture and Definitions for HTTP Streaming", 3GPP Draft; S4-090603_HTTP_STREAMING_ARCHITECTURE, 3RD Generation Partnership Project (3GPP), Mobile Competence Centre; 650, Route Des Lucioles; F-06921 Sophia-Antipolis Cedex; France, No. Kista; 20090812, Aug. 12, 2009, XP050356889.
Rangan, et al., "Designing an On-Demand Multimedia Service," IEEE Communication Magazine, vol. 30, pp. 5-65, (Jul. 1992).
Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).
Roth, R., et al., "A Construction of Non-Reed-Solomon Type MDS Codes", IEEE Transactions of Information Theory, vol. 35, No. 3, May 1989, pp. 655-657.
Roth, R., "On MDS Codes via Cauchy Matrices", IEEE Transactions on Information Theory, vol. 35, No. 6, Nov. 1989, pp. 1314-1319.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T Rec. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.
Shokrollahi et al., "Design of Efficient Easure Codes with Differential Evolution", IEEE International Symposium on Information Theory, Jun. 25, 2000, pp. 5-5.
W. Sincoskie, W D., "System Architecture for Large Scale Video on Demand Service," Computer Network and ISDN Systems, pp. 155-162, (1991).
Stockhammer, WD 0.1 of 23001-6 Dynamic Adaptive Streaming over HTTP (DASH), MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.
Sullivan et al., Document: JVT-AA007, "Editors' Draft Revision to ITU-T Rec. H.264/1S0/IEC 14496-10 Advanced Video Coding—In Preparation for ITU-T SG 16 AAP Consent (in integrated form)," Joint Video Team (JVT) of ISI/IEC MPEG & ITU-T VCEG (ISO/IEC JTC1/SC29/WG11 and ITU-T SG16 Q.6), 30th Meeting: Geneva, CH, Jan. 29-Feb. 3, 2009, pp. 1-683, http://wftp3.itu.int/av-arch/jvtsite/2009_01_Geneva/JVT-AD007.zip.
Sun, et al., "Seamless Switching of Scalable Video Bitstreams for Efficient Streaming," IEEE Transactions on Multimedia, vol. 6, No. 2, Apr. 2004, pp. 291-303.
Thomas Wiegand, et al., "Joint Draft ITU-T Rec. H.264 = ISO/IEC 14496-10 / Amd.3 Scalable video coding", Joint Video Team (JVT) of ISO/IEC MPEG & ITU-T VCEG (ISO/IEC JTC1/SC29/WG11 and ITU-T SG16 Q.6) 24th Meeting: Geneva, Switzerland, Jun. 29-Jul. 5, 2007, pp. 1-559.
Vetro, et al., Document: JVT-AB204 (rev. 1), Joint Draft 8.0 on Multiview Video Coding, Joint Video Team (JVT) of ISO/IEC MPEG & ITU-T VCEG(ISO/IEC JTC1/SC29/WG11 and ITU-T SG16 Q.6), 28th Meeting: Hannover, DE, Jul. 20-25, 2008, pp. 1-66, http://wftp3.itu.int/av-arch/jvt-site/2008_07_Hannover/JVT-AB204.zip.
Viswanathan, et al., "Metropolitan area video-on-demand services using pyramid broadcasting", Multimedia Systems, 4(4): 197-208 (1996).
Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).
Viswanathan, et al.: "Publishing in Wireless and Wireline Environments," Ph. D Thesis, Rutgers, The State University of New Jersey (Nov. 1994).
Wenge, et al., "Asymmetric Stereoscopic Video Encoding Algorithm Based on Joint Compensation Prediction," 2009 International Conference on Communications and Mobile Computing, 4 pp., 191-194.
Wenger S., "RTP Payload Format for H.264 Video", Network Working Group, Feb. 2005, pp. 1-84.
Wong, J.W., "Broadcast delivery", Proceedings of the IEEE, 76(12): 1566-1577, (1988).
Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.
Zorzi, et al.: "On the Statistics of Block Errors in Bursty Channels," IEEE Transactions on Communications, vol. 45, No. 6, Jun. 1997, pp. 660-667.
Aljoscha Smolic et al., "Development of a new MPEG standard for advanced 3D video applications", IEEE International Symposium on Image and Signal Processing and Analysis, Sep. 16, 2009, pp. 400-407, XP031552049, ISBN: 978-953-184-135-1.
Charles Lee L.H.: "Error-Control Block Codes for Communications Engineers", 2000, Artech House, XP002842221, pp. 39-45.

(56) References Cited

OTHER PUBLICATIONS

European Search Report—EP10013219—Search Authority—Hague—Jun. 20, 2011.
European Search Report—EP10013220—Search Authority—The Hague—Jun. 15, 2011.
European Search Report—EP10013221—Search Authoroty—The Hague—Jun. 29, 2011.
European Search Report—EP10013222—Search Authority—Hague—Jun. 28, 2011.
Grineberg, et al., "Deliverable D3.2 MVC/SVC storage format" Jan. 29, 2009, XP002599508 Retrieved fro the Internet: URL:http:www.ist-sea.eulPublic/SEA_D3.2_HHI FF_20090129.pdf [retrieved on Sep. 1, 2010] paragraph [02.3].
Ian Trow: "Is 3D Event Coverage Using Existing Broadcast Infrastructure Technically Possible?", International Broadcasting Conference, Sep. 9, 2009,—Sep. 13, 2009, XP030081871, pp. 4-5, "3D transmission over broadcast infrastructure" pp. 7-8, "Screen signaling"—Conclusions on 3D systems.
International Standard ISO/IEC 14496-12, Information Technology—Coding of audio-visual objects—Part 12: ISO base media file format, Third Edition, Oct. 15, 2008, 120 pp.
Kimata H et al., "Inter-view prediction with downsampled reference pictures", ITU Study Group 16 —Video Coding Experts Group—ISO/IEC MPEG & ITU-T VCEG(ISO/IEC JTC1/SC29/WG11 and ITU-T SG16 Q6), No. JVT-W079, Apr. 19, 2007, XP030007039.
Luby Digital Fountain a Shokrollahi EPFL M Watson Digital Fountain T Stockhammer Nomor Research M: "Raptor Forward Error Correction Scheme for Object Delivery: rfc5053.txt", IFET Standard, Internet Engineering Task Force, IEFT, CH, Oct. 1, 2007, XP015055125, ISSN: 0000-0003.
Petition decision for Petition Under 37 C F. R. § 1.78 to Accept an Unintentionally Delayed Priority Claim under 35 U.S.C. § 120 in U.S. Pat. No. 7,532,132, dated Jul. 21, 2011, 2 pages.
Petition under 37 C.F.R. § 1.78 to Accept an Unintentionally Delayed Priority Claim under 35 U.S.C. § 120 in U.S. Pat. No. 7,532,132, dated May 27, 2011, 2 pages.
Ying Chen et al., "Coding techniques in Multiview Video Coding and Joint Multiview Video Model", Picture Coding Symposium, 2009, PCS 2009, IEEE, Piscataway, NJ, USA, May 6, 2009, pp. 1-4, XP031491747, ISBN: 978-1-4244-4539-6.
3rd Generation Partnership Project; Technical Specification Group Services and System Aspects; Transparent end-to-end packet switched streaming service (PSS); 3GPP file format (3GP) (Release 9), 3GPP Standard; 3GPP TS 26.244, 3rd Generation Partnership Project (3GPP), Mobile Competence Centre; 650, Route des Lucioles; F-06921 Sophia-Antipolis Cedex; France, No. V9.2.0, Jun. 9, 2010, pp. 1-55, XP050441544, [retrieved on Jun. 9, 2010].
Afzal, et al., "Video Streaming over MBMS: A System Design Approach", Journal of Multimedia, vol. 1, No. 5, Aug. 2006, pp. 25-35.
Albanese, A., et al., "Priority Encoding Transmission", IEEE Transactions on Information Theory, vol. 42, No. 6, pp. 1-22, (Nov. 1996).
Amon P. et al., "File Format for Scalable Video Coding", IEEE Transactions on Circuits and Systems for Video Technology, IEEE Service Center, Piscataway, NJ, US, vol. 17, No. 9, Sep. 1, 2007, pp. 1174-1185, XP011193013, ISSN: 1051-8215, DOI:10.1109/TCSVT.2007.905521.
Anonymous: [Gruneberg, K., Narasimhan, S. and Chen, Y., editors] "Text of ISO/IEC 13818-1:2007/PDAM 6 MVC operation point descriptor", 90 MPEG Meeting; 26-10;- 2009—Oct. 30, 2009; Xian; (Motion Picture Expertgroup or ISO/IEC JTC1/SC29/WG111), No. N10942, Nov. 19, 2009, XP030017441.
Anonymous: "Text of ISO/IEC 14496-12 3rd Edition", 83 MPEG Meeting; Jan. 14-Jan. 18, 2008; Antalya; (Motion Pictureexpert Group or ISO/IEC JTC1/SC29/WG11), No. N9678, Apr. 22, 2008, XP030016172.
Anonymous: "Text of ISO/IEC 14496-12:2008/PDAM 2 Sub-track selection & switching", 91. MPEG Meeting; Jan. 18-Jan. 22, 2010; Kyoto; (Motion Picture Expertgroup or ISO/IEC JTC1/SC29/WG11), No. N11137, Jan. 22, 2010, XP030017634, ISSN: 0000-0030.
Anonymous: "Text of ISO/IEC 14496-15 2nd edition", 91 MPEG Meeting; Jan. 18-Jan. 22, 2010; Kyoto; (Motion Picture Expertgroup or ISO/IEC JTC1/SC29/WG11) No. N11139, Jan. 22, 2010, XP030017636.
Apple Inc., "On the time-stamps in the segment-inbox for httpstreaming (26.244, R9)", TSG-SA4#58 meeting, Vancouver, Canada, Apr. 2010, p. 5.
Choi S: "Temporally enhanced erasure codes for reliable communication protocols" Computer Networks, Elsevier Science Publishers B.V., Amsterdam, NL, vol. 38, No. 6, Apr. 22, 2002, pp. 713-730, XP004345778, ISSN: 13891286, DOI:10.1016/S1389-1286(01)00280-8.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.conn/journals/ijdmb/20091614178.html> [retrieved on Dec. 5, 2010].
"Digital Video Broadcasting (DVB); Guidelines for the implementation of DVB-IP Phase 1 specifications; ETSI TS 102 542" ETSI Standards, LIS, Sophia Antipoliscedex, France, vol. BC, No. V1.2.1, Apr. 1, 2008, XP014041619 ISSN: 0000-0001 p. 43 p. 66 pp. 70, 71.
DVB-IPI Standard: DVB BlueBook A086r4 (03/07) Transport of MPEG 2 Transport Streatm (TS) Based DVB Services over IP Based Networks, ETSI Technical Specification 102 034 v1.3.1.
Fernando, et al., "httpstreanning of MPEG Media—Response to CfP", 93 MPEG Meeting; Jul. 26-Jul. 30, 2010; Geneva; (Motion Picture Expert Group or ISO/IEC JTC1/SCE29/WG11), No. M17756, Jul. 22, 2010, XP030046346.
Gasiba, Tiago et al., "System Design and Advanced Receiver Techniques for MBMS Broadcast Services" Proc. 2006 International Conference on Communications (ICC 2006), Jun. 1, 2006, pp. 5444-5450, XP031025781 ISBN: 978-1-4244-0354-7.
Goyal: "Multiple Description Coding: Compression Meets the Network," In Signal Processing Magazine, IEEE, vol. 18., Issue 5 (Sep. 2001) pp. 74-93 URL:http://wvvw.rle.mit.edu/stir/documents/Goyal—SigProcMag2001—MD.pdf [Apr. 7, 2011].
Gozalvez D et, al: "Mobile reception of DVB-T services by means of AL-FEC protection" Proc. IEEE Intern. Symposium on Broadband Multimedia Systems and Broadcasting (BMSB '09), IEEE, Piscataway, NJ, USA, May 13, 2009, pp. 1-5, XP031480155 ISBN: 978-1-4244-2590-7.
IETF RFC 2733: Rosenberg, J. et al. "An RTP Payload Format for Generic Forward Error Correction", Network Working Group, RFC 2733 (Dec. 1999).
International Search Report and Written Opinion—PCT/US2011/044745—ISA/EPO—Dec. 21, 2011.
ISO/IEC JTC1/SC29/WG11: "Requirements on HTTP Streaming of MPEG Media", 92. MPEG Meeting; Apr. 19-Apr. 23, 2010; Dresden; No. N11340, May 14, 2010, XP030017837, ISSN: 0000-0029.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol. 3, Mar. 18, 2005, pp. 1097-1100, XP010792442, DOI: 10.1109/ICASSP.2005.1415905 Isbn: 978-0/7803-8874-1.
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Luby, et al., "FLUTE—File Delivery over Unidirectional Transport", IETF RFC 3926, pp. 1-35, (Oct. 2004).
Luby et, al. "Layered Coding Transport (LCT) Building Block", IEFT RFC 5651, pp. 1-42, (Oct. 2009).
Luby, M., et, al. "Forward Error Correction (FEC) Building Block", IETF RFC 5052, pp. 1-31, (Aug. 2007).
Luby, M., et al., "Raptor Forward Error Correction Scheme for Object Delivery", IETF RFC5053, pp. 1-46 (Sep. 2007).

(56) References Cited

OTHER PUBLICATIONS

Luby, M., et al., "RaptorQ Forward Error Correction Scheme for Object Delivery", IETF draft ietf-rmt-bb-fec-raptorq-04, Reliable Multicast Transport, pp. 1-68, (Aug. 24, 2010).
Luby, M., et al., "Request for Comments: 3453: the Use of Forward Error Correction (FEC) in Reliable Multicast," Internet Article, [Online] Dec. 2002, pp. 1-19.
Luby M et al: "IPTV Systems, Standards and Architectures: Part II-Application Layer FEC in IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
McCanne, et al., "Low-Complexity Video Coding for Receiver-Driven Layered Multicast", IEEE Journal on Selected Areas in Communication IEEE Service Center, Aug. 1, 1997, vol. 15, No. 6, pp. 983-1001, Piscataway, US, XP011054678, ISSN: 0733-8716.
Mimnaugh, A et, al. "Enabling Mobile Coverage for DVB-T" Digital Fountain Whitepaper Jan. 29, 2008, pp. 1-9, XP002581808 Retrieved from the Internet: URL:http://wwvv.digitalfountain.com/ufiles/library/DVB-T-whitepaper.pdf> [retrieved on May 10, 2010].
Nokia: "Reed-Solomon Code Specification for. MBMS Download and Streaming Services", 3GPP Draft; S4-050265_RS_SPEC, 3RD Generation Partnership Project (3GPP), Mobile Competence Centre ; 650, Route des Lucioles; F-06921 Sophia-Antipolis Cedex; France, vol. SA WG4, no. San Diego, USA; 20050415, Apr. 15, 2005, XP050287675, [retrieved on Apr. 15, 2005].
Nokia Corp., "Usage of 'mfrs' box for Random Access and Seeking," S4-AH1127, 3GPP TSH-SA4 Ad-Hoc Meeting, Dec. 14-16, 2009, Paris, FR, 2 pp.
Plank J. S., "A Tutorial on Reed-Solomon Coding for Fault-Tolerance In Raid-Like Systems", Software Practice & Experience, Wiley & Sons, Bognor Regis, GB, vol. 27, No. 9, Sep. 1, 1997, pp. 995-1012, XP00069594.
Pyle, et al., "Microsoft http smooth Streaming: Microsoft response to the Call for Proposal on httpstreaming", 93 MPEG Meeting; Jul. 26-Jul. 30, 2010; Geneva; (Motion Picture Expert Group or ISO/IEC JTC1/SCE29/WG11), No. M17902, Jul. 22, 2010, XP030046492.
Qualcomm Incorporated: "Use Cases and Examples for Adaptive httpstreaming", 3GPP Draft; S4-100408-Usecases-HSD, 3RD Generation Partnership. Project (JGPP), Mobile Competence Centre; 650, Route des Lucioles; F-06921 Sophia-Antipolis Cedex; France, vol. SA WG4, no. Prague, Czech Republic; 20100621, Jun. 17, 2010, XP050438085, [retrieved on Jun. 17, 2010].
Realnetworks Inc, et al., "Format for httpstreaming Media Presentation Description", 3GPP Draft; S4-100020, 3rd Generation Partnership Project (3GPP), Mobile Competence Centre; 650, Route des Lucioles; F-06921 Sophia-Antipolis Cedex; France, vol. SA WG4, no. St Julians, Malta; 20100125, Jan. 20, 2010, XP050437753, [retrieved on Jan. 20, 2010].
Research in Motion UK Limited: "An MPD delta file for httpstreaming", 3GPP Draft; S4-100453, 3rd Generation Partnership Project (SGPP), Mobile Competence Centre; 650, Route des Lucioles; F-06921 Sophia-Antipolis Cedex; France, vol. SA WG4, no. Prague, Czech Republic; 20100621, Jun. 16, 2010, XP050438066, [retrieved on Jun. 16, 2010].
Rhyu, et al., "Response to Call for Proposals on httpstreaming of MPEG Media", 93 MPEG Meeting; Jul. 26-Jul. 30, 2010; Geneva; (Motion Picture Expert Group or ISO/IEC JTC1/SCE29/WG11) No. M17779, Jul. 26, 2010, XP030046369.

Roca, V., et, al. "Low Density Parity Check (LDPC) Staircase and Triangle Forward Error Correction (FEC) Schemes", IETF RFC 5170 (Jun. 2008), pp. 1-34.
Telefon AB LM Ericsson, et al., "Media Presentation Description in httpstreaming", 3GPP Draft; S4-100080-MPD, 3rd Generation Partnership Project (3GPP), Mobile Competence Centre; 650, Route des Lucioles; F-06921 Sophia- Antipolis Cedex; France, vol. Sa WG4, no. St Julians, Malta; 20100125, Jan. 20, 2010, XP050437773, [retrieved on Jan. 20, 2010].
Tsunoda T., et al., "Reliable Streaming Contents Delivery by Using Multiple Paths," Technical Report of the Institute of Electronics, Information and Communication Engineers, Japan, Mar. 2004, vol. 103, No. 692, pp. 187-190, NS2003-331, IN2003-286.
U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8, 2011.
U.S. Appl. No. 13/205,565, by Ying Chen et al., filed Aug. 8, 2011.
U.S. Appl. No. 13/205,574, by Ying Chen et al., filed Aug. 8, 2011.
Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (EISI), 650, Route des Lucioles; F-06921 Sophia-Antipolis; France, vol. 3GPP SA, No. V9.3.0, Jun. 1, 2010, XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].
Wang, "On Random Access", Joint Video Team (JVT) of ISO/IEC MPEG & ITU-T VCEG (ISO/IEC JTC1ISC29/WG11 and ITU-T SG16 Q.6), 4th Meeting: Klagenfurt, Austria, Jul. 22-26, 2002, p. 13.
Watson, M., et, al. "Asynchronous Layered Coding (ALC) Protocol Instantiation", IETF RFC 5775, pp. 1-23, (Apr. 2010).
Ying Chen et al: "Response to the CfP on HTTP Streaming: Adaptive Video Streaming based on AVC", 93 MPEG Meeting; Jul. 26-Jul. 30, 2010; Geneva; (Motion Picture Expert Group or ISO/IEC JTC1/SC29/WG11), No. M17909, Jul. 26, 2010, XP030046499.
Cataldi et al., " Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.
Gracie et al., " Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPROC.2007.895197.
Huawei et al., "Implict mapping between CCE and PUCCH for ACK/NACK TDD", 3GPP Draft; R1-082359, 3rd Generation Partnership Project (3GPP), Mobile Competence Centre; 650, Route des Lucioles ; F-06921 Sophia-Antipolis Cedex; France, vol. RAN WG1, no. Warsaw, Poland, Jun. 24, 2008, XP050110650, [retrieved on Jun. 24, 2008].
International Search Report and Written Opinion—PCT/US2012/024737—ISA/EPO—May 11, 2012.
Kimura et al., "A Highly Mobile SDM-0FDM System Using Reduced-Complexity-and-Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.
Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].
MacKay, "Fountain codes Capacity approaching codes design and implementation", IEE Proceedings: Communications, Dec. 9, 2005, pp. 1062-1068, vol. 152, No. 6, Institution of Electrical Engineers, XP006025749, ISSN: 1350-2425, DOI: 10.1049/IPCOM:20050237.
Todd, "Error Correction Coding: Mathematical Methods and Algorithms", Mathematical Methods and Algorithms, Jan. 1, 2005, pp. 451-534, Wiley, XP002618913.
Bross, et al., "High efficiency video coding (HEVC) text specification draft 6," Joint Collaborative Team on Video Coding (JCT-VC) of

(56) References Cited

OTHER PUBLICATIONS

ITU-T SG16 WP3 and ISO/IEC JTC1/SC29/WG11 JCTVC-H1003, 7th Meeting: Geneva, CH, Nov. 31-30, 2011, pp. 259.
Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27-May 7, 2012, JCTVC-I1003_d21, pp. 290.
Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.
Bross et al., "WD4: Working Draft 4 of High-Efficiency Video Coding," JCTVCF803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.
Bross et al., "WD5: Working Draft 5 of High-Efficiency Video Coding," JCTVCG1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.
European Search Report—EP10013235—Search Authority—The Hague—Aug. 20, 2012.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Jiang., File Format for Scalable Video Coding, PowerPoint Presentation for CMPT 820, Summer 2008.
Pantos, "HTTP Live Streaming draft-pantos-http-live-streaming-02", Informational, Internet-Draft, Intended status: Informational, Expires: Apr. 8, 2010, http://toolsiettorg/html/draft-pantos-http-live-streaming-02, pp. 1-20, Oct. 5, 2009.
Thomas Wiegand et al.,"WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010.
Wiegand et al., "WD3: Working Draft 3 of High-Efficiency Video Coding," Document JCTVC-E603, 5th Meeting: Geneva, CH, Mar. 16-23, 2011, 193 pp.
Wiegand T. et al., "WD2: Working Draft 2 of High-Efficiency Video Coding", 20110128, No. JCTVC-D503, Jan. 28, 2011, XP002679642, Retrieved from the Internet: URL: http://wftp3.itu.int/av-archictvc-site/2011_01_D_Daegu/ [retrieved on Jul. 11, 2012].
Yamamouchi N., et al., "Internet Multimedia Transmission with Packet by Using Forward Error Correction," Proceedings of DPS Workshop, The Information Processing Society of Japan, Dec. 6, 200, vol. 2000, No. 15, pp. 145-150.
Anonymous: "Technologies under Consideration", 100. MPEG Meeting;Apr. 30-Apr. 5, 2012; Geneva; (Motion Picture Expert Group or ISO/IEC JTC1/SC29/WG11), No. N12682, Jun. 7, 2012, XP030019156.
Gil a., et al., "Personalized Multimedia Touristic Services for Hybrid Broadcast/Broadband Mobile Receivers," IEEE Transactions on Consumer Electronics, 2010, vol. 56 (1), pp. 211-219.
Hannuksela M.M., et al., "Dash: Indication of Subsegments Starting with SAP, 97. MPEG Meeting; Jul. 18-Jul. 22, 2011; Torino; (Motion Picture Expert Group or ISO/IEC JTC1/SC29/WG11)" No. m21096, Jul. 21, 2011, XP030049659.
Hannuksela M.M., et al., "ISOBMFF: SAP definitions and 'sidx' box", 97. MPEG Meeting; Jul. 18-Jul. 22, 2011; Torino; (Motion Picture Expert Group or ISO/IEC JTC1/SC29/WG11) No. m21435, Jul. 22, 2011, XP030049998.
Li, M., et al., "Playout Buffer and Rate Optimization for Streaming over IEEE 802.11 Wireless Networks", Aug. 2009, Worcester Polytechnic Institute, USA.
Luby et al., RaptorQ Forward Error Correction Scheme for Object Delivery draft-ietf-rmt-bb-fec-raptorq-00, Qualcomm, Inc. Jan. 28, 2010.
Michael G et al., "Improved low-density parity-check codes using irregular graphs", Information Theory, IEEE Transactions on, Feb. 2001, vol. 47, No. 2, pp. 585-598.
Ohashi A et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Roumy A., et al., "Unequal Erasure Protection and Object Bundle Protection with the Generalized Object Encoding Approach", Inria-00612583, Version 1, Jul. 29, 2011, 25 pages.
Schulzrinne, et al., "Real Time Streaming Protocol (RTSP)" Network Working Group, Request for Comments: 2326, Apr. 1998, pp. 1-92.
Stockhammer T., et al., "DASH: Improvements on Representation Access Points and related flags", 97. MPEG Meeting; Jul. 18-Jul. 22, 2011; Torino; (Motion Picture Expert Group or ISO/IEC JTC1/SC29/WG11) No. m20339, Jul. 24, 2011, XP030048903.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.
3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/ etsits/126300_126399/126346/06.01.00_60/ts_126346v060100p.pdf.
3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3rd Generation Partnership Project (3GPP), Mobile Competence Centre; 650, Route des Lucioles; F-06921 Sophia-Antipolis Cedex; France, vol. SA WG4, No. V10.0.0, Jun. 17, 2011, pp. 1-94, XP050553206, [retrieved on Jun. 17, 2011].
Anonymous: "Technologies under Consideration", 98. MPEG Meeting; Nov. 28-Dec. 2, 2011; Geneva; (Motion Picture Expert Group or ISO/IEC JTC1/SC29/WG11), No. N12330, Dec. 3, 2011, XP030018825.
Anonymous: "Text of ISO/IEC IS 23009-1 Media Presentation Description and Segment Formats", 98. MPEG Meeting; Nov. 28-Dec. 2, 2012; Geneva; (Motion Picture Expert Group or ISO/IEC JTC1/SC291/WG11) No. N12329, Jan. 6, 2012, XP030018824.
Atis: "PTV Content on Demand Service", IIF-WT-063R44, Nov. 11, 2010, pp. 1-124, XP055045168, Retrieved from the Internet: URL:ftp://vqeg.its.bldrdoc.gov/Documents/VQEG_Atlanta_Nov10/MeetingFiles/Liaison/IIF-WT-063R44_Content_on_Demand.pdf [retrieved on Nov. 22, 2012].
Bouazizi I., et al., "Proposals for ALC/FLUTE server file format (14496-12Amd.2)", 77. MPEG Meeting; Jul. 17-Jul. 21, 2006; Klagenfurt; (Motion Pictureexpert Group or ISO/IEC JTC1/SC29/WG11), No. M13675, Jul. 12, 2006, XP030042344, ISSN: 0000-0236.
"Digital Video Broadcasting (DVB); Framing structure, channel coding and modulation for digital terrestrial television; ETSI EN 300 744" ETSI Standards, LIS, Sophia Antipolis Cedex, France, V1.6.1, pp. 9, Jan. 10, 2009.
Frojdh P., et al., "Study on 14496-12:2005/PDAM2 ALU/FLUTE Server File Format", 78.MPEG Meeting; Oct. 23-Oct. 27, 2006; Hangzhou: (Motion Picturexpert Group or ISO/IEC JTC1/SC29/WG11) No. M13855, Oct. 13, 2006, XP030042523, ISSN: 0000-0233.
Kim J., et al., "Enhanced Adaptive Modulation and Coding Schemes Based on Multiple Channel Reportings for Wireless Multicast Systems", 62nd IEEE Vehicular Technology Conference, VTC-2005-Fall, Sep. 25-28, 2005, vol. 2, pp. 725-729, XP010878578, DOI: 1 0.11 09/VETECF.2005.1558019, ISBN: 978-0/7803-9152-9.

(56) References Cited

OTHER PUBLICATIONS

Moriyama, S., "5. Present Situation of Terrestrial Digital Broadcasting in Europe and USA", Journal of the Institute of Image Information and Television Engineers, Nov. 20, 1999, vol. 53, No. 11, pp. 1476-1478.
Motorola et al: "An Analysis of DCD Channel Mapping to BCast File Delivery Sessions; OMA-CDDCD-2007-0112-INP DCD_Channel_Mapping_to_BCAST_File_Delivery", OMA-CD-DCD-2007-0112-INP_DCD_Channel_Mapping_To_BCast_File_Delivery, Open Mobile Alliance (OMA), 4330 La Jolla Village Dr., Suite 110 San Diego, CA 92122; USA Oct. 2, 2007, pp. 1-13, XP064036903.
"RaptorQ Technical Overview", Qualcomm Incorporated, pp. 1-12 (Oct. 1, 2010).
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
Makoto N., et al., "On Tuning of Blocking LU decomposition for VP2000 series" the 42th Information Processing Society of Japan Conference (1st term in 1991), Feb. 25, 1991, pp. 71-72, 4B-8.
Miller G., et al., "Bounds on the maximum likelihood decoding error probability of low density parity check codes", Information Theory, 2000. Proceedings. IEEE International Symposium on, 2000, p. 290.
Muramatsu J., et al., "Low density parity check matrices for coding of multiple access networks", Information Theory Workshop, 2003. Proceedings. 2003 IEEE, Apr. 4, 2003, pp. 304-307.
Samukawa, H. "Blocked Algorithm for LU Decomposition" Journal of the Information Processing Society of Japan, Mar. 15, 1993, vol. 34, No. 3, pp. 398-408.
3GPP TSG-SA4 #57 S4-100015, IMS based PSS and MBMS User Service extensions, Jan. 19, 2010, URL : http://www.3gpp.org/ftp/tsg_sa/WG4_CODEC/TSGS4_57/docs/S4- 100015.zip.
3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010 p. 85-102, URL,http://www.3gpp.org/ftp/TSG_SA/WG4_Codec/TSGS4_59/Docs/S4-100511.zip, 26234-930.zip.
Lee, J.Y., "Description of Evaluation Experiments on ISO/IEC 23001-6, Dynamic Adaptive Streaming over HTTP", ISO/IEC JTC1/SC29/WG11MPEG2010/N11450, Jul. 31, 2010, 16 pp.
Luby M., "Simple Forward Error Correction (FEC) Schemes," draft-luby-rmt-bb-fec-suppsimple-00.txt, pp. 1-14, Jun. 2004.
Luby M., "LT Codes", Foundations of Computer Science, 2002, Proceedings, The 43rd Annual IEEE Symposium on, 2002.
Morioka S., "A Verification Methodology for Error Correction Circuits over Galois Fields", Tokyo Research Laboratory, IBM Japan Ltd, pp. 275-280, Apr. 22-23, 2002.
Qualcomm Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc_MBS/Docs_AHI/S4-AHI170.zip, S4-AHI170_CR_AdaptiveHTTPStreaming-Full.doc.
Qualcomm Incorporated: "Corrections to 3GPP Adaptive Http Streaming", 3GPP TSG-SA4 #59 Change Request 26.234 CR0172 S4-100403, Jun. 16, 2010, URL, http://www.3gpp.org/FTP/tsg_sa/WG4_CODEC/TSGS4_59/Docs/54-100403.zip, S4-100403_CR_26234-0172-AdaptiveHTTPStreaming-Re1-9.doc.
Chikara S., et al., "Add-on Download Scheme for Multicast Content Distribution Using LT Codes", IEICE. B, Communications, Aug. 1, 2006, J89-B (8), pp. 1379-1389.
Gerard F., et al., "HTTP Streaming MPEG media—Response to CFP", 93. MPEG Meeting, Geneva Jul. 26, 2010 to Jul. 30, 2010.
Hasan M A., et al., "Architecture for a Low Complexity Rate-Adaptive Reed- Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.
Tetsuo M., et al., "Comparison of Loss Resilient Ability between Multi-Stage and Reed-Solomon Coding", Technical reports of IEICE, CQ, Communication Quailty, vol. 103 (178), Jul. 4, 2003, pp. 19-24.
Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.
Watson M., et al., "Forward Error Correction (FEC) Framework draft-ietf-fecframe-framework11," 2011, pp. 1-38, URL,http://tools.ietf.org/pdf/draft-ietf-fecframe-framework-11.pdf.
Watson M., et al., "Raptor FEC Schemes for FECFRAME draft-ietf-fecframe-raptor-04," 2010, pp. 1-21, URL,http://tools.ietf.org/pdf/draft-ietf-fecframe-raptor-04.pdf.
Ramsey B, "HTTP Status: 206 Partial Content and Range Requests," May 5, 2008 obtained at http://benramsey.com/blog/2008/05/206-partial-content-and-range-request/.

\* cited by examiner

| 0 | 1 | 2 | ... | ... | ... | ... | $K$-1 |
|---|---|---|---|---|---|---|---|
| $K$ | $K$+1 | $K$+2 | ... | ... | ... | ... | $2 \cdot K$-1 |
| $2 \cdot K$ | $2 \cdot K$+1 | $2 \cdot K$+2 | ... | ... | ... | ... | $3 \cdot K$-1 |
| ... | ... | ... | ... | ... | ... | ... | |
| $(N$-1$) \cdot K$ | ... | ... | ... | ... | ... | ... | $N \cdot K$-1 |

Fig. 17

| File size $F$ | $G$ | Symbol size $T$ | $G^*T$ | $K_t$ | Source blocks $Z$ | Sub-blocks $N$ | $K_L$ | $K_S$ | $T_L \cdot A$ | $T_S \cdot A$ |
|---|---|---|---|---|---|---|---|---|---|---|
| 100 KB | 6 | 84 | 504 | 1,220 | 1 | 1 | 1,220 | 1,220 | N/A | N/A |
| 100 KB | 8 | 64 | 512 | 1,600 | 1 | 1 | 1,600 | 1,600 | N/A | N/A |
| 300 KB | 2 | 256 | 512 | 1,200 | 1 | 2 | 1,200 | 1,200 | 128 | 128 |
| 1,000 KB | 1 | 512 | 512 | 2,000 | 1 | 5 | 2,000 | 2,000 | 104 | 100 |
| 3,000 KB | 1 | 512 | 512 | 6,000 | 1 | 12 | 6,000 | 6,000 | 44 | 40 |
| 10,000 KB | 1 | 512 | 512 | 20,000 | 3 | 14 | 6,666 | 6,667 | 40 | 36 |

Fig. 18

| Max source block size $B$ | $G$ | Symbol size $T$ | $G \cdot T$ |
|---|---|---|---|
| 40 KB | 10 | 48 | 480 |
| 160 KB | 4 | 128 | 512 |
| 640 KB | 1 | 512 | 512 |

Fig. 19

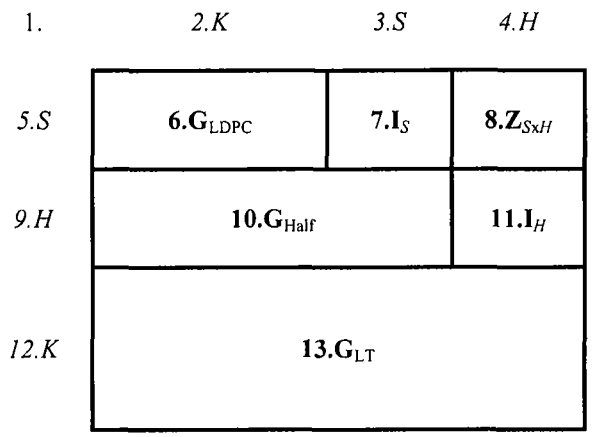
Fig. 20
| Index j | f[j] | d[j] |
|---|---|---|
| 0 | 0 | -- |
| 1 | 10241 | 1 |
| 2 | 491582 | 2 |
| 3 | 712794 | 3 |
| 4 | 831695 | 4 |
| 5 | 948446 | 10 |
| 6 | 1032189 | 11 |
| 7 | 1048576 | 40 |
Fig. 21
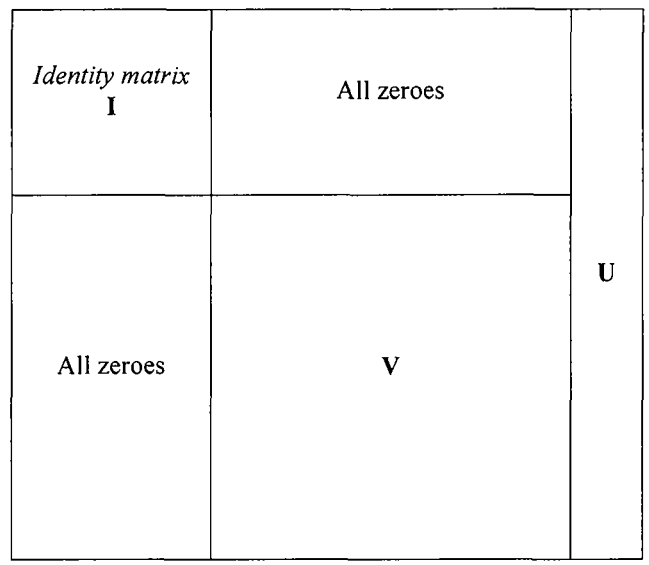
Fig. 22

FILE DOWNLOAD AND STREAMING SYSTEM

CROSS-REFERENCE TO RELATED APPLICATIONS

This application is a continuation of U.S. patent application Ser. No. 11/125,818, filed May 9, 2005 entitled "FILE DOWNLOAD AND STREAMING SYSTEM," which claims priority to U.S. Provisional Patent Application No. 60/569,127, filed May 7, 2004 entitled "FILE DOWNLOAD AND STREAMING SYSTEM," which is hereby incorporated by reference, as if set forth in full in this document, for all purposes.

REFERENCE TO A COMPUTER PROGRAM LISTING APPENDIX

A listing of tables, formatted as a computer program listing appendix is submitted on two duplicate compact discs ("CDs") and includes Appendices A, B.1 and B.2 as referred to herein. The computer program listing appendix is hereby incorporated by reference herein.

FIELD OF THE INVENTION

The present invention relates to encoding and decoding data in communications systems and more specifically to communication systems that encode and decode data to account for errors and gaps in communicated data. In embodiments, data is transmitted over broadcast and/or multicast wireless networks to receivers.

BACKGROUND OF THE INVENTION

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

Data transmission is straightforward when a transmitter and a receiver have all of the computing power and electrical power needed for communications and the channel between the transmitter and receiver is clean enough to allow for relatively error-free communications. The problem of data transmission becomes more difficult when the channel is in an adverse environment or the transmitter and/or receiver has limited capability.

One solution is the use of forward error correcting (FEC) techniques, wherein data is coded at the transmitter such that a receiver can recover from transmission erasures and errors. Where feasible, a reverse channel from the receiver to the transmitter allows for the receiver to communicate about errors to the transmitter, which can then adjust its transmission process accordingly. Often, however, a reverse channel is not available or feasible. For example, where the transmitter is transmitting to a large number of receivers, the transmitter might not be able to handle reverse channels from all those receivers. As a result, communication protocols often need to be designed without a reverse channel and, as such, the transmitter may have to deal with widely varying channel conditions without a full view of those channel conditions.

The problem of data transmission between transmitters and receivers is made more difficult when the receivers need to be low-power, small devices that might be portable or mobile and need to receive data at high bandwidths. For example, a wireless network might be set up to deliver files or streams from a stationary transmitter to a large or indeterminate number of portable or mobile receivers either as a broadcast or multicast where the receivers are constrained in their computing power, memory size, available electrical power, antenna size, device size and other design constraints.

In such a system, considerations to be addressed include having little or no reverse channel, limited memory, limited computing cycles, mobility and timing. Preferably, the design should minimize the amount of transmission time needed to deliver data to potentially a large population of receivers, where individual receivers and might be turned on and off at unpredictable times, move in and out of range, incur losses due to link errors, cell changes, congestion in cells forcing lower priority file or stream packets to be temporarily dropped, etc.

In the case of a packet protocol used for data transport, a file, stream or other block of data to be transmitted over a packet network is partitioned into equal size input symbols and input symbols are placed into consecutive packets. The "size" of an input symbol can be measured in bits, whether or not the input symbol is actually broken into a bit stream, where an input symbol has a size of M bits when the input symbol is selected from an alphabet of $2^M$ symbols. In such a packet-based communication system, a packet oriented coding scheme might be suitable. A file transmission is called reliable if it allows the intended recipient to recover an exact copy of the original file even in the face of erasures in the network. A stream transmission is called reliable if it allows the intended recipient to recover an exact copy of each part of the stream in a timely manner even in the face of erasures in the network. Both file transmission and stream transmission can also be somewhat reliable, in the sense that some parts of the file or stream are not recoverable or for streaming if some parts of the stream are not recoverable in a timely fashion. Packet loss often occurs because sporadic congestion causes the buffering mechanism in a router to reach its capacity, forcing it to drop incoming packets. Protection against erasures during transport has been the subject of much study.

It is known to use chain reaction codes to allow for generation of an arbitrary number of output symbols from the input symbols of a file or stream. This has many uses, including the generation of output symbols in an information additive way, as opposed to an information duplicative way, wherein the latter is where a receiver receives additional data that duplicates data the receiver already knows. Novel techniques for generating, using and operating chain reaction codes are shown, for example, in U.S. Pat. No. 6,307,487 entitled "Information Additive Code Generator and Decoder for Communication Systems" issued to Luby ("Luby I"), U.S. Pat. No. 6,320,520 issued to Luby et al. entitled "Information Additive Group Code Generator and Decoder for Communication Systems" (hereinafter "Luby II"), and U.S. Published Patent Application No. 2003/0058958 published Mar. 27, 2003 and entitled "Multi-Stage Code Generator and Decoder for Communication Systems" to Shokrollahi et al. (hereinafter "Shokrollahi"). To the extent permitted, the entire disclosures of those are herein incorporated herein by reference for all purposes.

One property of the output symbols produced by a chain reaction encoder is that a receiver is able to recover the original file or block of the original stream as soon as enough output symbols have been received. Specifically, to recover the original K input symbols with a high probability, the receiver needs approximately K+A output symbols. The ratio A/K is called the "relative reception overhead." The relative reception overhead depends on the number K of input symbols, and on the reliability of the decoder. For example, in one specific embodiment, and where K is equal to 60,000, a relative reception overhead of 5% ensures that the decoder successfully decodes the input file or block of the stream with a probability of at least $1-10^{-8}$, and where K is equal to 10,000, a relative reception overhead of 15% ensures the same success probability of the decoder. In one embodiment, the relative reception overhead of chain reaction codes can be computed as $(13*sqrt(K)+200)/K$, where $sqrt(K)$ is the square root of the number of input symbols K. In this embodiment the relative reception overhead of chain reaction codes tends to be larger for small values of K.

Luby I, Luby II and Shokrollahi provide teachings of systems and methods that can be employed in certain embodiments according to the present invention. It is to be understood, however, that these systems and methods are not required of the present invention, and many other variations, modifications, or alternatives can also be used.

It is also known to use multi-stage chain reaction ("MSCR") codes, such as those described in Shokrollahi and developed by Digital Fountain, Inc. under the trade name "Raptor" codes. Multi-stage chain reaction codes are used, for example, in an encoder that receives input symbols from a source file or source stream, generates intermediate symbols therefrom and encodes the intermediate symbols using chain reaction codes. More particularly, a plurality of redundant symbols are generated from an ordered set of input symbols to be transmitted. A plurality of output symbols are generated from a combined set of symbols including the input symbols and the redundant symbols, wherein the number of possible output symbols is much larger than the number of symbols in the combined set of symbols, wherein at least one output symbol is generated from more than one symbol in the combined set of symbols and from less than all of the symbols in the combined set of symbols, and such that the ordered set of input symbols can be regenerated to a desired degree of accuracy from any predetermined number, N, of the output symbols.

For some applications, other variations of codes might be more suitable or otherwise preferred.

BRIEF SUMMARY OF THE INVENTION

According to one embodiment of the invention, a method of encoding data for transmission from a source to a destination over a communications channel is provided. The method operates on an ordered set of input symbols and includes generating a plurality of redundant symbols from the input symbols. The method also includes generating a plurality of output symbols from a combined set of symbols including the input symbols and the redundant symbols, wherein the number of possible output symbols is much larger than the number of symbols in the combined set of symbols, wherein at least one output symbol is generated from more than one symbol in the combined set of symbols and from less than all of the symbols in the combined set of symbols, and such that the ordered set of input symbols can be regenerated to a desired degree of accuracy from any predetermined number of the output symbols. The plurality of redundant symbols is generated from an ordered set of input symbols to be transmitted in a deterministic process such that a first set of static symbols calculated using a first input symbol has a low common membership with a second set of static symbols calculated using a second input symbol distinct from the first input symbol.

According to still another embodiment of the invention, a system for receiving data transmitted from a source over a communications channel is provided using similar techniques. The system comprises a receive module coupled to a communications channel for receiving output symbols transmitted over the communications channel, wherein each output symbol is generated from at least one symbol in a combined set of input symbols and redundant symbols, wherein at least one output symbol is generated from more than one symbol in the combined set and less than all of the symbols in the combined set, wherein the number of possible output symbols is much larger than the number of symbols in the combined set, wherein the input symbols are from an ordered set of input symbols, wherein the redundant symbols are generated from the input symbols and wherein the plurality of redundant symbols is generated from an ordered set of input symbols to be transmitted in a deterministic process such that a first set of static symbols calculated using a first input symbol has a low common membership with a second set of static symbols calculated using a second input symbol distinct from the first input symbol.

According to yet another embodiment of the invention, a computer data signal embodied in a carrier wave is provided.

Numerous benefits are achieved by way of the present invention. For example, in a specific embodiment, the computational expense of encoding data for transmission over a channel is reduced. In another specific embodiment, the computational expense of decoding such data is reduced. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

BRIEF DESCRIPTION OF THE DRAWINGS

FIG. 17 illustrates source symbol from sub-symbol mappings.

FIG. 18 illustrates possible settings of file download parameters for various file sizes.

FIG. 19 illustrates possible settings of streaming parameters for various source block sizes.

FIG. 20 illustrates a form of a matrix that represents a relationship between source and intermediate symbols.

FIG. 21 illustrates a degree distribution for the degree generator.

FIG. 22 illustrates a form of the matrix A that can be used for decoding.

Figure 1:
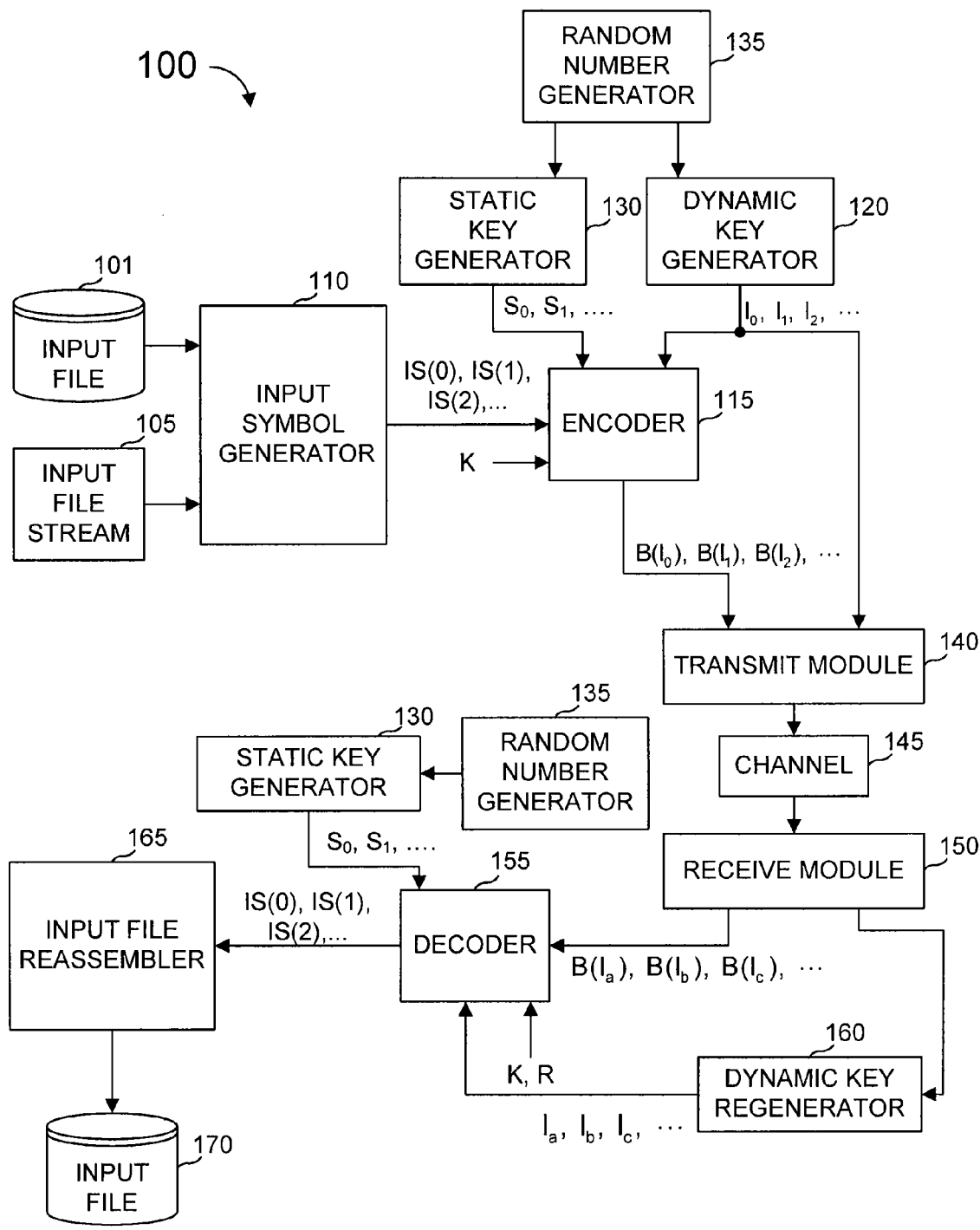
FIG. 1 is a block diagram of a communications system according to one embodiment of the present invention.

A listing of tables, formatted as a computer program listing appendix is submitted on two duplicate compact discs ("CDs") and includes Appendices A, B.1 and B.2 as described in this paragraph and are hereby incorporated by reference herein. Appendix A provides an example of a table of Systematic Indices J(K). For each value of K, the systematic index J(K) is designed to have the property that the set of source symbol triples $(d[0], a[0], b[0]), \ldots, (d[L-1], a[L-1], b[L-1])$ are such that the L intermediate symbols are uniquely defined, i.e., the matrix A in Section B.5.2.4.2 has full rank and is therefore invertible. Appendix A provides the list of the systematic indices for values of K between 4 and 8192 inclusive. The order of the values begins with the index for K=4 and ends with index for K=8192. Appendix B.1 provides an example of table $V_0$. These values represent an example set of values for Table $V_0$ described in Section B.5.4.1. Each entry is a 32-bit integer in decimal representation. The order of the values is from the first line to the last line. Appendix B.2 provides an example of table $V_1$. These values represent an example set of values for Table $V_1$ described in Section B.5.4.1. Each entry is a 32-bit integer in decimal representation. The order of the values is from the first line to the last line.

DETAILED DESCRIPTION OF SPECIFIC EMBODIMENTS

In the specific embodiments described herein, a coding scheme denoted as "multi-stage coding" is described, embodiments of which are provided in Shokrollahi.

Multi-stage encoding, as described herein, encodes the data in a plurality of stages. Typically, but not always, a first stage adds a predetermined amount of redundancy to the data. A second stage then uses a chain reaction code, or the like, to produce output symbols from the original data and the redundant symbols computed by the first stage of the encoding. In one specific embodiment of the present invention, the received data is first decoded using a chain reaction decoding process. If that process is not successful in recovering the original data completely, a second decoding step can be applied.

In embodiments of multi-stage encoding, redundant symbols are generated from the input file or block of the stream during the first stage of encoding. In these embodiments, in the second stage of encoding, output symbols are generated from the combination of the input file or block of the stream and the redundant symbols. In some of these embodiments, the output symbols can be generated as needed. In embodiments in which the second stage comprises chain reaction encoding, each output symbol can be generated without regard to how other output symbols are generated. Once generated, these output symbols can then be placed into packets and transmitted to their destination, with each packet containing one or more output symbols. Non-packetized transmission techniques can be used instead or as well.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

As used herein, the term "stream" refers to any data that is stored or generated at one or more sources and is delivered at a specified rate at each point in time in the order it is generated to one or more destinations. Streams can be fixed rate or variable rate. Thus, an MPEG video stream, AMR audio stream, and a data stream used to control a remote device, are all examples of "streams" that can be delivered. The rate of the stream at each point in time can be known (such as 4 megabits per second) or unknown (such as a variable rate stream where the rate at each point in time is not known in advance). Either way, the stream is a sequence of input symbols, where each input symbol has a position in the stream and a value.

Transmission is the process of transmitting data from one or more senders to one or more recipients through a channel in order to deliver a file or stream. A sender is also sometimes referred to as the encoder. If one sender is connected to any number of recipients by a perfect channel, the received data can be an exact copy of the input file or stream, as all the data will be received correctly. Here, we assume that the channel is not perfect, which is the case for most real-world channels. Of the many channel imperfections, two imperfections of interest are data erasure and data incompleteness (which can be treated as a special case of data erasure). Data erasure occurs when the channel loses or drops data. Data incompleteness occurs when a recipient does not start receiving data until some of the data has already passed it by, the recipient stops receiving data before transmission ends, the recipient chooses to only receive a portion of the transmitted data, and/or the recipient intermittently stops and starts again receiving data. As an example of data incompleteness, a moving satellite sender might be transmitting data representing an input file or stream and start the transmission before a recipient is in range. Once the recipient is in range, data can be received until the satellite moves out of range, at which point the recipient can redirect its satellite dish (during which time it is not receiving data) to start receiving the data about the same input file or stream being transmitted by another satellite that has moved into range. As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in communication systems design, detectable errors can be considered equivalent to erasures by simply dropping all data blocks or symbols that have detectable errors.

In some communication systems, a recipient receives data generated by multiple senders, or by one sender using multiple connections. For example, to speed up a download, a recipient might simultaneously connect to more than one sender to transmit data concerning the same file. As another example, in a multicast transmission, multiple multicast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is not redundant among the streams, even when the transmission rates are vastly different for the different streams, and when there are arbitrary patterns of loss.

In general, a communication channel is that which connects the sender and the recipient for data transmission. The communication channel could be a real-time channel, where the channel moves data from the sender to the recipient as the channel gets the data, or the communication channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the communication channel.

When the sender and recipient are separated by a communication channel in which symbols can be erased, it is preferable not to transmit an exact copy of an input file or stream, but instead to transmit data generated from the input file or stream (which could include all or parts of the input file or stream itself) that assists with recovery of erasures. An encoder is a circuit, device, module or code segment that handles that task. One way of viewing the operation of the encoder is that the encoder generates output symbols from input symbols, where a sequence of input symbol values represent the input file or a block of the stream. Each input symbol would thus have a position, in the input file or block of the stream, and a value. A decoder is a circuit, device, module or code segment that reconstructs the input symbols from the output symbols received by the recipient. In multi-stage coding, the encoder and the decoder are further divided into sub-modules each performing a different task.

In embodiments of multi-stage coding systems, the encoder and the decoder can be further divided into sub-modules, each performing a different task. For instance, in some embodiments, the encoder comprises what is referred to herein as a static encoder and a dynamic encoder. As used herein, a "static encoder" is an encoder that generates a number of redundant symbols from a set of input symbols, wherein the number of redundant symbols is determined prior to encoding. Examples of static encoding codes include Reed-Solomon codes, Tornado codes, Hamming codes, Low Density Parity Check (LDPC) codes, etc. The term "static decoder" is used herein to refer to a decoder that can decode data that was encoded by a static encoder.

As used herein, a "dynamic encoder" is an encoder that generates output symbols from a set of input symbols, where the number of possible output symbols is orders of magnitude larger than the number of input symbols, and where the number of output symbols to be generated need not be fixed. One example of a dynamic encoder is a chain reaction encoder, such as the encoders described in Luby I and Luby II. The term "dynamic decoder" is used herein to refer to a decoder that can decode data that was encoded by a dynamic encoder.

Embodiments of multi-stage coding need not be limited to any particular type of input symbol. Typically, the values for the input symbols are selected from an alphabet of $2^M$ symbols for some positive integer M. In such cases, an input symbol can be represented by a sequence of M bits of data from the input file or stream. The value of M is often determined based on, for example, the uses of the application, the communication channel, and/or the size of the output symbols. Additionally, the size of an output symbol is often determined based on the application, the channel, and/or the size of the input symbols. In some cases, the coding process might be simplified if the output symbol values and the input symbol values were the same size (i.e., representable by the same number of bits or selected from the same alphabet). If that is the case, then the input symbol value size is limited when the output symbol value size is limited. For example, it may be desired to put output symbols in packets of limited size. If some data about a key associated with the output symbols were to be transmitted in order to recover the key at the receiver, the output symbol would preferably be small enough to accommodate, in one packet, the output symbol value and the data about the key.

As an example, if an input file is a multiple megabyte file, the input file might be broken into thousands, tens of thousands, or hundreds of thousands of input symbols with each input symbol encoding thousands, hundreds, or only few bytes. As another example, for a packet-based Internet channel, a packet with a payload of size of 1024 bytes might be appropriate (a byte is 8 bits). In this example, assuming each packet contains one output symbol and 8 bytes of auxiliary information, an output symbol size of 8128 bits ((1024−8)*8) would be appropriate. Thus, the input symbol size could be chosen as M=(1024−8)*8, or 8128 bits. As another example, some satellite systems use the MPEG packet standard, where the payload of each packet comprises 188 bytes. In that example, assuming each packet contains one output symbol and 4 bytes of auxiliary information, an output symbol size of 1472 bits ((188−4)*8), would be appropriate. Thus, the input symbol size could be chosen as M=(188−4)*8, or 1472 bits. In a general-purpose communication system using multi-stage coding, the application-specific parameters, such as the input symbol size (i.e., M, the number of bits encoded by an input symbol), might be variables set by the application.

As another example, for a stream that is sent using variable size source packets, the symbol size might be chosen to be rather small so that each source packet can be covered with an integral number of input symbols that have aggregate size at most slightly larger than the source packet.

Each output symbol has a value. In one preferred embodiment, which we consider below, each output symbol also has associated therewith an identifier called its "key." Preferably, the key of each output symbol can be easily determined by the recipient to allow the recipient to distinguish one output symbol from other output symbols. Preferably, the key of an output symbol is distinct from the keys of all other output symbols. There are various forms of keying discussed in previous art. For example, Luby I describes various forms of keying that can be employed in embodiments of the present invention.

Multi-stage coding is particularly useful where there is an expectation of data erasure or where the recipient does not begin and end reception exactly when a transmission begins and ends. The latter condition is referred to herein as "data incompleteness." Regarding erasure events, multi-stage coding shares many of the benefits of chain reaction coding described in Luby I. In particular, multi-stage output symbols are information additive, so any suitable number of packets can be used to recover an input file or stream to a desired degree of accuracy. These conditions do not adversely affect the communication process when multi-stage coding is used, because the output symbols generated with multi-stage coding are information additive. For example, if a hundred packets are lost due to a burst of noise causing data erasure, an extra hundred packets can be picked up after the burst to replace the loss of the erased packets. If thousands of packets are lost because a receiver did not tune into a transmitter when it began transmitting, the receiver could just pickup those thousands of packets from any other period of transmission, or even from another transmitter. With multi-stage coding, a receiver is not constrained to pickup any particular set of packets, so it can receive some packets from one transmitter, switch to another transmitter, lose some packets, miss the beginning or end of a given transmission and still recover an input file or block of a stream. The ability to join and leave a transmission without receiver-transmitter coordination helps to simplify the communication process.

In some embodiments, transmitting a file or stream using multi-stage coding can include generating, forming or extracting input symbols from an input file or block of a stream, computing redundant symbols, encoding input and redundant symbols into one or more output symbols, where each output symbol is generated based on its key independently of all other output symbols, and transmitting the output symbols to one or more recipients over a channel. Additionally, in some embodiments, receiving (and reconstructing) a copy of the input file or block of a stream using multi-stage coding can include receiving some set or subset of output symbols from one of more data streams, and decoding the input symbols from the values and keys of the received output symbols.

Suitable FEC erasure codes as described herein can be used to overcome the above-cited difficulties and would find use in a number of fields including multimedia broadcasting and multicasting systems and services. An FEC erasure code hereafter referred to as "a multi-stage chain reaction code" has properties that meet many of the current and future requirements of such systems and services.

Some basic properties of multi-stage chain reaction codes are that, for any packet loss conditions and for delivery of source files of any relevant size or streams of any relevant rate: (a) reception overhead of each individual receiver device ("RD") is minimized; (b) the total transmission time needed to deliver source files to any number of RDs can be minimized (c) the quality of the delivered stream to any number of RDs can be maximized for the number of output symbols sent relative to the number of input symbols, with suitable selection of transmission schedules. The RDs might be handheld devices, embedded into a vehicle, portable (i.e., movable but not typically in motion when in use) or fixed to a location.

The amount of working memory needed for decoding is low and can still provide the above properties, and the amount of computation needed to encode and decode is minimal. In this document, we provide a simple and easy to implement description of some variations of multi-stage chain reaction codes.

Multi-stage chain reaction codes are fountain codes, i.e., as many encoding packets as needed can be generated on-the-fly, each containing unique encoding symbols that are equally useful for recovering a source file or block of a stream. There are many advantages to using fountain codes versus other types of FEC codes. One advantage is that, regardless of packet loss conditions and RD availability, fountain codes minimize the number of encoding packets each RD needs to receive to reconstruct a source file or block of a stream. This is true even under harsh packet loss conditions and when, for example, mobile RDs are only intermittently turned-on or available over a long file download session.

Another advantage is the ability to generate exactly as many encoding packets as needed, making the decision on how many encoding packets to generate on-the-fly while the transmission is in progress. This can be useful if for example there is feedback from RDs indicating whether or not they received enough encoding packets to recover a source file or block of a stream. When packet loss conditions are less severe than expected the transmission can be terminated early. When packet loss conditions are more severe than expected or RDs are unavailable more often than expected the transmission can be seamlessly extended.

Another advantage is the ability to inverse multiplex. Inverse multiplexing is when a RD is able to combine received encoding packets generated at independent senders to reconstruct a source file or block of a stream. One practical use of inverse multiplexing is described in below in reference to receiving encoding packets from different senders.

Where future packet loss, RD availability and application conditions are hard to predict, it is important to choose an FEC solution that is as flexible as possible to work well under unpredictable conditions multi-stage chain reaction codes provide a degree of flexibility unmatched by other types of FEC codes.

Aspects of the invention will now be described with reference to the figures.

System Overview

FIG. 1 is a block diagram of a communications system 100 that uses multi-stage coding. In communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 1 as a parenthesized integer). As explained above, the possible values for input symbols, i.e., its alphabet, is typically an alphabet of $2^M$ symbols, so that each input symbol codes for M bits of the input file or stream. The value of M is generally determined by the use of communication system 100, but a general purpose system might include a symbol size input for input symbol generator 110 so that M can be varied from use to use. The output of input symbol generator 110 is provided to an encoder 115.

Static key generator 130 produces a stream of static keys $S_0, S_1, \ldots$ . The number of the static keys generated is generally limited and depends on the specific embodiment of encoder 115. The generation of static keys will be subsequently described in more detail. Dynamic key generator 120 generates a dynamic key for each output symbol to be generated by the encoder 115. Each dynamic key is generated so that a large fraction of the dynamic keys for the same input file or block of a stream are unique. For example, Luby I describes embodiments of key generators that can be used. The outputs of dynamic key generator 120 and the static key generator 130 are provided to encoder 115.

From each key I provided by dynamic key generator 120, encoder 115 generates an output symbol, with a value B(I), from the input symbols provided by the input symbol generator. The operation of encoder 115 will be described in more detail below. The value of each output symbol is generated based on its key, on some function of one or more of the input symbols, and possibly on or more redundant symbols that had been computed from the input symbols. The collection of input symbols and redundant symbols that give rise to a specific output symbol is referred to herein as the output symbol's "associated symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder 115 to select the associates. If K is not known in advance, such as where the input is a streaming file, K can be just an estimate. The value K might also be used by encoder 115 to allocate storage for input symbols and any intermediate symbols generated by encoder 115.

Encoder 115 provides output symbols to a transmit module 140. Transmit module 140 is also provided the key of each such output symbol from the dynamic key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a dynamic key regenerator 160. Dynamic key regenerator 160 regenerates the dynamic keys for the received output symbols and provides these dynamic keys to decoder 155. Static key generator 163 regenerates the static keys $S_0, S_1, \ldots$ and provides them to decoder 155. The static key generator has access to random number generator 135 used both during the encoding and the decoding process. This can be in the form of access to the same physical device if the random numbers are generated on such device, or in the form of access to the same algorithm for the generation of random numbers to achieve identical behavior. Decoder 155 uses the keys provided by dynamic key regenerator 160 and static key generator 163 together with the corresponding output symbols, to recover the input symbols (again IS(0), IS(1), IS(2), . . . ). Decoder 155 provides the recovered input symbols to an input file reassembler 165, which generates a copy 170 of input file 101 or input stream 105.

An Encoder

Figure 2:
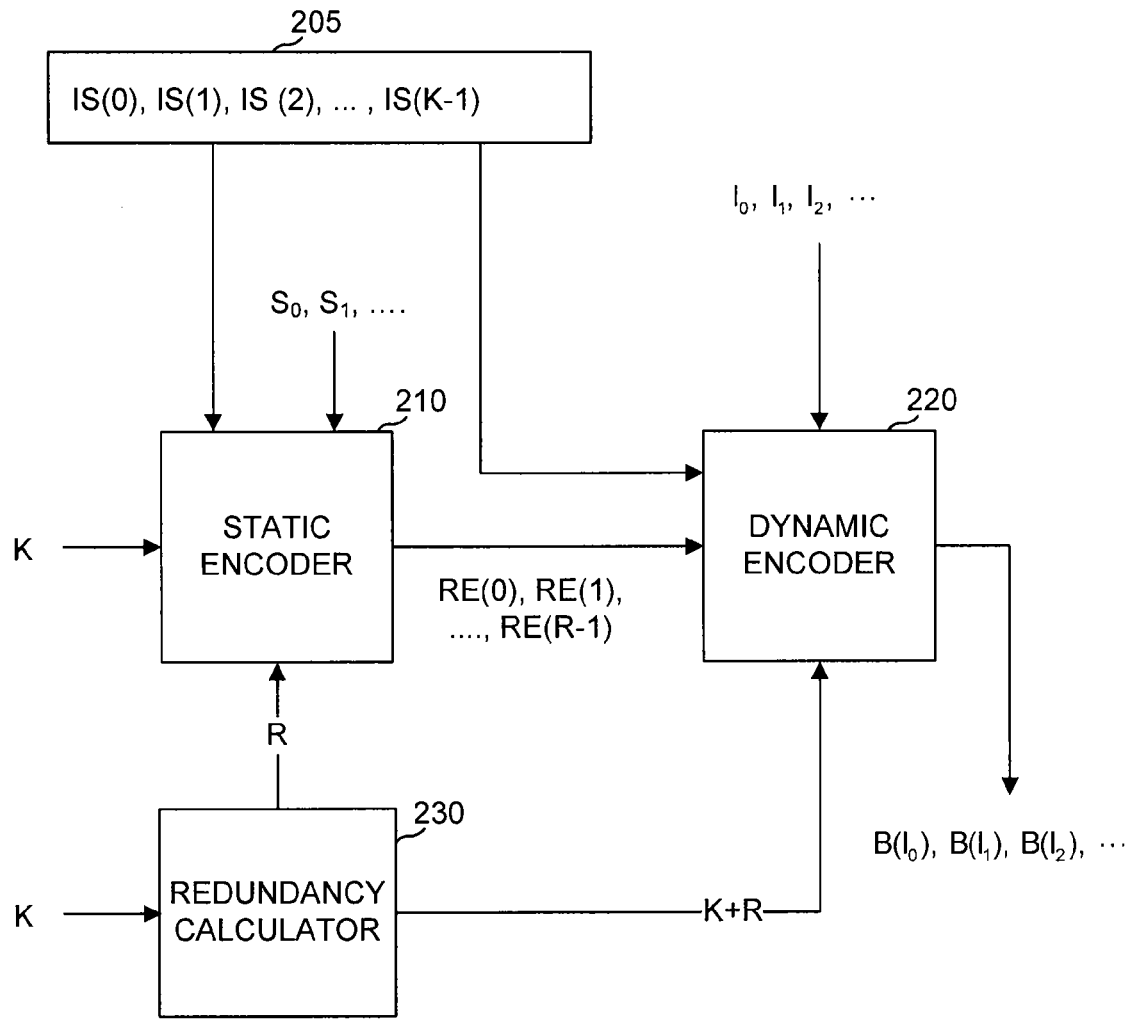
FIG. 2 is a block diagram an encoder according to one embodiment of the present invention.

FIG. 2 is a block diagram of one specific embodiment of encoder 115 shown in FIG. 1. Encoder 115 comprises a static encoder 210, a dynamic encoder 220, and a redundancy calculator 230. Static encoder 210 receives the following inputs: a) original input symbols IS(0), IS(1), . . . , IS(K−1) provided by the input symbol generator 110 and stored in an input symbol buffer 205; b) the number K of original input symbols; c) static keys $S_0, S_1, \ldots$ provided by the static key generator 130; and d) a number R of redundant symbols. Upon receiving these inputs static encoder 205 computes R redundant symbols RE(0), RE(1), . . . , RE(R−1) as will be described below. Typically, but not always, the redundant symbols have the same size as the input symbols. In one specific embodiment, the redundant symbols generated by static encoder 210 are stored in input symbol buffer 205. Input symbol buffer 205 may be only logical, i.e., the file or block of the stream may be physically stored in one place and the positions of the input symbols within symbol buffer 205 could only be renamings of the positions of these symbols within the original file or block of the stream.

Dynamic encoder receives the input symbols and the redundant symbols, and generates output symbols as will be described in further detail below. In one embodiment in which the redundant symbols are stored in the input symbol buffer 205, dynamic encoder 220 receives the input symbols and redundant symbols from input symbol buffer 205.

Redundancy calculator 230 computes the number R of redundant symbols from the number K of input symbols. This computation is described in further detail below.

Overview of Static Encoder

Figure 3:
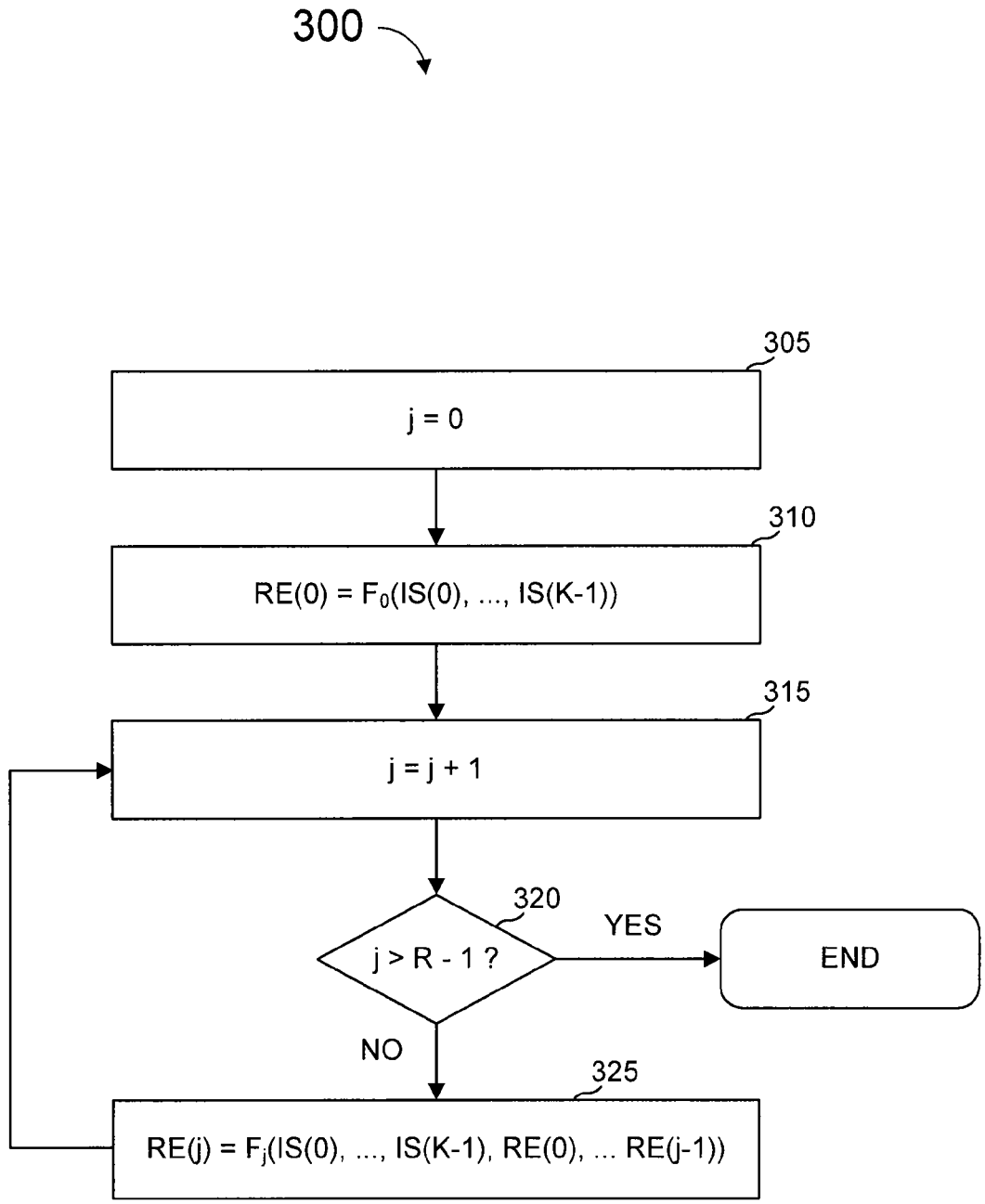
FIG. 3 is a simplified block diagram of a method of generating redundant symbols according to one embodiment of the present invention.
Figure 4:
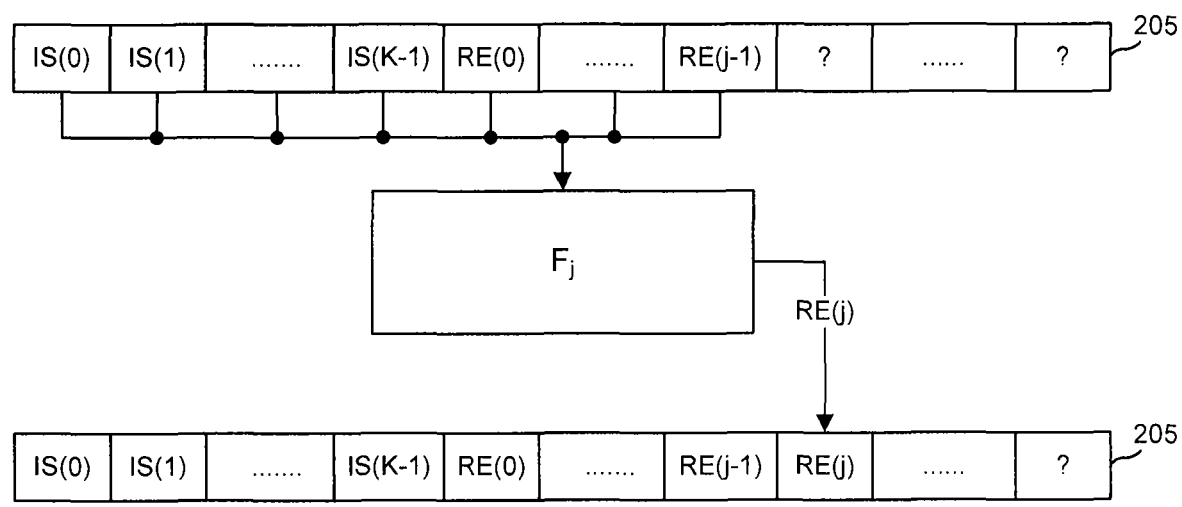
FIG. 4 is a simplified block diagram of the basic operation of a static encoder according to one embodiment of the present invention.

The general operation of static encoder 210 is shown with reference to FIGS. 3 and 4. FIG. 3 is a simplified flow diagram illustrating one embodiment of a method of statically encoding. In a step 305, a variable j, which keeps track of how many redundant symbols have been generated, is set to zero. Then, in a step 310, a first redundant symbol RE(0) is computed as a function $F_0$ of at least some of the input symbols IS(0), . . . , IS(K−1). Then, in a step 315, the variable j is incremented. Next, in a step 320, it is tested whether all of the redundant symbols have been generated (i.e., is j greater than R−1?). If yes, then the flow ends. Otherwise, the flow proceeds to step 325. In step 325, RE(j) is computed as a function $F_j$ of the input symbols IS(0), . . . , IS(K−1) and of the previously generated redundant symbols RE(0), . . . , RE(j−1), where $F_j$ need not be a function that depends on every one of the input symbols or every one of the redundant symbols. Steps 315, 320, and 325 are repeated until R redundant symbols have been computed.

Referring again to FIGS. 1 and 2, in some embodiments, static encoder 210 receives one or more static keys $S_0$, $S_1$, . . . from static key generator 130. In these embodiments, the static encoder 210 uses the static keys to determine some or all of functions $F_0, F_1, \ldots F_{j-1}$. For example, static key $S_0$ can be used to determine function $F_0$, static key $S_1$ can be used to determine function $F_1$, etc. Or, one or more of static keys $S_0, S_1, \ldots$ can be used to determine function $F_0$, one or more of static keys $S_0, S_1, \ldots$ can be used to determine function $F_1$, etc. In other embodiments, no static keys are needed, and thus static key generator 130 is not needed.

Referring now to FIGS. 2 and 3, in some embodiments, the redundant symbols generated by static encoder 210 can be stored in input symbol buffer 205. FIG. 4 is a simplified illustration of the operation of one embodiment of static encoder 210. Particularly, static encoder 210 generates redundant symbol RE(j) as a function Fj of input symbols IS(0), . . . , IS(K−1), RE(0), . . . , RE(j−1), received from input symbol buffer 205, and stores it back into input symbol buffer 205. The exact form of the functions $F_0, F_1, \ldots, F_{R-1}$ depends on the particular application. Typically, but not always, functions $F_0, F_1, \ldots, F_{R-1}$ include an exclusive OR of some or all of their corresponding arguments. As described above, these functions may or may not actually employ static keys generated by static key generator 130 of FIG. 1. For example, in one specific embodiment described below, the first few functions implement a Hamming code and do not make any use of the static keys $S_0, S_1, \ldots$, whereas the remaining functions implement a Low-Density Parity-Check code and make explicit use of the static keys.

Overview of Multi-Stage Encoder

Figure 5:
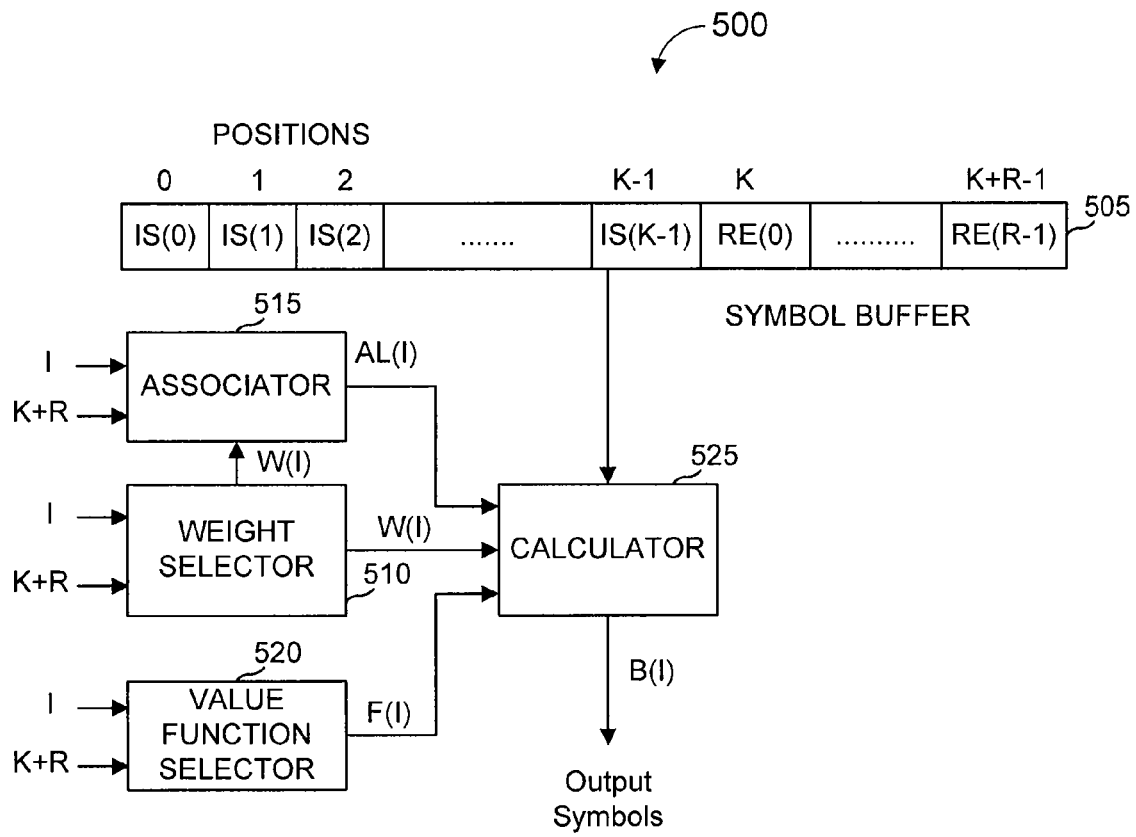
FIG. 5 is a simplified block diagram of a dynamic encoder according to one embodiment of the present invention.
Figure 6:
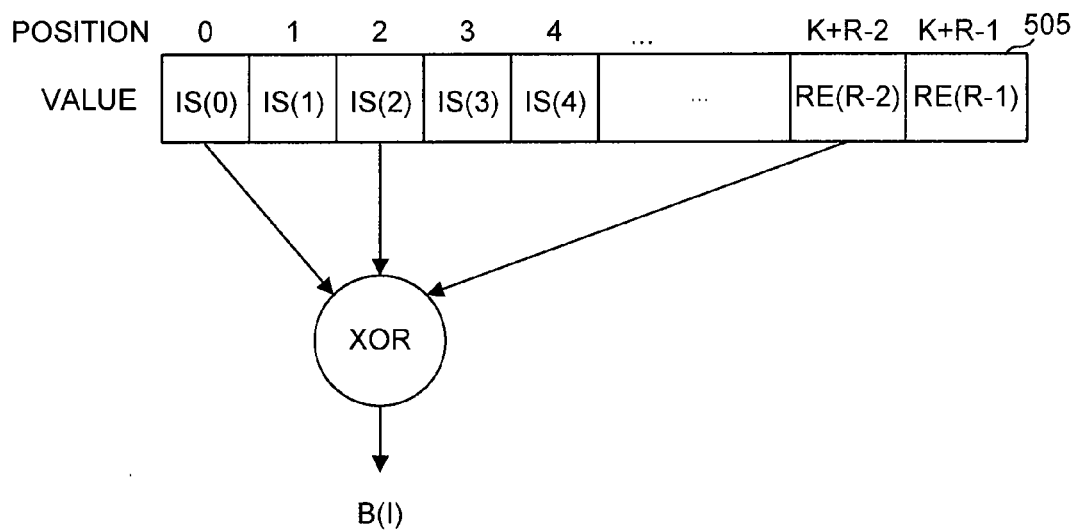
FIG. 6 is a simplified block diagram of a basic operation of a dynamic encoder according to one embodiment of the present invention.

Referring again to FIG. 2, dynamic encoder 220 receives input symbols IS(0), . . . , IS(K−1) and the redundant symbols RE(0), . . . , RE(R−1) and a key I for each output symbol it is to generate. The collection comprising the original input symbols and the redundant symbols will be referred to as the collection of "dynamic input symbols" hereafter. FIG. 5 is a simplified block diagram of one embodiment of a dynamic encoder, including a weight selector 510, an associator 515, a value function selector 520 and a calculator 525. As shown in FIG. 5, the K+R dynamic input symbols are stored in a dynamic symbol buffer 505. In effect, dynamic encoder 500 performs the action illustrated in FIG. 6, namely, to generate an output symbol value B(I) as some value function of selected input symbols.

Figure 7:
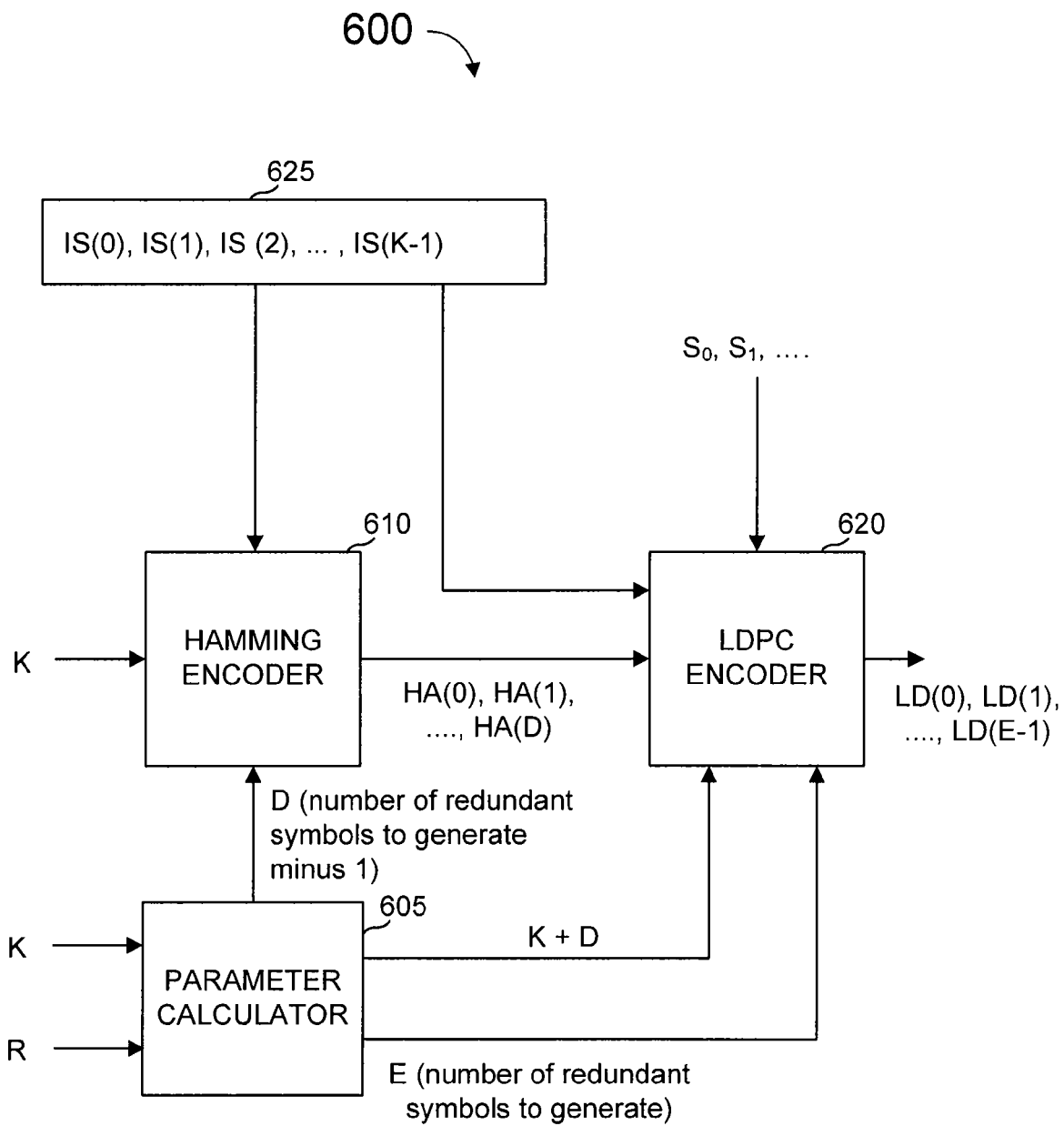
FIG. 7 is a simplified block diagram of a static encoder according to one embodiment of the present invention.

FIG. 7 is a simplified block diagram of one specific embodiment of a static encoder according to the present invention. Static encoder 600 comprises a parameter calculator 605, a Hamming encoder 610, and a low-density-parity-check (LDPC) encoder 620. Hamming encoder 610 is coupled to receive the input symbols IS(0), . . . , IS(K−1) from an input symbol buffer 625, the number K of input symbols, and the parameter D. In response, Hamming encoder 610 generates D+1 redundant symbols HA(0), HA(1), . . . , HA(D) according to a Hamming code.

Figure 8:
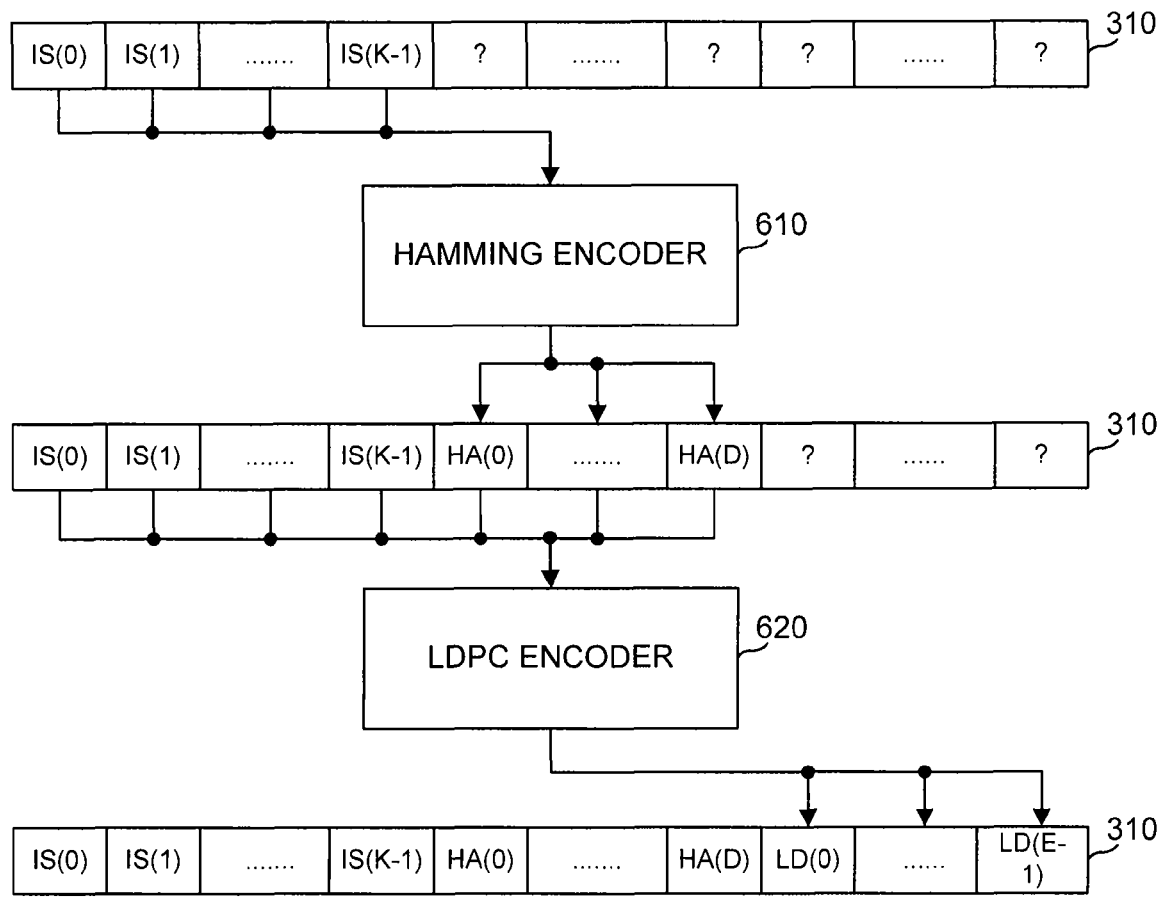
FIG. 8 is a simplified block diagram of the basic operation a static encoder according to one embodiment of the present invention.

FIG. 8 illustrates the operation of one embodiment of the present invention that employs the static encoder shown in FIG. 7.

Figure 9:
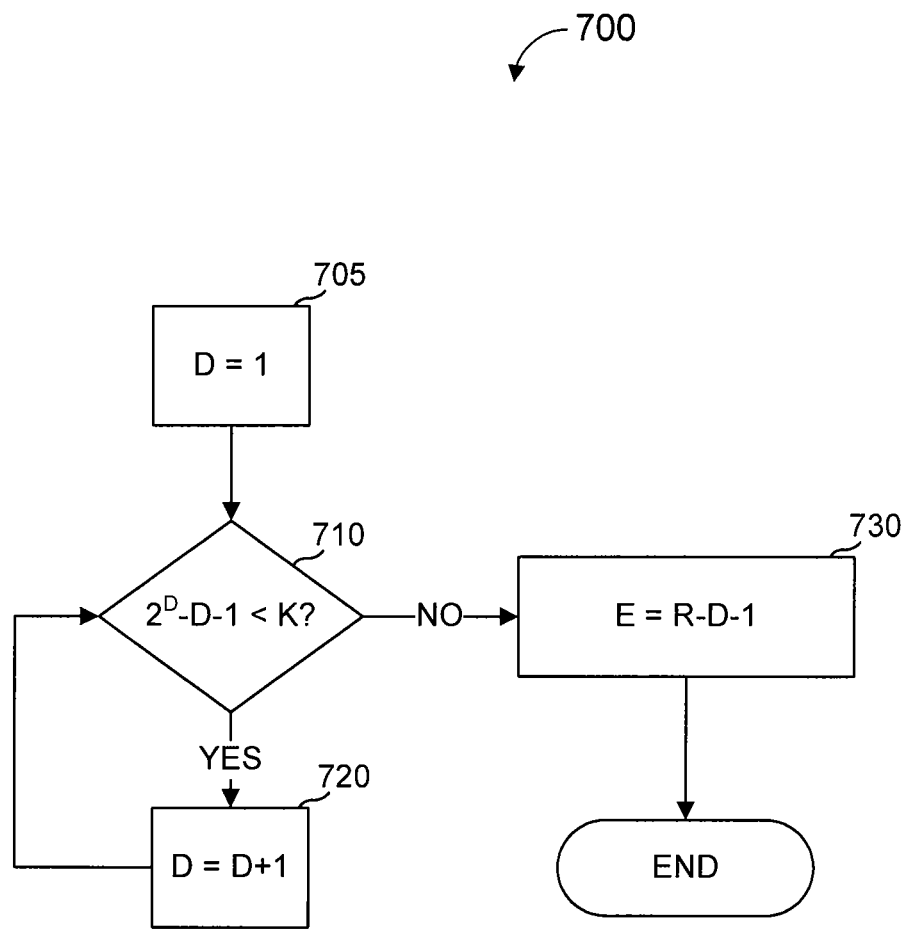
FIG. 9 is a simplified diagram of a method for calculating encoding parameters according to one specific embodiment of a static encoder.

FIG. 9 is a simplified flow diagram illustrating one embodiment of a parameter calculator, such as parameter calculator 605 of FIG. 7, that calculates parameter D and E as described above. First, in a step 705, parameter D is initialized to one. Then, in step 710, it is determined whether $2^D - D - 1$ is less than K. If no, then the flow proceeds to step 730. If yes, the flow proceeds to step 720, where the parameter D is incremented. Then, the flow proceeds back to step 710. Once D has been determined, then, in step 730, the parameter E is calculated as R−D−1.

Figure 10:
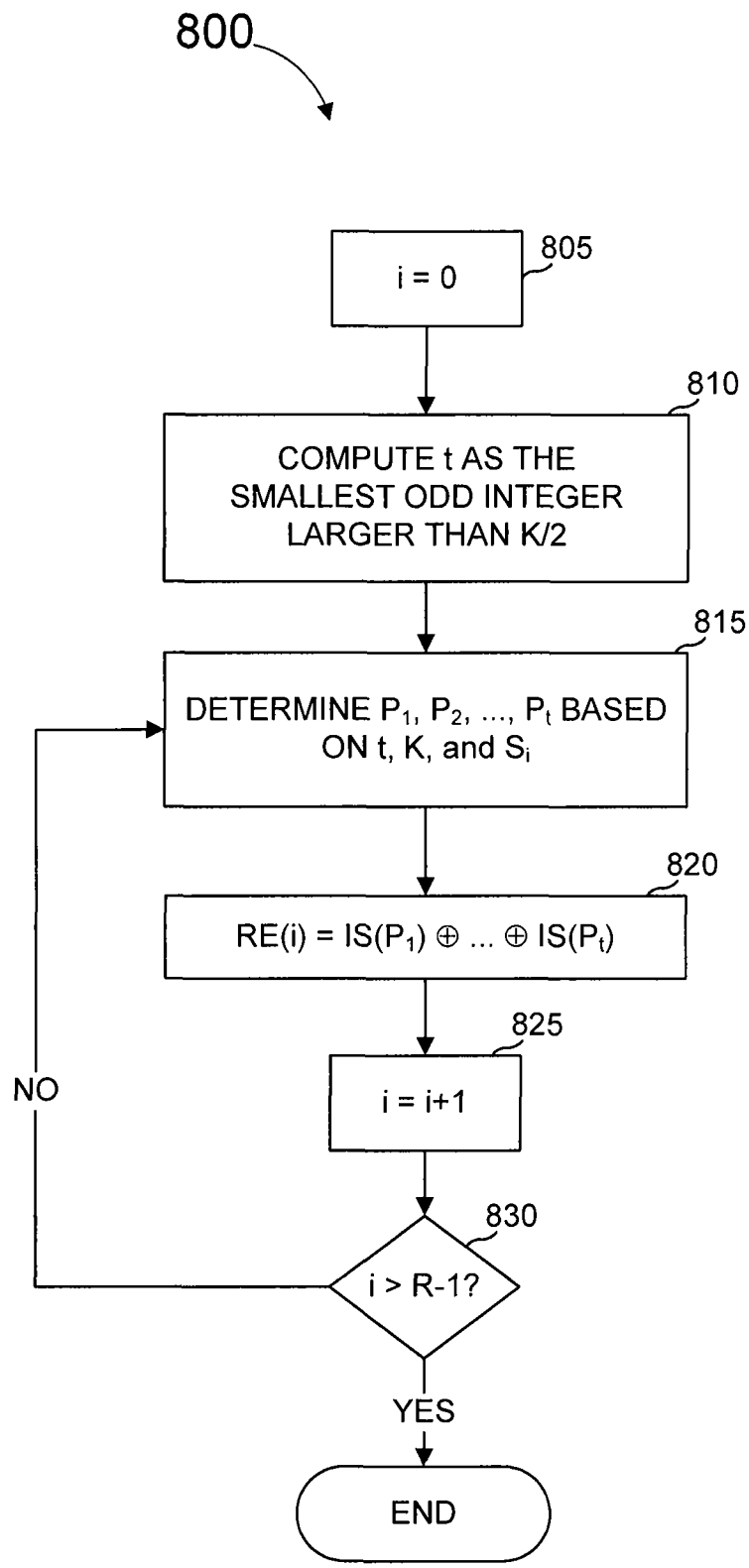
FIG. 10 is a simplified flow diagram of a static encoder according to another embodiment of the present invention.

FIG. 10 is a simplified flow diagram of such an encoder according to one embodiment of the present invention, which will now be described. First, in step 805, a variable i is initialized to zero. Variable i keeps track of the number of redundant symbols already generated. In step 810, a number t is calculated as the smallest odd integer greater than or equal to K/2. In step 815, values $P_1, P_2, \ldots, P_t$ are generated based on K, t, and a static key $S_i$. The values $P_1, P_2, \ldots, P_t$ indicate the positions of input symbols that will be used to generate a redundant symbol. In one particular embodiment, an associator such as associator 515 of FIG. 5 is used to generate $P_1, P_2, \ldots, P_t$. In particular, the value t can be provided as the W(I) input, the value K can be provided as the K+R input, and the static key $S_i$ can be provided as the key I input. It should be noted that many different values of t would yield similar coding effects, and thus this particular choice is only an example. In step 820, the value of RE(i) is computed as the XOR of the values IS($P_1$), IS($P_2$), . . . , IS($P_t$). In step 825, the variable i is incremented by one to prepare computation of the next redundant symbol, and in step 830, it is determined whether all the redundant symbols have been computed. If not, then the flow returns to step 815.

Figure 11:
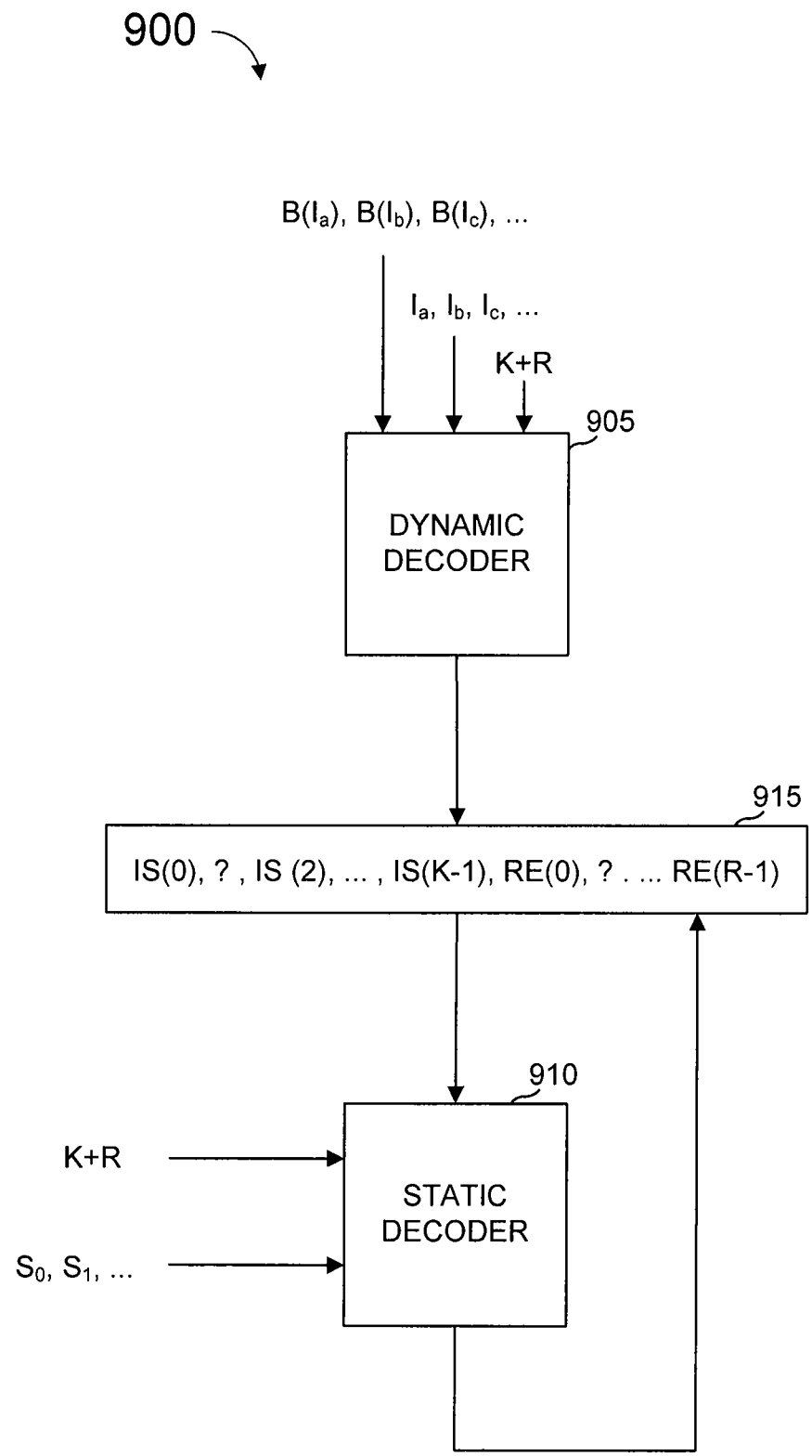
FIG. 11 is a simplified block diagram of a decoder according to one embodiment of the present invention.

FIG. 11 is a simplified block diagram illustrating one embodiment of a decoder according to the present invention. Decoder 900 can be used, for example, to implement decoder 155 of FIG. 1.

Decoder 900 comprises a dynamic decoder 905 and a static decoder 910. Input symbols and redundant symbols recovered by dynamic decoder 905 are stored in a reconstruction buffer 915. Upon completion of dynamic decoding, static decoder 910 attempts to recover any input symbols not recovered by dynamic decoder 905, if any. In particular, static decoder 910 receives input symbols and redundant symbols from reconstruction buffer 915.

Figure 12:
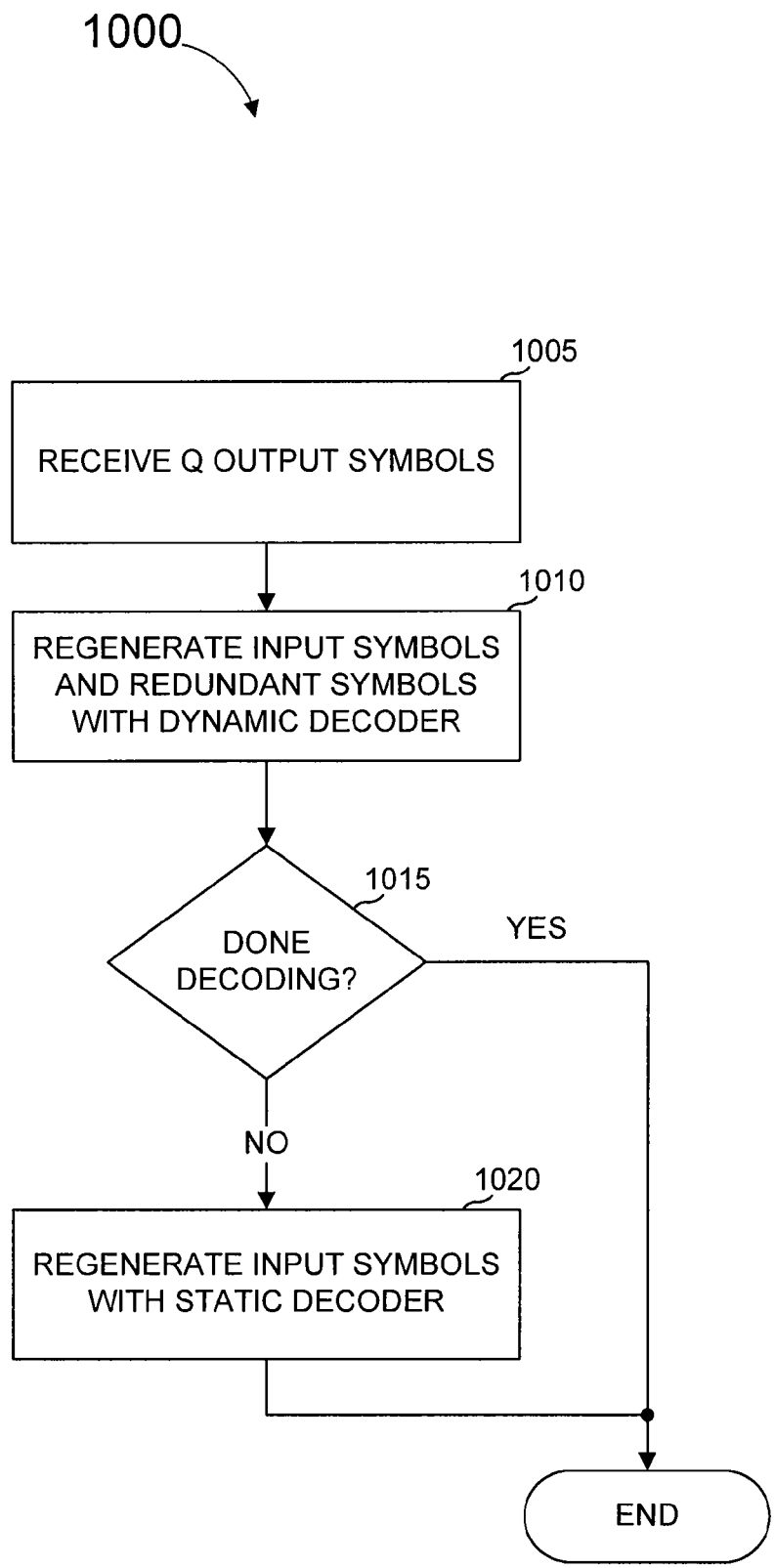
FIG. 12 is a simplified flow diagram of an operation of a decoder according to one embodiment of the present invention.

FIG. 12 is a simplified flow diagram illustrating one embodiment of a method for decoding according to the present invention. In step 1005, Q output symbols are received by the decoder. The value of Q can depend on the number of input symbols and the specific dynamic encoder used. The value of Q can also depend on the desired degree of accuracy to which the decoder can recover the input symbols. For example, if it is desired that the decoder can recover all of the input symbols with a high probability, then Q should be chosen to be larger than the number of input symbols. Particularly, in some applications, when the number of input symbols is large, Q can be less than 3% larger than the number of original input symbols. In other applications, when the number of input symbols is small, Q can be at least 10% larger than the number of input symbols. Specifically, Q can be chosen as the number K of input symbols plus a number A, where A is chosen to ensure that the decoder can regenerate all of the input symbols with a high probability. Determination of the number A is described in more detail below. If it is acceptable for the decoder to be unable to decode all of the input symbols (either sometimes or always), then Q can be less than K+A, equal to K, or even less than K. Clearly, one aim of an overall coding system will often be to decrease the number Q as much as possible, while maintaining good probabilistic guarantees on the success of the decoding process with respect to the desired degree of accuracy.

In step 1010, dynamic decoder 905 regenerates input symbols and redundant symbols from the Q received output symbols. It is to be understood, that steps 1005 and 1010 can be performed substantially concurrently. For example, dynamic decoder 905 can begin regenerating input symbols and redundant symbols prior to the decoder receiving Q output symbols.

After dynamic decoder 905 has processed Q output symbols, then it is determined whether the input symbols have been recovered to a desired degree of accuracy. The desired degree of accuracy may be, for example, all of the input symbols, or some number, percentage, etc., less than all of the input symbols. If yes, then the flow ends. If no, then the flow proceeds to step 1020. In step 1020, static decoder 910 attempts to recover any input symbols that dynamic decoder 905 was unable to recover. After static encoder 910 has processed the input symbols and redundant symbols recovered by dynamic encoder 905, then the flow ends.

Figure 13:
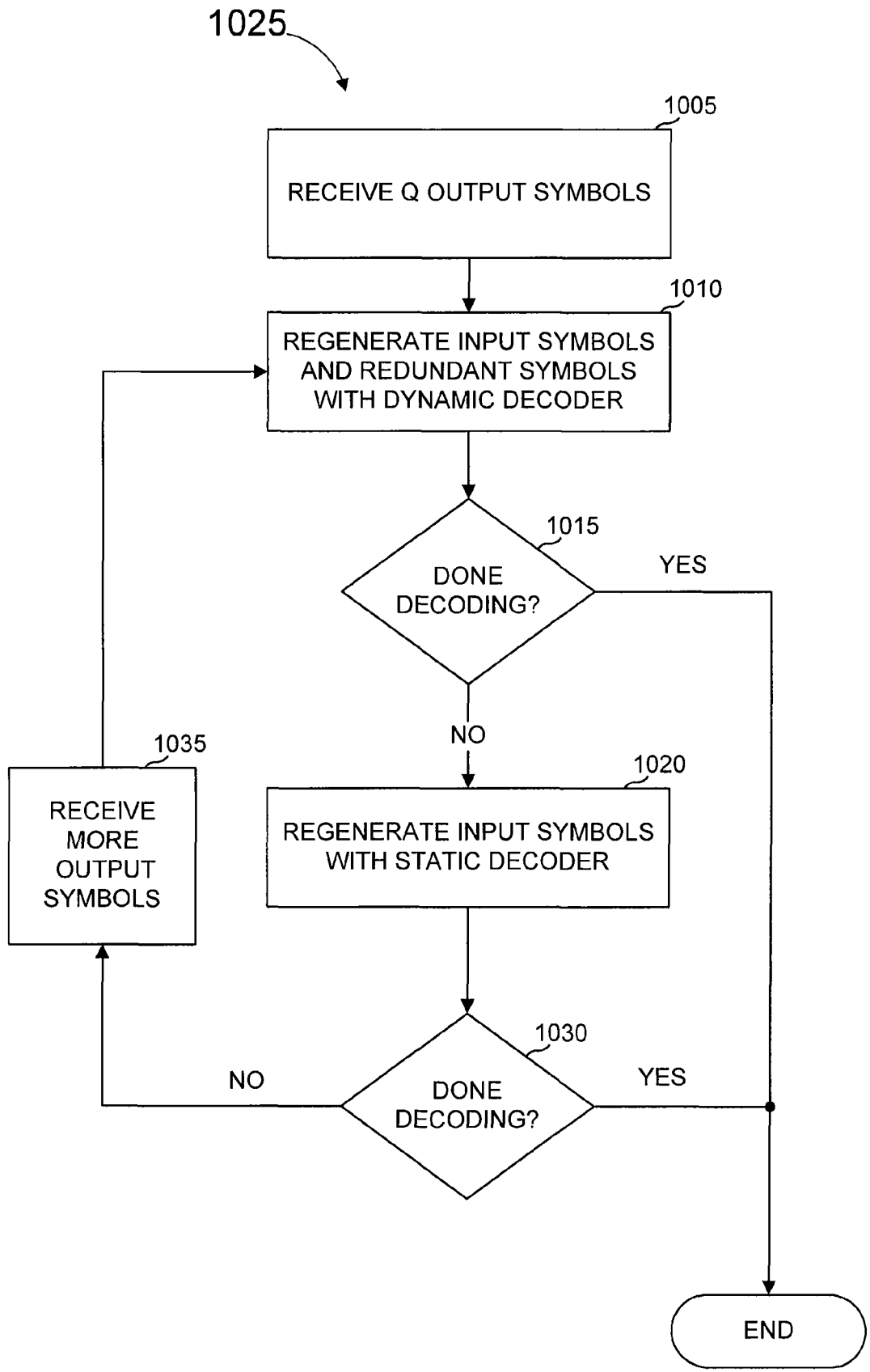
FIG. 13 is a simplified flow diagram of an operation of a decoder according to another embodiment of the present invention.

FIG. 13 is a simplified flow diagram illustrating another embodiment of a method for decoding according to the present invention. This embodiment is similar to that described with respect to FIG. 11, and includes steps 1005, 1010, 1015, and 1025 in common. But, after step 1025, the flow proceeds to step 1030, in which it is determined whether the input symbols have been recovered to a desired degree of accuracy. If yes, then the flow ends. If no, then the flow proceeds to step 1035. In step 1035, one or more additional output symbols are received. Then, the flow proceeds back to step 1010, so that dynamic decoder 905 and/or static decoder 910 can attempt to recover the remaining unrecovered input symbols.

Figure 14:
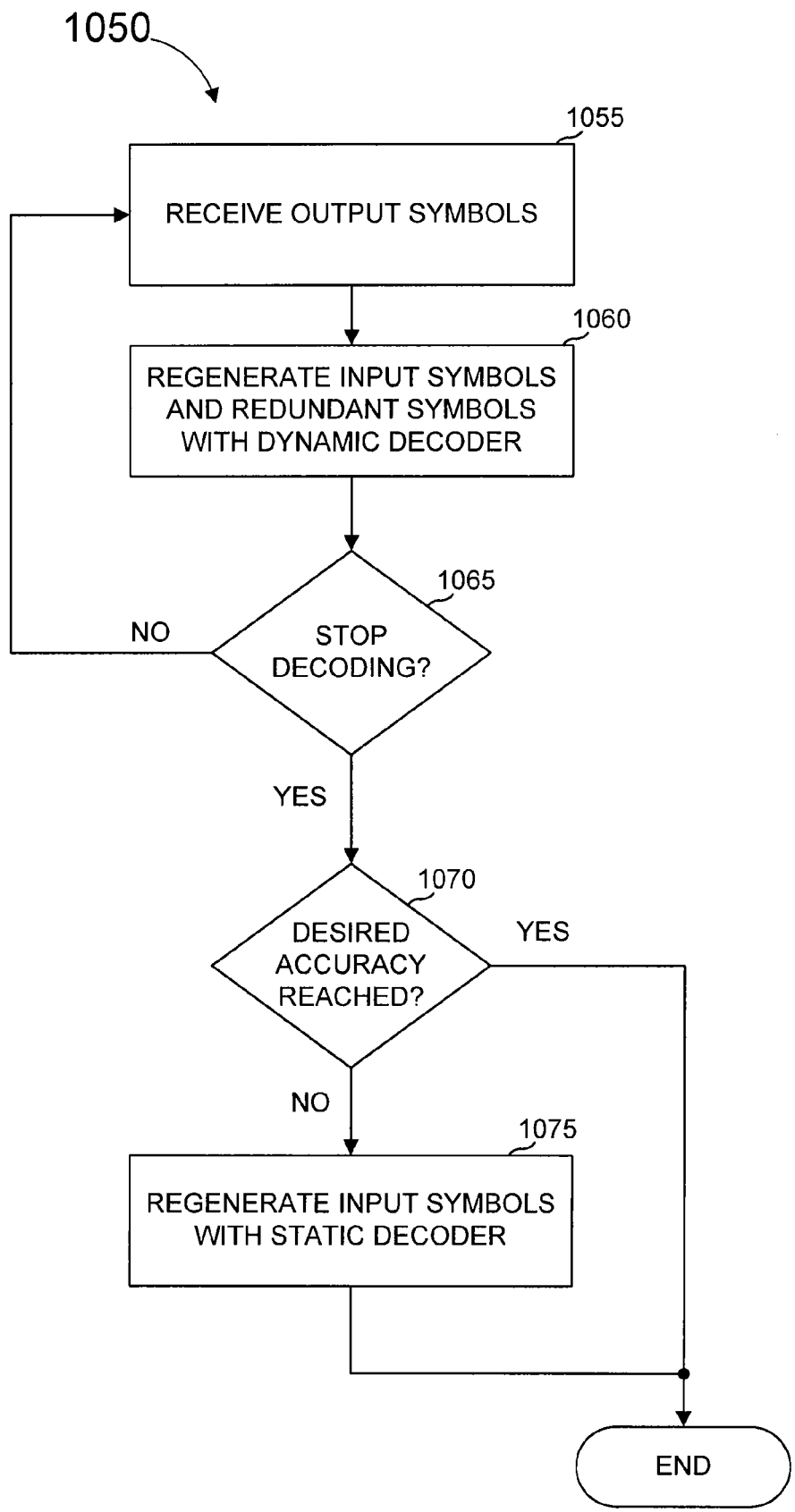
FIG. 14 is a simplified flow diagram of an operation of a decoder according to yet another embodiment of the present invention.

FIG. 14 is a simplified flow diagram illustrating yet another embodiment of a method for decoding according to the present invention. In step 1055, output symbols are received by the decoder, and in step 1060, dynamic decoder 905 regenerates input symbols and redundant symbols from the received output symbols. Then, in step 1065, it is determined whether dynamic decoding should be ended. This determination can be based on one or more of the number of output symbols processed, the number of input symbols recovered, the current rate at which additional input symbols are being recovered, the time spent processing output symbols, etc.

In step 1065, if it is determined that dynamic decoding is not to be stopped, then the flow proceeds back to step 1055. But, if in step 1065, it is determined to end dynamic decoding, then the flow proceeds to step 1070. In step 1070, it is determined whether the input symbols have been recovered to a desired degree of accuracy. If yes, then the flow ends. If no, then the flow proceeds to step 1075. In step 1075, static decoder 910 attempts to recover any input symbols that dynamic decoder 905 was unable to recover. After static encoder 910 has processed the input symbols and redundant symbols recovered by dynamic encoder 905, the flow ends.

Figure 15:
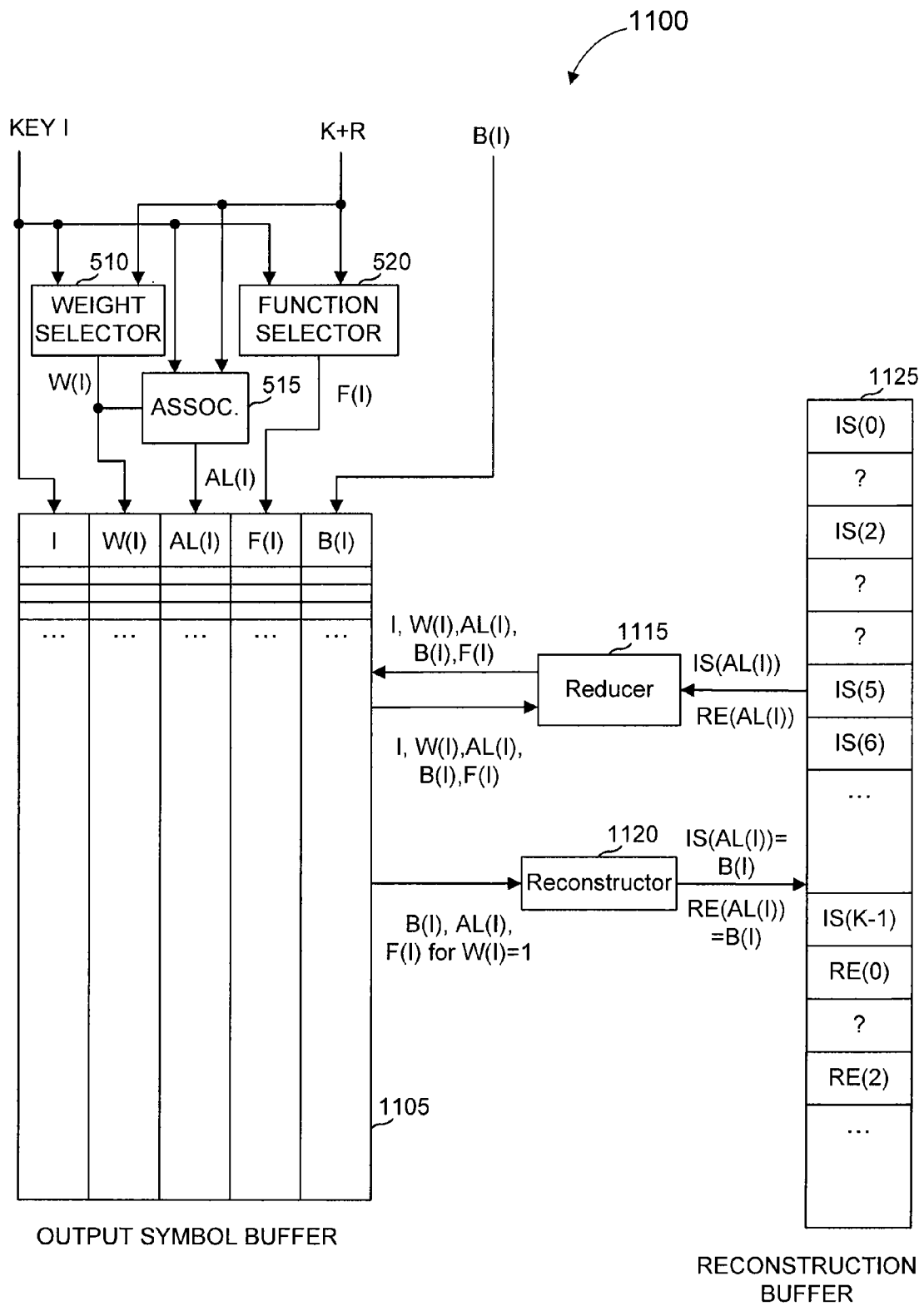
FIG. 15 is a simplified block diagram of a dynamic decoder according to one embodiment of the present invention.

FIG. 15 shows one embodiment of dynamic decoder according to the present invention. Dynamic decoder 1100 includes similar components as those of dynamic encoder 500 shown in FIG. 5. Decoder 1100 is similar to embodiments of chain reaction decoders described in Luby I and Luby II. Dynamic decoder 1100 comprises a weight selector 510, an associator 515, a value function selector 520, an output symbol buffer 1105, a reducer 1115, a reconstructor 1120 and a reconstruction buffer 1125.

Figure 16:
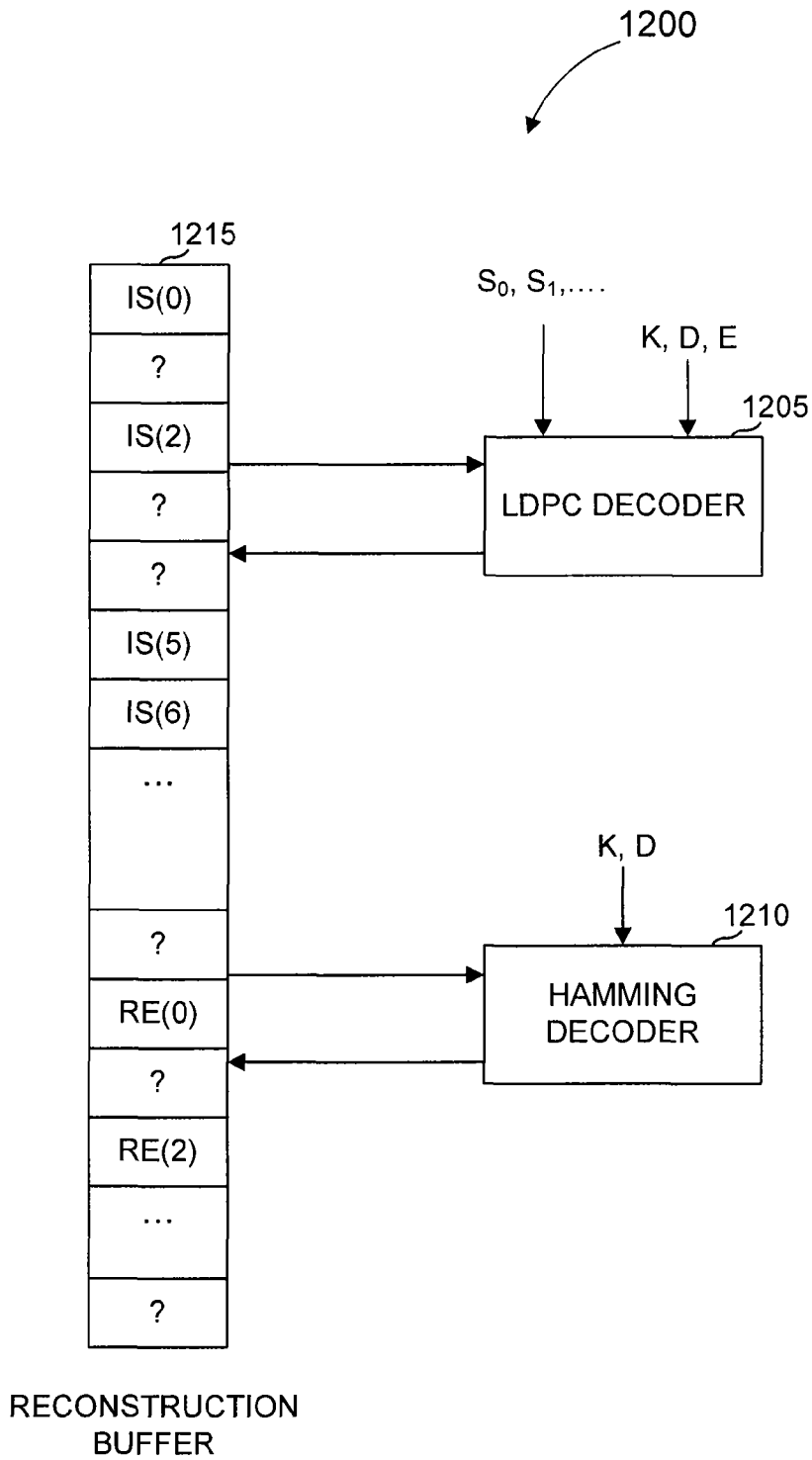
FIG. 16 is a simplified block diagram of a static decoder according to one embodiment of the present invention.

FIG. 16 is a simplified block diagram illustrating one embodiment of a static decoder. This embodiment can be used when the data is encoded with a static encoder such as described with reference to FIG. 7. Static decoder 1200 comprises a LDPC decoder 1205 and a Hamming decoder 1210. The LDPC decoder 1205 receives input symbols and redundant symbols from a reconstruction buffer 1215, and attempts to reconstruct those symbols of reconstruction buffer 1215 unrecovered after the decoding step of the dynamic decoder. In some embodiments, reconstruction buffer 1215 is reconstruction buffer 1125 (FIG. 15).

Many variations of LDPC decoders and Hamming decoders are well known to those skilled in the art, and can be employed in various embodiments according to the present invention. In one specific embodiment, Hamming decoder is implemented using a Gaussian elimination algorithm. Many variations of Gaussian elimination algorithms are well known to those skilled in the art, and can be employed in various embodiments according to the present invention.

Variations

Multi-stage chain reaction codes as described above are not systematic codes, i.e., all of the original source symbols of a source block are not necessarily among the encoding symbols that are sent. However, systematic FEC codes are useful for a file download system or service, and very important for a streaming system or service. As shown in the implementation below, a modified code can be made to be systematic and still maintain the fountain code and other described properties.

One reason why it is easy to architect a variety of supplemental services using multi-stage codes is that it can combine received encoding symbols from multiple senders to reconstruct a source file or stream without coordination among the senders. The only requirement is that the senders use differing sets of keys to generate the encoding symbols that they send in encoding packets to the code. Ways to achieve this include designating different ranges of the key space to be used by each such sender, or generating keys randomly at each sender.

As an example of the use of this capability, consider providing a supplemental service to a file download service that allows multi-stage chain reaction codes that did not receive enough encoding packets to reconstruct a source file from the file download session to request additional encoding packets to be sent from a make-up sender, e.g., via a HTTP session. The make-up sender generates encoding symbols from the source file and sends them, for example using HTTP, and all these encoding symbols can be combined with those received from the file download session to recover the source file. Using this approach allows different senders to provide incremental source file delivery services without coordination between the senders, and ensuring that each individual receiver need receive only a minimal number of encoding packets to recover each source file.

Implementations of Various Stages of Multi-Stage Codes

FEC Scheme Definition

A packet using these techniques might be represented with header information such as an FEC Payload ID of four octets comprising a Source Block Number (SBN) (16 bit integer identifier for the source block that the encoding symbols within the packet relate to) and an Encoding Symbol ID (ESI) (16 bit integer identifier for the encoding symbols within the packet). One suitable interpretation of the Source Block Number and Encoding Symbol Identifier is defined in Sections B below. FEC Object Transmission information might comprise the FEC Encoding ID, a Transfer Length (F) and the parameters T, Z, N and A defined in below. The parameters T and Z are 16 bit unsigned integers, N and A are 8 bit unsigned integers.

An FEC encoding scheme for MBMS forward error correction is defined in the sections below. It defines two different FEC Payload ID formats, one for FEC source packets and another for FEC repair packets, but variations for nonsystematic codes are also possible.

The Source FEC payload ID might comprise a Source Block Number (SBN) (16 bit integer identifier for the source block that the encoding symbols within the packet relate to) and an Encoding Symbol ID (ESI) (16 bit integer identifier for the encoding symbols within the packet), while the Repair FEC Payload ID might comprise a Source Block Number (SBN) (16 bit integer identifier for the source block that the repair symbols within the packet relate to), an Encoding Symbol ID (ESI) (16 bit integer identifier for the repair symbols within the packet), and a Source Block Length (SBL) (16 bits, representing the number of source symbols in the source block. The interpretation of the Source Block Number, Encoding Symbol Identifier and Source Block Length is defined below.

FEC Object Transmission information might comprise the FEC Encoding ID, the maximum source block length, in symbols, and the symbol size, in bytes. The symbol size and maximum source block length might comprise a four octet field of Symbol Size (T) (16 bits representing the size of an encoding symbol, in bytes), and a Maximum Source Block Length (16 bits representing the maximum length of a source block, in symbols).

The sections below specify the systematic MSCR forward error correction code and its application to MBMS and other uses. MSCR is a fountain code, i.e., as many encoding symbols as needed can be generated by the encoder on-the-fly from the source symbols of a block. The decoder is able to recover the source block from any set of encoding symbols only slightly more in number than the number of source symbols. The code described in this document is a systematic code, that is, the original source symbols are sent unmodified from sender to receiver, as well as a number of repair symbols.

B.1 Definitions, Symbols and Abbreviations

B.1.1 Definitions

For the purposes of this description, the following terms and definitions apply.
Source block: a block of K source symbols which are considered together for MSCR encoding purposes.
Source symbol: the smallest unit of data used during the encoding process. All source symbols within a source block have the same size.
Encoding symbol: a symbol that is included in a data packet. The encoding symbols comprise the source symbols and the repair symbols. Repair symbols generated from a source block have the same size as the source symbols of that source block.
Systematic code: a code in which the source symbols are included as part of the encoding symbols sent for a source block.
Repair symbol: the encoding symbols sent for a source block that are not the source symbols. The repair symbols are generated based on the source symbols.
Intermediate symbols: symbols generated from the source symbols using an inverse encoding process. The repair symbols are then generated directly from the intermediate symbols. The encoding symbols do not include the intermediate symbols, i.e., intermediate symbols are not included in data packets.
Symbol: a unit of data. The size, in bytes, of a symbol is known as the symbol size.

Encoding symbol group: a group of encoding symbols that are sent together, i.e., within the same packet whose relationship to the source symbols can be derived from a single Encoding Symbol ID.
Encoding Symbol ID: information that defines the relationship between the symbols of an encoding symbol group and the source symbols.
Encoding packet: data packets that contain encoding symbols
Sub-block: a source block is sometime broken into sub-blocks, each of which is sufficiently small to be decoded in working memory. For a source block comprising K source symbols, each sub-block comprises K sub-symbols, each symbol of the source block being composed of one sub-symbol from each sub-block.
Sub-symbol: part of a symbol. Each source symbol is composed of as many sub-symbols as there are sub-blocks in the source block.
Source packet: data packets that contain source symbols.
Repair packet: data packets that contain repair symbols.

B.1.2. Symbols

| | |
|---|---|
| $i, j, x, h, a, b, d, v, m$ | represent positive integers |
| ceil(x) | denotes the smallest positive integer which is greater than or equal to x |
| choose(i, j) | denotes the number of ways j objects can be chosen from among i objects without repetition |
| floor(x) | denotes the largest positive integer which is less than or equal to x |
| i % j | denotes i modulo j |
| X ^ Y | denotes, for equal-length bit strings X and Y, the bitwise exclusive-or of X and Y |
| A | denote a symbol alignment parameter. Symbol and sub-symbol sizes are restricted to be multiples of A. |
| $A^T$ | denotes the transposed matrix of matrix A |
| $A^{-1}$ | denotes the inverse matrix of matrix A |
| K | denotes the number of symbols in a single source block |
| $K_{MAX}$ | denotes the maximum number of source symbols that can be in a single source block. Set to 8192. |
| L | denotes the number of pre-coding symbols for a single source block |
| S | denotes the number of LDPC symbols for a single source block |
| H | denotes the number of Half symbols for a single source block |
| C | denotes an array of intermediate symbols, C[0], C[1], C[2], . . . , C[L − 1] |
| C' | denotes an array of source symbols, C'[0], C'[1], C'[2], . . . , C'[K − 1] |
| X | a non-negative integer value |
| $V_0, V_1$ | two arrays of 4-byte integers, $V_0[0], V_0[1], \ldots, V_0[255]$ and $V_1[0], V_1[1], \ldots, V_1[255]$ |
| Rand[X, i, m] | a pseudo-random number generator |
| Deg[v] | a degree generator |
| LTEnc[K, C, (d,a, b)] | a LT encoding symbol generator |
| Trip[K, X] | a triple generator function |
| G | the number of symbols within an encoding symbol group |
| N | the number of sub-blocks within a source block |
| T | the symbol size in bytes. If the source block is partitioned into sub-blocks, then T = T' · N. |
| T' | the sub-symbol size, in bytes. If the source block is not partitioned into sub-blocks then T' is not relevant. |
| F | the file size, for file download, in bytes |
| I | the sub-block size in bytes |
| P | for file download, the payload size of each packet, in bytes, that is used in the recommended derivation of the file download transport parameters. For streaming, the payload size of each repair packet, in bytes, that is used in the recommended derivation of the streaming transport parameters. |
| Q | Q = 65521, i.e., Q is the largest prime smaller than $2^{16}$ |
| Z | the number of source blocks, for file download |

-continued

| | |
|---|---|
| J(K) | the systematic index associated with K |
| G | denotes any generator matrix |
| $I_S$ | denotes the S × S identity matrix |
| $0_{S \times H}$ | denotes the S × H zero matrix |

B.1.3 Abbreviations

For the purposes of the present document, the following abbreviations apply:

| | |
|---|---|
| ESI | Encoding Symbol ID |
| LDPC | Low Density Parity Check |
| LT | Luby Transform |
| SBN | Source Block Number |
| SBL | Source Block Length (in units of symbols) |

B.2. Overview

The MSCR forward error correction code can be applied to both MBMS file delivery and MBMS streaming applications. MSCR code aspects which are specific to each of these applications are discussed in Sections B.3 and B.4 of this document.

A component of the systematic MSCR code is the basic encoder described in Section B.5. First, it is described how to derive values for a set of intermediate symbols from the original source symbols such that knowledge of the intermediate symbols is sufficient to reconstruct the source symbols. Secondly, the encoder produces repair symbols which are each the exclusive OR of a number of the intermediate symbols. The encoding symbols are the combination of the source and repair symbols. The repair symbols are produced in such a way that the intermediate symbols and therefore also the source symbols can be recovered from any sufficiently large set of encoding symbols.

This document defines the systematic MSCR code encoder. A number of possible decoding algorithms are possible. An efficient decoding algorithm is provided in Section B.6.

The construction of the intermediate and repair symbols is based in part on a pseudo-random number generator described in Section B.5. This generator is based on a fixed set of 512 random numbers that are available to both sender and receiver. An example set of numbers are those provided in Appendix B.1.

Finally, the construction of the intermediate symbols from the source symbols is governed by a "systematic index". An example set of values for the systematic index is shown in Appendix A for source block sizes from 4 source symbols to $K_{MAX}$=8192 source symbols.

B.3. File Download

B.3.1. Source Block Construction

B.3.1.1. General

In order to apply the MSCR encoder to a source file, the file may be broken into Z≥1 blocks, known as source blocks. The MSCR encoder is applied independently to each source block. Each source block is identified by a unique integer Source Block Number (SBN), where the first source block has SBN zero, the second has SBN one, etc. Each source block is divided into a number, K, of source symbols of size T bytes each. Each source symbol is identified by a unique integer Encoding Symbol Identifier (ESI), where the first source symbol of a source block has ESI zero, the second has ESI one, etc.

Each source block with K source symbols is divided into N≥1 sub-blocks, which are small enough to be decoded in the working memory. Each sub-block is divided into K sub-symbols of size T'.

Note that the value of K is not necessarily the same for each source block of a file and the value of T' may not necessarily be the same for each sub-block of a source block. However, the symbol size T is the same for all source blocks of a file and the number of symbols, K is the same for every sub-block of a source block. Exact partitioning of the file into source blocks and sub-blocks is described in B.3.1.2 below.

FIG. 17 shows an example source block placed into a two dimensional array, where each entry is a T'-byte sub-symbol, each row is a sub-block and each column is a source symbol. In this example, the value of T' is the same for every sub-block. The number shown in each sub-symbol entry indicates their original order within the source block. For example, the sub-symbol numbered K contains bytes T'·K through T'·(K+1)−1 of the source block. Then, source symbol i is the concatenation of the ith sub-symbol from each of the sub-blocks, which corresponds to the sub-symbols of the source block numbered i, K+i, 2·K+i, . . . , (N−1)·K+i.

B.3.1.2 Source Block and Sub-Block Partitioning

The construction of source blocks and sub-blocks is determined based on five input parameters, F, A, T, Z and N and a function Partition[ ]. The five input parameters are defined as follows:

| | |
|---|---|
| F | the size of the file, in bytes |
| A | a symbol alignment parameter, in bytes |
| T | the symbol size, in bytes, which must be a multiple of A |
| Z | the number of source blocks |
| N | the number of sub-blocks in each source block |

These parameters might be set so that ceil(ceil(F/T)/Z) ≤$K_{MAX}$. Recommendations for derivation of these parameters are provided in Section B.3.4.

The function Partition[ ] takes a pair of integers (I, J) as input and derives four integers ($I_L$, $I_S$, $J_L$, $J_S$) as output. Specifically, the value of Partition[I, J] is a sequence of four integers ($I_L$, $I_S$, $J_L$, $J_S$), where $I_L$=ceil(I/J), $I_S$=floor(I/J), $J_L$=I−$I_S$·J and $J_S$=J−$J_L$. Partition[ ] derives parameters for partitioning a block of size I into J approximately equal sized blocks. Specifically, $J_L$ blocks of length $I_L$ and $J_S$ blocks of length $I_S$.

The source file might be partitioned into source blocks and sub-blocks as follows:

Let,
$K_t$ = ceil(F/T)
($K_L$, $K_S$, $Z_L$, $Z_S$) = Partition[$K_t$, Z]
($T_L$, $T_S$, $N_L$, $N_S$) = Partition[T/A, N]

Then, the file might be partitioned into Z=$Z_L$+$Z_S$ contiguous source blocks, the first $Z_L$ source blocks each having length $K_L$·T bytes and the remaining $Z_S$ source blocks each having $K_S$·T bytes.

If $K_t$·T>F then for encoding purposes, the last symbol might be padded at the end with $K_t$·T−F zero bytes.

Next, each source block might be divided into $N=N_L+N_S$ contiguous sub-blocks, the first $N_L$ sub-blocks each comprising K contiguous sub-symbols of size of $T_L \cdot A$ and the remaining $N_S$ sub-blocks each comprising K contiguous sub-symbols of size of $T_S \cdot A$. The symbol alignment parameter A ensures that sub-symbols are always a multiple of A bytes.

Finally, the mth symbol of a source block comprises the concatenation of the mth sub-symbol from each of the N sub-blocks.

B.3.2. Encoding Packet Construction

B.3.2.1. General

Each encoding packet contains the following information:
Source Block Number (SBN)
Encoding Symbol ID (ESI)
encoding symbol(s)

Each source block is encoded independently of the others. Source blocks are numbered consecutively from zero.

Encoding Symbol JD values from 0 to K−1 identify the source symbols. Encoding Symbol IDs from K onwards identify repair symbols.

B.3.2.2 Encoding Packet Construction

Each encoding packet preferably either consists entirely of source symbols (source packet) or entirely of repair symbols (repair packet). A packet may contain any number of symbols from the same source block. In the case that the last symbol in the packet includes padding bytes added for FEC encoding purposes then these bytes need not be included in the packet. Otherwise, only whole symbols might be included.

The Encoding Symbol ID, X, carried in each source packet is the Encoding Symbol ID of the first source symbol carried in that packet. The subsequent source symbols in the packet have Encoding Symbol IDs, X+1 to X+G−1, in sequential order, where G is the number of symbols in the packet.

Similarly, the Encoding Symbol ID, X, placed into a repair packet is the Encoding Symbol ID of the first repair symbol in the repair packet and the subsequent repair symbols in the packet have Encoding Symbol IDs X+1 to X+G−1 in sequential order, where G is the number of symbols in the packet.

Note that it is not necessary for the receiver to know the total number of repair packets. The G repair symbol triples $(d[0], a[0], b[0]), \ldots, (d[G-1], a[G-1], b[G-1])$ for the repair symbols placed into a repair packet with ESI X are computed using the Triple generator defined in B.5.3.4 as follows:
For each $i=0, \ldots, G-1$ $(d[i], a[i], b[i]) = \text{Trip}[K, X+i]$ The G repair symbols to be placed in repair packet with ESI X are calculated based on the repair symbol triples as described in Section B.5.3 using the intermediate symbols C and the LT encoder LTenc[K, C, (d[i], a[i], b[i])].

B.3.3. Transport

This section describes the information exchange between the MSCR encoder/decoder and any transport protocol making use of MSCR forward error correction for file delivery.

The MSCR encoder and decoder for file delivery require the following information from the transport protocol: the file size, F, in bytes, the symbol alignment parameter, A, the symbol size, T, in bytes, which is a multiple of A, the number of source blocks, Z, the number of sub-blocks in each source block, N. The MSCR encoder for file delivery additionally requires the file to be encoded, F bytes.

The MSCR encoder supplies the transport protocol with encoding packet information comprising, for each packet, the SBN, the ESI and the encoding symbol(s). The transport protocol might communicate this information transparently to the MSCR decoder.

B.3.4. Recommended Parameters (Informative)

B.3.4.1 Parameter Derivation Algorithm

This section provides recommendations for the derivation of the four transport parameters, A, T, Z and N. This recommendation is based on the following input parameters:

| | |
|---|---|
| F | the file size, in bytes |
| W | a target on the sub-block size, in bytes |
| P | the maximum packet payload size, in bytes, which is assumed to be a multiple of A |
| A | the symbol alignment factor, in bytes |
| $K_{MAX}$ | the maximum number of source symbols per source block. |
| $K_{MIN}$ | a minimum target on the number of symbols per source block |
| $G_{MAX}$ | a maximum target number of symbols per packet |

Based on the above inputs, the transport parameters T, Z and N are calculated as follows:

Let,
$G = \min\{\text{ceil}(P \cdot K_{MIN}/F), P/A, G_{MAX}\}$ - the approximate number of symbols per packet
$T = \text{floor}(P/(A \cdot G)) \cdot A$
$K_t = \text{ceil}(F/T)$ - the total number of symbols in the file
$Z = \text{ceil}(K_t/K_{MAX})$
$N = \min\{\text{ceil}(\text{ceil}(K_t/Z) \cdot T/W), T/A\}$ The values of G and N derived above should be considered as lower bounds. It may be advantageous to increase these values, for example to the nearest power of two. In particular, the above algorithm does not guarantee that the symbol size, T, divides the maximum packet size, P, and so it may not be possible to use the packets of size exactly P. If, instead, G is chosen to be a value which divides P/A, then the symbol size, T, will be a divisor of P and packets of size P can be used.

Recommended settings for the input parameters, W, A, $K_{MIN}$ and $G_{MAX}$ are as follows:
W=256 KB A=4 $K_{MIN}$=1024 $G_{MAX}$=10

B.3.4.2 Examples

The above algorithm leads to transport parameters as shown in FIG. 18, assuming the recommended values for W, A, $K_{MIN}$ and $G_{MAX}$ and P=512.

B.4. Streaming

B.4.1. Source Block Construction

A source block is constructed by the transport protocol, for example as defined in this document, making use of the Systematic MSCR Forward Error Correction code. The symbol size, T, to be used for source block construction and the repair symbol construction are provided by the transport protocol. The parameter T might be set so that the number of source symbols in any source block is at most $K_{MAX}$.

Recommended parameters are presented in section B.4.4.

B.4.2. Encoding Packet Construction

As described in B.4.3., each repair packet contains the SBN, ESI, SBL and repair symbol(s). The number of repair symbols contained within a repair packet is computed from the packet length. The ESI values placed into the repair packets and the repair symbol triples used to generate the repair symbols are computed as described in Section B.3.2.2.

B.4.3. Transport

This section describes the information exchange between the MSCR encoder/decoder and any transport protocol making use of MSCR forward error correction for streaming. The MSCR encoder for streaming might use the following information from the transport protocol for each source block: the symbol size, T, in bytes, the number of symbols in the source block, K, the Source Block Number (SBN) and the source symbols to be encoded, K·T bytes. The MSCR encoder supplies the transport protocol with encoding packet information comprising, for each repair packet, the SBN, the ESI, the SBL and the repair symbol(s). The transport protocol might communicate this information transparently to the MSCR decoder.

B.4.4. Recommended Parameters

B.4.4.1 Parameter Derivation Algorithm

This section provides recommendations for the derivation of the transport parameter T. This recommendation is based on the following input parameters:

| | |
|---|---|
| B | the maximum source block size, in bytes |
| P | the maximum repair packet payload size, in bytes, which is a multiple of A |
| A | the symbol alignment factor, in bytes |
| $K_{MAX}$ | the maximum number of source symbols per source block. |
| $K_{MIN}$ | a minimum target on the number of symbols per source block |
| $G_{MAX}$ | a maximum target number of symbols per repair packet |

A requirement on these inputs is that $\text{ceil}(B/P) \leq K_{MAX}$. Based on the above inputs, the transport parameter T is calculated as follows:

Let $G = \min\{\text{ceil}(P \cdot K_{MIN}/B), P/A, G_{MAX}\}$—the approximate number of symbols per packet $$T = \text{floor}(P/(A \cdot G)) \cdot A$$

The value of T derived above should be considered as a guide to the actual value of T used. It may be advantageous to ensure that T divides into P, or it may be advantageous to set the value of T smaller to minimize wastage when full size repair symbols are used to recover partial source symbols at the end of lost source packets (as long as the maximum number of source symbols in a source block does not exceed $K_{MAX}$). Furthermore, the choice of T may depend on the source packet size distribution, e.g., if all source packets are the same size then it is advantageous to choose T so that the actual payload size of a repair packet P', where P' is a multiple of T, is equal to (or as few bytes as possible larger than) the number of bytes each source packet occupies in the source block.

Recommended settings for the input parameters, A, $K_{MIN}$ and $G_{MAX}$ are as follows:
A=4 $K_{MIN}$=1024 $G_{MAX}$=10

B.4.4.2 Examples

The above algorithm leads to transport parameters as shown in FIG. 19, assuming the recommended values for A, $K_{MIN}$ and $G_{MAX}$ and P=512.

B.5. Systematic MSCR Encoder

B.5.1. Encoding Overview

The systematic MSCR encoder is used to generate repair symbols from a source block that comprises K source symbols.

Symbols are the fundamental data units of the encoding and decoding process. For each source block (sub-block) all symbols (sub-symbols) are the same size. The atomic operation performed on symbols (sub-symbols) for both encoding and decoding is the exclusive-or operation.

Let C'[0], . . . , C'[K−1] denote the K source symbols.
Let C[0], . . . , C[L−1] denote L intermediate symbols.

The first step of encoding is to generate a number, L>K, of intermediate symbols from the K source symbols. In this step, K source triples (d[0], a[0], b[0]), . . . , (d[K−1], a[K−1], b[K−1]) are generated using the Trip[ ] generator as described in Section B.5.4.4. The K source triples are associated with the K source symbols and are then used to determine the L intermediate symbols C[0], . . . , C[L−1] from the source symbols using an inverse encoding process. This process can be can be realized by a MSCR decoding process.

Certain "pre-coding relationships" must hold within the L intermediate symbols. Section B.5.2 describes these relationships and how the intermediate symbols are generated from the source symbols.

Once the intermediate symbols have been generated, repair symbols are produced and one or more repair symbols are placed as a group into a single data packet. Each repair symbol group is associated with an Encoding Symbol ID (ESI) and a number, G, of encoding symbols. The ESI is used to generate a triple of three integers, (d, a, b) for each repair symbol again using the Trip[ ] generator as described in Section B.5.4.4. This is done as described in Sections B.3 and B.4 using the generators described in Section B.5.4. Then, each (d,a,b)-triple is used to generate the corresponding repair symbol from the intermediate symbols using the LTEnc[K, C[0], . . . , C[L−1], (d,a,b)] generator described in Section B.5.4.3.

B.5.2. First Encoding Step: Intermediate Symbol Generation

B.5.2.1 General

The first encoding step is a pre-coding step to generate the L intermediate symbols C[0], . . . , C[L−1] from the source symbols C'[0], . . . , C'[K−1]. The intermediate symbols are uniquely defined by two sets of constraints:
1. The intermediate symbols are related to the source symbols by a set of source symbol triples. The generation of the source symbol triples is defined in Section B.5.2.2 using the Trip[ ] generator as described in Section B.5.4.4.
2. A set of pre-coding relationships hold within the intermediate symbols themselves. These are defined in Section B.5.2.3.

The generation of the L intermediate symbols is then defined in Section 5.2.4.

B.5.2.2 Source Symbol Triples

Each of the K source symbols is associated with a triple (d[i], a[i], b[i]) for 0≤i<K. The source symbol triples are determined using the Triple generator defined in Section B.5.4.4 as:
For each i, 0≤i<K (d[i],a[i],b[i])=Trip[K,i]

B.5.2.3 Pre-Coding Relationships

The pre-coding relationships amongst the L intermediate symbols are defined by expressing the last L−K intermediate symbols in terms of the first K intermediate symbols.

The last L−K intermediate symbols C[K], . . . , C[L−1] comprise S LDPC symbols and H Half symbols The values of S and H are determined from K as described below. Then L=K+S+H.

---

Let
X    be the smallest positive integer such that $X \cdot (X - 1) = 2 \cdot K$.
S    be the smallest prime integer such that $S \geq \text{ceil}(0.01 \cdot K) + X$
H    be the smallest integer such that $\text{choose}(H, \text{ceil}(H/2)) \geq K + S$
H' = ceil(H/2)L = K + S + H
C[0], . . . , C[K − 1] denote the first K intermediate symbols
C[K], . . . , C[K + S − 1] denote the S LDPC symbols, initialised to zero
C[K + S], . . . , C[L − 1] denote the H Half symbols, initialised to zero

---

The S LDPC symbols are defined to be the values of C[K], . . . , C[K+S−1] at the end of the following process:

---

```
For i = 0, . . . , K − 1 do
  a = 1 + (floor(i/S) % (S − 1))
  b = i % S
  C[K + b] = C[K + b] ^ C[i]
  b = (b + a) % S
  C[K + b] = C[K + b] ^ C[i]
  b = (b + a) % S
  C[K + b] = C[K + b] ^ C[i]
```

---

The H Half symbols are defined as follows:

---

Let
g[i] = i ^ (floor(i/2)) for all positive integers i
Note: g[i] is the Gray sequence, in which each element differs from the previous one in a single bit position
g[j, k] denote the $j^{th}$ element, j = 0, 1, 2, . . . , of the subsequence of g[i] whose elements have exactly k non-zero bits in their binary representation

---

Then, the Half symbols are defined as the values of C[K+S], . . . , C[L−1] after the following process:

---

For h = 0, . . . , H − 1 do
For j = 0, . . . , K + S − 1 do
If bit h of g[j,H'] is equal to 1 then C[h + K + S] = C[h + K + S] ^ C[j].

---

B.5.2.4 Intermediate Symbols

B.5.2.4.1 Definition

Given the K source symbols C'[0], C'[1], . . . , C'[K−1] the L intermediate symbols C[0], C[1], . . . , C[L−1] are the uniquely defined symbol values that satisfy the following conditions:

1. The K source symbols C'[0], C'[1], . . . , C'[K−1] satisfy the K constraints

C'[i]=LTEnc[K,(C[0], . . . , C[L−1]),(d[i],a[i],b[i])],
    for all i, 0≤i<K.

2. The L intermediate symbols C[0], C[1], . . . , C[L−1] satisfy the pre-coding relationships defined in B.5.2.3.

B.5.2.4.2 Calculation of Intermediate Symbols

This subsection describes a possible method for calculation of the L intermediate symbols C[0], C[1], . . . , C[L−1] satisfying the constraints in B.5.2.4.1

The generator matrix G for a code which generates N output symbols from K input symbols is an N×K matrix over GF(2), where each row corresponds to one of the output symbols and each column to one of the input symbols and where the $i^{th}$ output symbol is equal to the sum of those input symbols whose column contains a non-zero entry in row i.

Then, the L intermediate symbols can be calculated as follows:
Let
C denote the column vector of the L intermediate symbols, C[0], C[1], . . . , C[L−1].
D denote the column vector comprising S+H zero symbols followed by the K source symbols C'[0], C'[1], . . . , C'[K−1]
Then the above constraints define an L×L matrix over GF(2), A, such that:

$A \cdot C = D$

The matrix A can be constructed as follows:

---

Let:
$G_{LDPC}$ be the S × K generator matrix of the LDPC symbols. So,
$G_{LDPC} \cdot (C[0], . . . , C[K − 1])^T = (C[K], . . . , C[K + S − 1])^T$
$G_{Half}$ be the H × (K + S) generator matrix of the Half symbols, So,
$G_{Half} \cdot (C[0], . . . , C[S + K − 1])^T = (C[K + S], . . . , C[K + S + H − 1])^T$
$I_S$ be the S × S identity matrix
$I_H$ be the H × H identity matrix
$0_{S \times H}$ be the S × H zero matrix
$G_{LT}$ be the K × L generator matrix of the encoding symbols generated by the LT Encoder.
So,
$G_{LT} \cdot (C[0], . . . , C[L − 1])^T = (C'[0], C'[1], . . . , C'[K − 1])^T$
i.e. $G_{LT i,j} = 1$ if and only if C[i] is included in the symbols which are XORed to produce
LTEnc[K, (C[0], . . . , C[L − 1]), (d[i], a[i], b[i])].
Then:
The first S rows of A are equal to $G_{LDPC}|I_S|Z_{S \times H}$.
The next H rows of A are equal to $G_{Half}|I_H$.
The remaining K rows of A are equal to $G_{LT}$.

---

The matrix A is depicted in FIG. 20. The intermediate symbols can then be calculated as:

$C = A^{-1} \cdot D$

The source triples are generated such that for any K matrix A has full rank and is therefore invertible. This calculation can be realized by applying a MSCR decoding process to the K source symbols C'[0], C'[1], . . . , C'[K−1] to produce the L intermediate symbols C[0], C[1], . . . , C[L−1].

To efficiently generate the intermediate symbols from the source symbols, it is recommended that an efficient decoder implementation such as that described in Section B.6 be used. The source symbol triples are designed to facilitate efficient decoding of the source symbols using that algorithm.

B.5.3. Second Encoding Step: LT Encoding

In the second encoding step, the repair symbol with ESI X is generated by applying the generator LTEnc[K, (C[0], C[1], ..., C[L−1]), (d, a, b)] defined in Section B.5.4 to the L intermediate symbols C[0], C[1], ..., C[L−1] using the triple (d, a, b)=Trip[K,X] generated according to Sections B.3.2.2 and B.4.2.

B.5.4. Generators

B.5.4.1 Random Generator

The random number generator Rand[X, i, m] is defined as follows, where X is anon-negative integer, i is a non-negative integer and m is a positive integer and the value produced is an integer between 0 and m−1. Let $V_0$ and $V_1$ be arrays of 256 entries each, where each entry is a 4-byte unsigned integer. These arrays are provided in Section B.7.
Then, $$Rand[X,i,m]=(V_0[(X+i)\%256]^\wedge V_1[(floor(X/256)+i)\%256])\%m$$

B.5.4.2 Degree Generator

The degree generator Deg[v] is defined as follows, where v is an integer that is at least 0 and less than $2^{20}=1048576$.
In FIG. 21, find the index j such that $f[j-1] \leq v < f[j]$ $$Deg[v]=d[j]$$

B.5.4.3 LT Encoding Symbol Generator

The encoding symbol generator LTEnc[K, (C[0], C[1], ..., C[L−1]), (d, a, b)] takes the following inputs:
K is the number of source symbols (or sub-symbols) for the source block (sub-block). Let L be derived from K as described in Section B.5.2, and let L' be the smallest prime integer greater than or equal to L.
(C[0], C[1], ..., C[L−1]) is the array of L intermediate symbols (sub-symbols) generated as described in Section B.5.2
(d, a, b) is a source triple determined using the Triple generator defined in Section B.5.3.4, whereby d is an integer denoting an encoding symbol degree, a is an integer between 1 and L'−1 inclusive and b is an integer between 0 and L'−1 inclusive.

The encoding symbol generator produces a single encoding symbol as output, according to the following algorithm:

```
While (b ≥ L) do b = (b + a) % L'
LTEnc[K, (C[0], C[1], ..., C[L − 1]), (d, a, b)] = C[b].
For j = 1, ..., min(d − 1,L − 1) do
    b = (b + a) % L'
    While (b ≥ L) do b = (b + a) % L'
    LTEnc[K, (C[0], C[1], ..., C[L − 1]), (d, a, b)] = LTEnc[K,
    (C[0], C[1], ..., C[L − 1]), (d, a, b)] ^ C[b]
```

B.5.4.4 Triple Generator

The triple generator Trip[K,X] takes the following inputs:
K The number of source symbols
X An encoding symbol ID
Let
L be determined from K as described in Section B.5.2
L' be the smallest prime that is greater than or equal to L
Q=65521, the largest prime smaller than $2^{16}$.

J(K) be the systematic index associated with K, as defined in Appendix A

The output of the triple generator is a triples, (d, a, b) determined as follows:
1. $A=(53591+J(K)\cdot 997) \% Q$
2. $B=10267\cdot(J(K)+1) \% Q$
3. $Y=(B+X\cdot A) \% Q$
4. $v=Rand[Y, 0, 2^{20}]$
5. $d=Deg[v]$
6. $a=1+Rand[Y, 1, L'-1]$
7. $b=Rand[Y, 2, L']$

B.6 FEC Decoder Implementations

B.6.1 General

This section describes an efficient decoding algorithm for the MSCR codes described in this specification. Note that each received encoding symbol can be considered as the value of an equation amongst the intermediate symbols. From these simultaneous equations, and the known pre-coding relationships amongst the intermediate symbols, any algorithm for solving simultaneous equations can successfully decode the intermediate symbols and hence the source symbols. However, the algorithm chosen has a major effect on the computational efficiency of the decoding.

B.6.2 Decoding a Source Block

B.6.2.1 General

It is assumed that the decoder knows the structure of the source block it is to decode, including the symbol size, T, and the number K of symbols in the source block.
From the algorithms described in Sections B.5, the MSCR decoder can calculate the total number L=K+S+H of pre-coding symbols and determine how they were generated from the source block to be decoded. In this description it is assumed that the received encoding symbols for the source block to be decoded are passed to the decoder. Furthermore, for each such encoding symbol it is assumed that the number and set of intermediate symbols whose exclusive-or is equal to the encoding symbol is passed to the decoder. In the case of source symbols, the source symbol triples described in Section B.5.2.2 indicate the number and set of intermediate symbols which sum to give each source symbol.

Let N≥K be the number of received encoding symbols for a source block and let M=S+H+N. The following M by L bit matrix A can be derived from the information passed to the decoder for the source block to be decoded. Let C be the column vector of the L intermediate symbols, and let D be the column vector of M symbols with values known to the receiver, where the first S+H of the M symbols are zero-valued symbols that correspond to LDPC and Half symbols (these are check symbols for the LDPC and Half symbols, and not the LDPC and Half symbols themselves), and the remaining N of the M symbols are the received encoding symbols for the source block. Then, A is the bit matrix that satisfies A·C=D, where here · denotes matrix multiplication over GF[2]. In particular, A[i,j]=1 if the intermediate symbol corresponding to index j is exclusive-ORed into the LDPC, Half or encoding symbol corresponding to index i in the encoding, or if index i corresponds to a LDPC or Half symbol and index j corresponds to the same LDPC or Half symbol. For all other i and j, A[i,j]=0.

Decoding a source block is equivalent to decoding C from known A and D. It is clear that C can be decoded if and only if the rank of A over GF[2] is L. Once C has been decoded, missing source symbols can be obtained by using the source symbol triples to determine the number and set of intermediate symbols which are exclusive-ORed to obtain each missing source symbol.

The first step in decoding C is to form a decoding schedule. In this step A is converted, using Gaussian elimination (using row operations and row and column reorderings) and after discarding M-L rows, into the L by L identity matrix. The decoding schedule comprises the sequence of row operations and row and column re-orderings during the Gaussian elimination process, and only depends on A and not on D. The decoding of C from D can take place concurrently with the forming of the decoding schedule, or the decoding can take place afterwards based on the decoding schedule.

The correspondence between the decoding schedule and the decoding of C is as follows. Let $c[0]=0$, $c[1]=1 \ldots$, $c[L-1]=L-1$ and $d[0]=0$, $d[1]=1 \ldots$, $d[M-1]=M-1$ initially.

Each time row i of A is exclusive-ORed into row i' in the decoding schedule then in the decoding process symbol $D[d[i]]$ is exclusive-ORed into symbol $D[d[i']]$.

Each time row i is exchanged with row i' in the decoding schedule then in the decoding process the value of $d[i]$ is exchanged with the value of $d[i']$.

Each time column j is exchanged with column j' in the decoding schedule then in the decoding process the value of $c[j]$ is exchanged with the value of $c[j']$.

From this correspondence it is clear that the total number of exclusive-ORs of symbols in the decoding of the source block is the number of row operations (not exchanges) in the Gaussian elimination. Since A is the L by L identity matrix after the Gaussian elimination and after discarding the last M-L rows, it is clear at the end of successful decoding that the L symbols $D[d[0]], D[d[1]], \ldots, D[d[L-1]]$ are the values of the L symbols $C[c[0]], C[c[1]], \ldots, C[c[L-1]]$.

The order in which Gaussian elimination is performed to form the decoding schedule has no bearing on whether or not the decoding is successful. However, the speed of the decoding depends heavily on the order in which Gaussian elimination is performed. (Furthermore, maintaining a sparse representation of A is crucial, although this is not described here). The remainder of this section describes an order in which Gaussian elimination could be performed that is relatively efficient.

B.6.2.2 First Phase

The first phase of the Gaussian elimination the matrix A is conceptually partitioned into submatrices. The submatrix sizes are parameterized by non-negative integers i and u which are initialized to 0. The submatrices of A are:
(1) The submatrix I defined by the intersection of the first i rows and first i columns. This is the identity matrix at the end of each step in the phase.
(2) The submatrix defined by the intersection of the first i rows and all but the first i columns and last u columns. All entries of this submatrix are zero.
(3) The submatrix defined by the intersection of the first i columns and all but the first i rows. All entries of this submatrix are zero.
(4) The submatrix U defined by the intersection of all the rows and the last u columns.
(5) The submatrix V formed by the intersection of all but the first i columns and the last u columns and all but the first i rows.

FIG. 22 illustrates the submatrices of A. At the beginning of the first phase V=A. In each step, a row of A is chosen. The following graph defined by the structure of V is used in determining which row of A is chosen. The columns that intersect V are the nodes in the graph, and the rows that have exactly 2 ones in V are the edges of the graph that connect the two columns (nodes) in the positions of the two ones. A component in this graph is a maximal set of nodes (columns) and edges (rows) such that there is a path between each pair of nodes/edges in the graph. The size of a component is the number of nodes (columns) in the component.

There are at most L steps in the first phase. The phase ends successfully when $i+u=L$, i.e., when V and the all zeroes submatrix above V have disappeared and A comprises I, the all zeroes submatrix below I, and U. The phase ends unsuccessfully in decoding failure if at some step before V disappears there is no non-zero row in V to choose in that step. In each step, a row of A is chosen as follows:

If all entries of V are zero then no row is chosen and decoding fails.

Let r be the minimum integer such that at least one row of A has exactly r ones in V.

If $r \neq 2$ then choose a row with exactly r ones in V with minimum original degree among all such rows.

If $r=2$ then choose any row with exactly 2 ones in V that is part of a maximum size component in the graph defined by X.

After the row is chosen in this step the first row of A that intersects V is exchanged with the chosen row so that the chosen row is the first row that intersects V. The columns of A among those that intersect V are reordered so that one of the r ones in the chosen row appears in the first column of V and so that the remaining r-1 ones appear in the last columns of V. Then, the chosen row is exclusive-ORed into all the other rows of A below the chosen row that have a one in the first column of V. Finally, i is incremented by 1 and u is incremented by r-1, which completes the step.

B.6.2.3 Second Phase

The submatrix U is further partitioned into the first i rows, $U_{upper}$, and the remaining M-i rows, $U_{lower}$. Gaussian elimination is performed in the second phase on $U_{lower}$ to either determine that its rank is less than u (decoding failure) or to convert it into a matrix where the first u rows is the identity matrix (success of the second phase). Call this u by u identity matrix $I_u$. The M-L rows of A that intersect $U_{lower}-I_u$ are discarded. After this phase A has L rows and L columns.

B.6.2.4 Third Phase

After the second phase the only portion of A which needs to be zeroed out to finish converting A into the L by L identity matrix is $U_{upper}$. The number of rows i of the submatrix $U_{upper}$ is generally much larger than the number of columns u of $U_{upper}$. To zero out $U_{upper}$ efficiently, the following precomputation matrix U' is computed based on $I_u$ in the third phase and then U' is used in the fourth phase to zero out $U_{upper}$. The u rows of $I_u$ are partitioned into ceil(u/8) groups of 8 rows each. Then, for each group of 8 rows all non-zero combinations of the 8 rows are computed, resulting in $2^8-1=255$ rows (this can be done with $2^8-8-1=247$ exclusive-ors of rows per group, since the combinations of Hamming weight one that appear in $I_u$ do not need to be recomputed). Thus, the resulting precomputation matrix U' has ceil(u/8)·255 rows and u columns. Note that U' is not formally a part of matrix A, but will be used in the fourth phase to zero out $U_{upper}$.

B.6.2.5 Fourth Phase

For each of the first i rows of A, for each group of 8 columns in the $U_{upper}$ submatrix of this row, if the set of 8 column entries in $U_{upper}$ are not all zero then the row of the precomputation matrix U' that matches the pattern in the 8 columns is exclusive-ORed into the row, thus zeroing out those 8 columns in the row at the cost of exclusive-oring one row of U' into the row.

After this phase A is the L by L identity matrix and a complete decoding schedule has been successfully formed. Then, the corresponding decoding comprising exclusive-ORing known encoding symbols can be executed to recover the intermediate symbols based on the decoding schedule.

The triples associated with all source symbols are computed according to B.5.2.2 The triples for received source symbols are used in the decoding. The triples for missing source symbols are used to determine which intermediate symbols need to be exclusive-ORed to recover the missing source symbols.

Some Properties of Some Multi-Stage Codes

In most of the examples described above, the input and output symbols encode 98 for the same number of bits and each output symbol is placed in one packet (a packet being a unit of transport that is either received in its entirety or lost in its entirety). In some embodiments, the communications system is modified so that each packet contains several output symbols. The size of an output symbol value is then set to a size determined by the size of the input symbol values in the initial splitting of the file or blocks of the stream into input symbols, based on a number of factors. The decoding process remains essentially unchanged, except that output symbols arrive in bunches as each packet is received.

The setting of input symbol and output symbol sizes is usually dictated by the size of the file or block of the stream and the communication system over which the output symbols are to be transmitted. For example, if a communication system groups bits of data into packets of a defined size or groups bits in other ways, the design of symbol sizes begins with the packet or grouping size. From there, a designer would determine how many output symbols will be carried in one packet or group and that determines the output symbol size. For simplicity, the designer would likely set the input symbol size equal to the output symbol size, but if the input data makes a different input symbol size more convenient, it can be used.

The above-described encoding process produces a stream of packets containing output symbols based on the original file or block of the stream. Each output symbol in the stream is generated independently of all other output symbols, and there is no lower or upper bound on the number of output symbols that can be created. A key is associated with each output symbol. That key, and some contents of the input file or block of the stream, determines the value of the output symbol. Consecutively generated output symbols need not have consecutive keys, and in some applications it would be preferable to randomly generate the sequence of keys, or pseudorandomly generate the sequence.

Multi-stage decoding has a property that if the original file or block of the stream can be split into K equal-sized input symbols and each output symbol value is the same length as an input symbol value, then the file or block can be recovered from K+A output symbols on average, with very high probability, where A is small compared to K. For example, for the weight distributions introduced above, the probability that the value of A exceeds $\alpha*K$ is at most $10^{-12}$ if K is larger than 19,681, and it is at most $10^{-10}$ for any value of K. Since the particular output symbols are generated in a random or pseudorandom order, and the loss of particular output symbols in transit is assumed random, some small variance exists in the actual number of output symbols needed to recover the input file or block. In some cases, where a particular collection of K+A packets are not enough to decode the entire input file or block, the input file or block is still recoverable if the receiver can gather more packets from one or more sources of output packets.

Because the number of output symbols is only limited by the resolution of I, well more than K+A output symbols can be generated. For example, if I is a 32-bit number, 4 billion different output symbols could be generated, whereas the file or block of the stream could include K=50,000 input symbols. In some applications, only a small number of those 4 billion output symbols may be generated and transmitted and it is a near certainty that an input file or block of a stream can be recovered with a very small fraction of the possible output symbols and an excellent probability that the input file or block can be recovered with slightly more than K output symbols (assuming that the input symbol size is the same as the output symbol size).

In some applications, it may be acceptable to not be able to decode all of the input symbols, or to be able to decode all of input symbols, but with a relatively low probability. In such applications, a receiver can stop attempting to decode all of the input symbols after receiving K+A output symbols. Or, the receiver can stop receiving output symbols after receiving less than K+A output symbols. In some applications, the receiver may even only receive K or less output symbols. Thus, it is to be understood that in some embodiments of the present invention, the desired degree of accuracy need not be complete recovery of all the input symbols.

Further, in some applications where incomplete recovery is acceptable, the data can be encoded such that all of the input symbols cannot be recovered, or such that complete recovery of the input symbols would require reception of many more output symbols than the number of input symbols. Such an encoding would generally require less computational expense, and may thus be an acceptable way to decrease the computational expense of encoding.

It is to be understood that the various functional blocks in the above-described figures may be implemented by a combination of hardware and/or software, and that in specific implementations some or all of the functionality of some of the blocks may be combined. Similarly, it is also to be understood that the various methods described herein may be implemented by a combination of hardware and/or software.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of encoding data for transmission from a source to a destination over a communications channel, wherein the data is represented at least by a plurality, K, of source symbols, K being the number of source symbols and the source symbols being in an ordered set, the method comprising:

generating one or more repair symbols from the plurality of source symbols;

transmitting one or more output symbols over the communications channel, wherein the communication channel is a channel that can introduce errors in transmissions, wherein an output symbol corresponds to either a source symbol or a repair symbol;

determining a desired degree of accuracy for a regeneration of source symbols;

determining, for each of a plurality of source symbols, an associated symbol relation that is a function of a systematic index, J(K), where J(K) is a function of K;

determining L intermediate symbol values using a function that takes as its input, at least in part, (1) values of at least some of the K source symbols and (2) the associated symbol relations of those at least some of the K source symbols, and (3) a set of L-K pre-coding relations, wherein L is at least K; and determining a value for each repair symbol using the associated symbol relation for that repair symbol and the plurality of L intermediate symbol values;

wherein the encoding is such that the plurality of source symbols can be regenerated to the desired degree of accuracy from a predetermined number, N, of the transmitted output symbols.

2. The method of claim 1, further comprising precalculating and storing the systematic index J(K) in a table for each value of K.

3. The method of claim 1, wherein the systematic index J(K) is equal to 18, 14, 43, 55, 41, 88, 213, 415, and 2665 for values of K equal to 4, 8, 16, 64, 128, 512, 1024, 4096, and 8192, respectively.

4. The method of claim 1, wherein the symbol relations impose linear constraints on sets of source symbols.

5. The method of claim 4, wherein the linear constraints are exclusive-or constraints.

6. The method of claim 1, wherein each source symbol has an associated encoding symbol identifier ("ESI") that identifies the symbol, wherein the systematic index J(K) and a value X, wherein X is a valid ESI, determines the symbol relation for the source symbol identified by ESI X.

7. The method of claim 6, wherein the systematic index J(K) and the ESI X can be used to generate a triple (a[X],b[X],d[X]) that defines the source symbol relation for the symbol identified by ESI X.

8. The method of claim 6, wherein each source symbol can be identified by an integer ESI in the range 0 to K−1, inclusive.

9. The method of claim 6, wherein each repair symbol can be identified by an integer ESI that is at least K.

10. The method of claim 7, wherein the triple (a[X],b[X],d[X]) that defines the source symbol relation associated with the source symbol with ESI X places a linear constraint on the value C'[X] for source symbol with ESI X and the values C[0], C[1], . . . , C[L−1] of the L intermediate symbols, the linear constraint defined by the method comprising:

defining an array of positive integer values B[0], . . . , B[J−1], wherein J is the minimum of d[X] and L, wherein L' is the smallest integer that is prime that is at least the value of L, and wherein the values of the array of positive integer values B[0], . . . , B[J−1] are set using the method comprising:

(a) setting the initial value of B[0] to b[X];

(b) while B[0] is at least L, recalculating B[0] as the previous value of B[0] plus a[X] modulo L';

(c) for values of j starting at 1 and going up to J−1 in increments of one, (d) initializing the value of B[j] to B[j−1] plus a[X]; and (e) while B[j] is at least L, recalculating B[j] as the previous value of B[j] plus a[X] modulo L'.

11. The method of claim 7, further comprising:

calculating a value A as (53591+J(K)*997) % 65521, wherein * is the multiplication operator and % is the modulo operator;

calculating a value B as 10267*(J(K)+1) % 65521;

calculating a value Y as (B+X*A) % 65521; and determining a value v, wherein v is in the range from 0 and 1048575, inclusive, where v is calculated as the output of a random generator applied to the inputs Y, 0, and 1048575.

12. The method of claim 11 further comprising:

determining d[X] based on a degree function applied to the input v.

13. The method of claim 11 further comprising:

determining a[X], wherein a[X] is in the range between 0 and L'−1, inclusive, wherein L' is the smallest prime number greater than or equal to L, wherein L' is calculated as one plus the output of the random generator applied to the inputs Y, 1 and L'−1.

14. The method of claim 11 further comprising:

determining b[X], wherein b[X] is in the range between 0 and L', inclusive, wherein b[X] is calculated as the output of the random generator applied to the input Y, 2 and L'.

15. The method of claim 11, wherein the value of d[X] is determined based on v as follows:

if the value of v is between 0 and 10240, inclusive, then the value of d[X] is 1, if the value of v is between 10241 and 4911581, inclusive, then the value of d[X] is 2, if the value of v is between 4911582 and 712793, inclusive, then the value of d[X] is 3, if the value of v is between 712794 and 831694, inclusive, then the value of d[X] is 4, if the value of v is between 831695 and 948445, inclusive, then the value of d[X] is 10, if the value of v is between 948446 and 1032188, inclusive, then the value of d[X] is 11, if the value of v is between 1032189 and 1048575, inclusive, then the value of d[X] is 40.

16. The method of claim 11, wherein the random generator on inputs Y, i, and m is calculated as (V0[(Y+i) % 256]^(V1[(floor(Y/256)+i) % 256]) % m, where % is the modulo operator, ^ is the exclusive-or operator, / is the division operator, floor calculates the largest integer that is at most the input value, and V0 and V1 are each tables of 256 integers chosen randomly or pseudo-randomly.

17. The method of claim 16, wherein table $V_0$ has values, in decimal representation, of 3067016507, 689605112, 4005368743, 4048876515, 778296777, 2669179716, 3457502702, 4291353919, 2687243553, 2068983570, 616452097, 3272161958, 234652930, 179350258, 2054995199, and 1358307511 for table indices of 16, 32, 48, 64, 80, 96, 112, 128, 144, 160, 176, 192, 208, 224, 240, and 256, respectively, when a first entry of table $V_0$ has a table index of 1.

18. The method of claim 16, wherein table $V_1$ has values, in decimal representation, of 4114760273, 3302235057, 640417429, 852173610, 4071072948, 3904109414, 3123492423, 3870972145, 2712821515, 4267074718, 4259411376, 1351086955, 4187322100, 2822905141, 3762994475, and 4135048896 for table indices of 16, 32, 48, 64, 80, 96, 112, 128, 144, 160, 176, 192, 208, 224, 240, and 256, respectively, when a first entry of table $V_1$ has a table index of 1.

19. The method of claim 1, wherein the number L-K of pre-coding relations comprises a first set of S pre-coding relations and a second set of H pre-coding relations, and wherein the L intermediate symbols comprises a first set of K intermediate symbols, a second set of S intermediate symbols, and a third set of H intermediate symbols.

20. The method of claim 19, wherein each pre-coding relation in the first set of pre-coding relations is uniquely associated with an intermediate symbol in the second set of intermediate symbols and is associated with a specified set of intermediate symbols among the first set of intermediate symbols, wherein each pre-coding relation is a linear constraint on the value of the associated intermediate symbol and the values of the intermediate symbols in the specified set.

21. The method of claim 20, wherein the linear constraint is an exclusive-or constraint.

22. The method of claim 20, wherein for each first pre-coding relation among the first set of pre-coding relations and for each second pre-coding relation among the first set of pre-coding relations, the number of intermediate symbols that are both in the specified set associated with the first pre-coding relation and in the specified set associated with the second pre-coding relation is at most 3.

23. The method of claim 20, wherein each of the intermediate symbols in the first set of intermediate symbols is in the specified set of exactly three of the pre-coding relations in the first set of pre-coding relations.

24. The method of claim 19,
wherein S is the smallest prime integer that is at least as large as 0.01*K+X, wherein X is the smallest positive integer such that X*(X−1) is at least 2*K,
wherein H is the smallest integer such that fact[H]/(fact[H−H']*fact[H']) is at least K+2, wherein fact is the factorial operator, wherein H' is the smallest integer that is at least H/2.

25. The method of claim 19, wherein each pre-coding relation in the second set of pre-coding relations is uniquely associated with an intermediate symbol in the third set of intermediate symbols and is associated with a specified set of intermediate symbols among the first set and second set of intermediate symbols, wherein the pre-coding relation is a linear constraint on the associated intermediate symbol and the intermediate symbols in the specified set.

26. The method of claim 25, wherein the linear constraint is an exclusive-or constraint.

27. The method of claim 25, wherein each of the intermediate symbols in the first set or the second set of intermediate symbols is in the specified set of approximately one-half of the pre-coding relations in the second set of pre-coding relations.

28. The method of claim 25, wherein for each first intermediate symbol in the first set or second set of intermediate symbols and for each second intermediate symbol in the first set or second set of intermediate symbols that is the next consecutive intermediate symbol following the first intermediate symbol, the symmetric difference of pre-coding relations in the second set of pre-coding relations of which the first intermediate symbol is a member of the specified set and of which the second intermediate symbol is a member of the specified set is exactly two.

29. A method of decoding encoded data received over a communications channel transmitted from a source to a destination, the method comprising:
receiving a predetermined number, N, of symbols, wherein the received symbols comprise a combination of received source symbols and received repair symbols generated from a plurality of an ordered set of K source symbols,
generating to a desired degree of accuracy one or more unreceived source symbols of the ordered set of K source symbols,
wherein each received symbol has an associated symbol relation that is determined by a systematic index, J(K), where J(K) is determined by K,
wherein the value of each unreceived source symbol is determined by the associated symbol relation and a plurality of L intermediate symbol values, wherein L is at least K,
wherein the L intermediate symbol values are determined by the K source symbol values and by the K symbol relations associated with the K source symbols and by a set of L-K pre-coding relations,
wherein the L intermediate symbol values can be generated to a desired degree of accuracy from the N received source and repair symbols.

30. The method of claim 29, further comprising precalculating and storing the systematic index J(K) in a table for each relevant value of K.

31. The method of claim 29, wherein the systematic index J(K) is equal to 18, 14, 43, 55, 41, 88, 213, 415, and 2665 for values of K equal to 4, 8, 16, 64, 128, 512, 1024, 4096, and 8192, respectively.

32. The method of claim 29, wherein the symbol relations impose linear constraints on sets of received source symbols.

33. The method of claim 32, wherein the linear constraints are exclusive-or constraints.

34. The method of claim 29, wherein each source symbol has an associated encoding symbol identifier ("ESI") that identifies the source symbol, wherein the systematic index J(K) and a value X, wherein X is a valid ESI, determines the symbol relation for the source symbol identified by ESI X.

35. The method of claim 34, wherein the systematic index J(K) and the ESI X can be used to generate a triple (a[X],b[X],d[X]) that defines the symbol relation for the source symbol identified by ESI X.

36. The method of claim 34, wherein each source symbol can be identified by an integer ESI in the range 0 to K−1, inclusive.

37. The method of claim 34, wherein each repair symbol can be identified by an integer ESI that is at least K.

38. The method of claim 35, wherein the triple (a[X],b[X],d[X]) that defines the source symbol relation associated with the source symbol with ESI X places the following linear constraint on the value C'[X] for source symbol with ESI X and the values C[0], C[1], ..., C[L−1] of the L intermediate symbols:
defining an array of positive integer values B[0], ..., B[J−1], wherein J is the minimum of d[X] and L, wherein L' is the smallest integer that is prime that is at least the value of L, and wherein the values of the array of positive integer values B[0], ..., B[J−1] are set using the method comprising:
(a) setting the initial value of B[0] to b[X];
while B[0] is at least L, recalculating B[0] as the previous value of B[0] plus a[X] modulo L';
(c) for values of j starting at 1 and going up to J−1 in increments of one,
(d), initializing the value of B[j] to B[j−1] plus a[X]; and
(e) while B[j] is at least L, recalculating B[j] as the previous value of B[j] plus a[X] modulo L'.

39. The method of claim 35, wherein the generation of the triple (a[X],b[X],d[X]) from an ESI X comprises the following steps:
calculating a value A as (53591+J(K)*997) % 65521, wherein * is the multiplication operator and % is the modulo operator;
calculating a value B as 10267*(J(K)+1) % 65521;
calculating a value Y as (B+X*A) % 65521; and determining a value v, wherein v is in the range from 0 and 1048575, inclusive, where v is calculated as the output of a random generator applied to the inputs Y, 0, and 1048575.

40. The method of claim 39 further comprising:
determining d[X] based on a degree function applied to the input v.

41. The method of claim 39 further comprising:
determining a[X], wherein a[X] is in the range between 0 and L'-1, inclusive, wherein L' is the smallest prime number greater than or equal to L, wherein L' is calculated as one plus the output of the random generator applied to the inputs Y, 1 and L'-1.

42. The method of claim 39 further comprising:
determining b[X], wherein b[X] is in the range between 0 and L', inclusive, wherein b[X] is calculated as the output of the random generator applied to the input Y, 2 and L'.

43. The method of claim 39, wherein the value of d[X] is determined based on v as follows:
if the value of v is between 0 and 10240, inclusive, then the value of d[X] is 1,
if the value of v is between 10241 and 4911581, inclusive, then the value of d[X] is 2,
if the value of v is between 4911582 and 712793, inclusive, then the value of d[X] is 3,
if the value of v is between 712794 and 831694, inclusive, then the value of d[X] is 4,
if the value of v is between 831695 and 948445, inclusive, then the value of d[X] is 10,
if the value of v is between 948446 and 1032188, inclusive, then the value of d[X] is 11,
if the value of v is between 1032189 and 1048575, inclusive, then the value of d[X] is 40.

44. The method of claim 39, wherein the random generator on inputs Y, i, and m is calculated as (V0[(Y+i) % 256]^(V1 [(floor(Y/256)+i) % 256]) % m, where % is the modulo operator, ^ is the exclusive-or operator, / is the division operator, floor calculates the largest integer that is at most the input value, and V0 and V1 are each tables of 256 integers chosen randomly or pseudo-randomly.

45. The method of claim 44, wherein table $V_0$ has values, in decimal representation, of 3067016507, 689605112, 4005368743, 4048876515, 778296777, 2669179716, 3457502702, 4291353919, 2687243553, 2068983570, 616452097, 3272161958, 234652930, 179350258, 2054995199, and 1358307511 for table indices of 16, 32, 48, 64, 80, 96, 112, 128, 144, 160, 176, 192, 208, 224, 240, and 256, respectively, when a first entry of table $V_0$ has a table index of 1.

46. The method of claim 44, wherein table $V_1$ has values, in decimal representation, of 4114760273, 3302235057, 640417429, 852173610, 4071072948, 3904109414, 3123492423, 3870972145, 2712821515, 4267074718, 4259411376, 1351086955, 4187322100, 2822905141, 3762994475, and 4135048896 for table indices of 16, 32, 48, 64, 80, 96, 112, 128, 144, 160, 176, 192, 208, 224, 240, and 256, respectively, when a first entry of table $V_1$ has a table index of 1.

47. The method of claim 29, wherein the number L-K of pre-coding relations comprises a first set of S pre-coding relations and a second set of H pre-coding relations, and wherein the L intermediate symbols comprises a first set of K intermediate symbols, a second set of S intermediate symbols, and a third set of H intermediate symbols.

48. The method of claim 47, wherein each pre-coding relation in the first set of pre-coding relations is uniquely associated with an intermediate symbol in the second set of intermediate symbols and is associated with a specified set of intermediate symbols among the first set of intermediate symbols, wherein each pre-coding relation is a linear constraint on the value of the associated intermediate symbol and the values of the intermediate symbols in the specified set.

49. The method of claim 48, wherein the linear constraint is an exclusive-or constraint.

50. The method of claim 48, wherein for each first pre-coding relation among the first set of pre-coding relations and for each second pre-coding relation among the first set of pre-coding relations, the number of intermediate symbols that are both in the specified set associated with the first pre-coding relation and in the specified set associated with the second pre-coding relation is at most 3.

51. The method of claim 48, wherein each of the intermediate symbols in the first set of intermediate symbols is in the specified set of exactly three of the pre-coding relations in the first set of pre-coding relations.

52. The method of claim 47,
wherein S is the smallest prime integer that is at least as large as 0.01*K+X, wherein X is the smallest positive integer such that X*(X-1) is at least 2*K,
wherein H is the smallest integer such that fact[H]/(fact[H-H]*fact[H']) is at least K+2, wherein fact is the factorial operator, wherein H' is the smallest integer that is at least H/2.

53. The method of claim 47, wherein each pre-coding relation in the second set of pre-coding relations is uniquely associated with an intermediate symbol in the third set of intermediate symbols and is associated with a specified set of intermediate symbols among the first set and second set of intermediate symbols, wherein the pre-coding relation is a linear constraint on the associated intermediate symbol and the intermediate symbols in the specified set.

54. The method of claim 53, wherein the linear constraint is an exclusive-or constraint.

55. The method of claim 53, wherein each of the intermediate symbols in the first set or the second set of intermediate symbols is in the specified set of approximately one-half of the pre-coding relations in the second set of pre-coding relations.

56. The method of claim 53, wherein for each first intermediate symbol in the first set or second set of intermediate symbols and for each second intermediate symbol in the first set or second set of intermediate symbols that is the next consecutive intermediate symbol following the first intermediate symbol, the symmetric difference of pre-coding relations in the second set of pre-coding relations of which the first intermediate symbol is a member of the specified set and of which the second intermediate symbol is a member of the specified set is exactly two.

57. The method of claim 1, wherein the output symbols are placed into one or more packets for transmission.

58. The method of claim 29, wherein more than one received symbol received in at least one packet.

59. The method of claim 6, wherein the output symbols are placed into packets for transmission, wherein each output symbol has an associated ESI, and wherein an ESI is included in each packet to identify a first output symbol placed into the packet.

60. The method of claim 59, wherein more than one output symbol is placed into at least one packet and for packets that carry more than one output symbol, the ESIs for the second and subsequent output symbols placed in the packet are determined by the ESI for the first output symbol placed in the packet.

61. The method of claim 60, wherein the ESI determined for the second output symbol placed in a packet is one greater than the ESI placed in the packet that is associated with the first output symbol placed in the packet.

62. The method of claim 34, wherein the output symbols are received in one or more packets, wherein each output symbol has an associated ESI, and wherein an ESI is received in each packet to identify a first output symbol in the packet.

63. The method of claim 62, wherein more than one output symbol is received in at least one packet, wherein the ESIs for the second and subsequent output symbols received in packets with more than one output symbol are determined by the ESI for the first output symbol in the packet.

64. The method of claim 63, wherein the ESI determined for the second output symbol in a received packet is one greater than the ESI in the packet that is associated with the first output symbol in the packet.

65. The method of claim 1 wherein the K source symbols correspond to a source block, wherein the source block is divided into N' sub-blocks, wherein each of the N' sub-blocks is composed of K' sub-symbols, wherein one or more source blocks can correspond to a source file, wherein each of the one or more source blocks are encoded separately from the other source blocks.

66. The method of claim 65 wherein the source file is partitioned into one or more source blocks of approximately equal size as a function of the number of source symbols per source blocks and the number of source blocks, and wherein each source block is partitioned into one or more sub-blocks of approximately equal size as a function of the size of a source symbol and the number of sub-blocks per source block.

67. The method of claim 66 wherein more than one output symbol is placed into a packet that is used for transmission.

68. The method of claim 66 wherein one or more parameters used to partition the source file into one or more source blocks and used to partition the one or more source blocks into one or more subblocks are made known at the destination of the output symbols.

69. The method of claim 1 wherein the K source symbols correspond to a source block, wherein the source block is defined by a transport protocol for streaming data.

70. The method of claim 69 wherein one or more parameters used to determine how the K source symbols correspond to the source block are made known at the destination of the output symbols.

71. The method of claim 69 wherein more than one output symbol is placed into a packet that is used for transmission.

72. The method of claim 29 wherein the K source symbols correspond to a source block, wherein the source block is defined by a transport protocol for streaming data.

73. The method of claim 72 wherein one or more parameters used to determine how the K source symbols correspond to the source block are made known at the destination of the output symbols.

74. The method of claim 72 wherein more than one output symbol is received in a received packet.

* * * * *